(12) United States Patent
Jeong et al.

(10) Patent No.: US 11,127,343 B2
(45) Date of Patent: Sep. 21, 2021

(54) DISPLAY DEVICE AND METHOD OF FABRICATING THE SAME

(71) Applicant: Samsung Display Co., Ltd., Yongin-si (KR)

(72) Inventors: Min Jae Jeong, Hwaseong-si (KR); Kyung Bae Kim, Seongnam-si (KR); Chong Chul Chai, Seoul (KR); Kyung Hoon Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/737,602

(22) Filed: Jan. 8, 2020

(65) Prior Publication Data

US 2020/0273397 A1  Aug. 27, 2020

(30) Foreign Application Priority Data

Feb. 25, 2019 (KR) .................. 10-2019-0022006

(51) Int. Cl.
*G09G 3/32* (2016.01)
*H01L 33/36* (2010.01)
*H01L 25/075* (2006.01)
*H01L 33/62* (2010.01)

(52) U.S. Cl.
CPC .......... *G09G 3/32* (2013.01); *H01L 25/0753* (2013.01); *H01L 33/36* (2013.01); *H01L 33/62* (2013.01); *G09G 2300/0426* (2013.01); *G09G 2310/0278* (2013.01); *H01L 2933/0016* (2013.01); *H01L 2933/0066* (2013.01)

(58) Field of Classification Search
CPC .............. G09G 3/32; G09G 2300/0426; H01L 25/0753; H01L 33/36; H01L 33/62; H01L 2933/0016; H01L 2933/0066
See application file for complete search history.

(56) References Cited

U.S. PATENT DOCUMENTS

2016/0125803 A1* 5/2016 Qing .................... G09G 3/3233
345/209
2018/0308916 A1* 10/2018 Kim ..................... H01L 27/3258

FOREIGN PATENT DOCUMENTS

| KR | 10-2017-0094930 A | 8/2017 |
| KR | 10-2018-0071465 A | 6/2018 |
| KR | 10-1968592 B1 | 4/2019 |

* cited by examiner

*Primary Examiner* — Kenneth B Lee, Jr.
(74) *Attorney, Agent, or Firm* — Lewis Roca Rothgerber Christie LLP

(57) ABSTRACT

A display device includes a light-emitting diode including a first conductivity-type semiconductor, an active layer, and a second conductivity-type semiconductor; a first voltage line to which a first voltage is applied; a second voltage line to which a second voltage is applied; a first transistor including a source electrode electrically connected to the first voltage line and a drain electrode electrically connected to a first electrode of the light-emitting diode and to the first conductivity-type semiconductor; a second transistor including a drain electrode electrically connected to a gate electrode of the first transistor and a source electrode electrically connected to a data line to apply a data signal; a capacitor electrically connected to the gate electrode of the first transistor and the first electrode; and a third transistor including a source electrode electrically connected to the second voltage line and a drain electrode electrically connected to the first electrode.

30 Claims, 27 Drawing Sheets

DISPLAY DEVICE AND METHOD OF FABRICATING THE SAME

CROSS-REFERENCE TO RELATED APPLICATION

This application claims priority to and the benefit of Korean Patent Application No. 10-2019-0022006, filed on Feb. 25, 2019 in the Korean Intellectual Property Office, the disclosure of which is incorporated herein by reference in its entirety.

BACKGROUND

1. Field

The present disclosure relates to a display device and a method of fabricating the same.

2. Description of the Related Art

Display devices have become more and more important as multimedia technology evolved. Accordingly, a variety of types of display devices such as organic light-emitting display (OLED) devices and liquid-crystal display (LCD) devices are currently used.

Display devices are for displaying images, and each display device includes a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

An organic light-emitting diode (OLED) uses an organic material for the fluorescent material of the light-emitting elements. For an OLED, the fabricating process is generally simple and the element has flexibility. However, it is known that organic materials are vulnerable to high-temperature driving environments and the efficiency of blue light in the OLED is relatively low.

In contrast, an inorganic light-emitting diode uses an inorganic semiconductor as the fluorescent material and it typically has durability in high-temperature environments and has a higher efficiency of blue light than organic light-emitting diodes. Previously, the process of fabricating inorganic light-emitting diodes had its shortcomings. However, a transfer method using dielectrophoresis (DEP) has been developed, and thus the shortcoming has been overcome. Therefore, researches on inorganic light-emitting diodes are ongoing because they have better durability and efficiency compared to organic light-emitting diodes.

SUMMARY

Aspects of the present disclosure provide a display device that includes a transistor for applying an alignment signal necessary for aligning light-emitting elements, and a different transistor for applying a driving signal.

Aspects of the present disclosure also provide a method of fabricating a display device that simplifies a process of patterning electrodes connected to each pixel during the process of fabricating a display device by way of applying a signal for aligning light-emitting elements by using a transistor for alignment signal.

It should be noted that aspects of the present disclosure are not limited to the above-mentioned aspect; and other aspects of the present invention will be apparent to those skilled in the art from the following descriptions.

According to an exemplary embodiment of the present disclosure, a display device includes different alignment lines so that the different alignment lines can be located in different alignment regions. Accordingly, by applying an alignment signal only to the alignment line located in an alignment region of interest, the voltage drop occurring when the light-emitting elements are aligned can be reduced. In addition, when the light-emitting elements are loaded, an electric field can be selectively formed only in the region of interest, thereby improving precision of the process for aligning the light-emitting elements.

It should be noted that effects of the present disclosure are not limited to those described above and other effects of the present disclosure will be apparent to those skilled in the art from the following descriptions.

According to an embodiment of the present discloser, a display device includes a light-emitting diode including a first conductivity-type semiconductor, an active layer, and a second conductivity-type semiconductor; a first voltage line to which a first voltage is applied; a second voltage line to which a second voltage is applied; a first transistor including a source electrode electrically connected to the first voltage line and a drain electrode electrically connected to a first electrode of the light-emitting diode and to the first conductivity-type semiconductor; a second transistor including a drain electrode electrically connected to a gate electrode of the first transistor and a source electrode electrically connected to a data line to apply a data signal; a capacitor electrically connected to the gate electrode of the first transistor and the first electrode of the light-emitting diode; and a third transistor including a source electrode electrically connected to the first voltage line and a drain electrode electrically connected to the first electrode of the light-emitting diode.

In an exemplary embodiment, the display device further includes a third voltage line to which a third voltage is applied and electrically connected to the second conductivity-type semiconductor of the light-emitting diode; a first scan line for transmitting a first scan signal to a gate electrode of the second transistor; and a second scan line for transmitting a second scan signal to a gate electrode of the third transistor.

In an exemplary embodiment, wherein in a fabrication mode, the second scan signal is applied to the second scan line while the first scan signal is not input to the first scan line, and wherein the first voltage applied to the first voltage line is equal to the second voltage applied to the second voltage line.

In an exemplary embodiment, wherein in the fabrication mode, the first transistor and the second transistor are turned off while the third transistor is turned on, such that the first voltage applied from the first voltage line is applied to the first electrode of the light-emitting diode through the third transistor.

In an exemplary embodiment, wherein in the fabrication mode, the third voltage applied to the third voltage line is larger than the second voltage applied to the second voltage line.

In an exemplary embodiment, wherein in a driving mode, the first scan signal is applied to the first scan line so that the second transistor is turned on.

In an exemplary embodiment, wherein in the driving mode, the data signal is transmitted to the gate electrode of the first transistor through the second transistor, and the first transistor is turned on in response to the data signal so that the first voltage applied to the first voltage line is transmitted to the first electrode of the light-emitting diode through the first transistor.

In an exemplary embodiment, wherein in the driving mode, the second scan signal is not applied to the second scan line so that the third transistor is turned off.

In an exemplary embodiment, wherein in the driving mode, the first voltage applied to the first voltage line is larger than the third voltage applied from the third voltage line.

In an exemplary embodiment, wherein, in the driving mode, the second voltage applied from the second voltage line is an initialization voltage, and wherein the second scan signal is applied to the second scan line so that the third transistor is turned on, and the initialization voltage is applied to the first electrode of the light-emitting diode.

In an exemplary embodiment, the display device further includes a fourth transistor between the second voltage line and the gate electrode of the first transistor; a fifth transistor between the first voltage line and the source electrode of the first transistor; a sixth transistor between the drain electrode of the first transistor and the first electrode of the light-emitting diode; a seventh transistor between a drain electrode of the sixth transistor and a drain electrode of the fourth transistor; a third scan line for transmitting a third scan signal to a gate electrode of the fourth transistor; and an emission control line for transmitting an emission control signal to a gate electrode of the fifth transistor and a gate electrode of the sixth transistor.

According to another embodiment of the present discloser, a display device includes a substrate; a semiconductor layer on the substrate; a first insulating layer on the semiconductor layer and the substrate; a first conductive layer on the first insulating layer; a second insulating layer on the first insulating layer and the first conductive layer; a second conductive layer on the second insulating layer; a third insulating layer on the second conductive layer; a first electrode on the third insulating layer and electrically connected to the semiconductor layer; a second electrode spaced from the first electrode; and at least one light-emitting element between the first electrode and the second electrode, wherein the semiconductor layer includes a first semiconductor region and a second semiconductor region, wherein the first conductive layer includes a first gate electrode overlapping with the first semiconductor region and a second gate electrode overlapping with the second semiconductor region, and wherein the second conductive layer includes a first voltage line electrically connected between the first semiconductor region and the second semiconductor region; and a first conductive pattern electrically connected to the first semiconductor region, the second semiconductor region, and the first electrode.

In an exemplary embodiment, wherein the first voltage line is electrically connected through a first contact hole and a second contact hole that extend through the first insulating layer and the second insulating layer, and wherein one side of the first semiconductor region is electrically connected through the first contact hole, and one side of the second semiconductor region is electrically connected through the second contact hole.

In an exemplary embodiment, wherein the first conductive pattern is electrically connected to a third contact hole and a fourth contact hole through the first insulating layer and the second insulating layer, and wherein the third contact hole is electrically connected to the other side of the first semiconductor region and the fourth contact hole is electrically connected to the other side of the second semiconductor region.

In an exemplary embodiment, wherein the first conductive pattern is electrically connected to the first electrode through a fifth contact hole through the third insulating layer.

In an exemplary embodiment, wherein a second conductive pattern further includes a second voltage line electrically connected to the second electrode through a sixth contact hole through the third insulating layer.

In an exemplary embodiment, wherein the first electrode is electrically connected to the first semiconductor region and the second semiconductor region through an electrode contact hole through the third insulating layer.

In an exemplary embodiment, wherein the at least one light-emitting element includes: semiconductor crystals including a first conductivity-type semiconductor, an active layer on the first conductivity-type semiconductor, and a second conductivity-type semiconductor on the active layer; and an insulating coating surrounding at least a part of an outer surface of the semiconductor crystals.

In an exemplary embodiment, wherein the first conductivity-type semiconductor is electrically connected to the second electrode, and the second conductivity-type semiconductor is electrically connected to the first electrode.

According to an embodiment of the present discloser, a method of fabricating a display device includes preparing a circuit element layer including a driving transistor and a first transistor each having an electrode electrically connected to a first supply voltage line and another electrode electrically connected to a pixel electrode, a second supply voltage line connected to a common electrode spaced from and facing the pixel electrode, a scan line connected to a gate electrode of the first transistor and transmitting a scan signal; loading a plurality of light-emitting elements on the pixel electrode and the common electrode and applying the scan signal to the scan line; and landing the light-emitting elements between the pixel electrode and the common electrode.

In an exemplary embodiment, wherein the first transistor is turned on while the driving transistor is turned off in response to the scan signal.

In an exemplary embodiment, wherein an AC voltage is applied to the second supply voltage line, and a grounded voltage applied to the first supply voltage line is transmitted to the pixel electrode through the first transistor.

In an exemplary embodiment, wherein a capacitance is formed between the pixel electrode and the common electrode in the landing the light-emitting elements.

In an exemplary embodiment, wherein the circuit element layer further includes: a first pixel electrode and a second pixel electrode; a first electrode spaced from and facing the first pixel electrode and the common electrode spaced from and facing the second pixel electrode; a first driving transistor having an electrode electrically connected to first pixel electrode; a second driving transistor having an electrode electrically connected to the second pixel electrode; and a first scan line to which a first scan signal is applied; a second transistor having an electrode electrically connected to the first supply voltage line and another electrode electrically connected to the second pixel electrode; and a second scan line connected to a gate electrode of the second transistor, wherein a second scan signal is applied to the second scan line.

In an exemplary embodiment, wherein, the common electrode comprises a first common electrode and a second common electrode, wherein at a first time point, the light-emitting elements are loaded on the first pixel electrode and the first common electrode, and wherein the first scan signal is applied to the first scan line while the second scan signal is not applied to the second scan line.

In an exemplary embodiment, wherein, at the first time point, the first transistor is turned on while the first driving transistor, the second transistor and the second driving transistor are turned off.

In an exemplary embodiment, wherein, at a second time point, the light-emitting elements are loaded on the second pixel electrode and the second common electrode, and wherein the second scan signal is applied to the second scan line while the first scan signal is not applied to the first scan line.

In an exemplary embodiment, wherein, at the second time point, the second transistor is turned on while the first driving transistor, the second driving transistor and the first transistor are turned off.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

The present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments of the present disclosure will be described with reference to the accompanying drawings.

Figure 1:
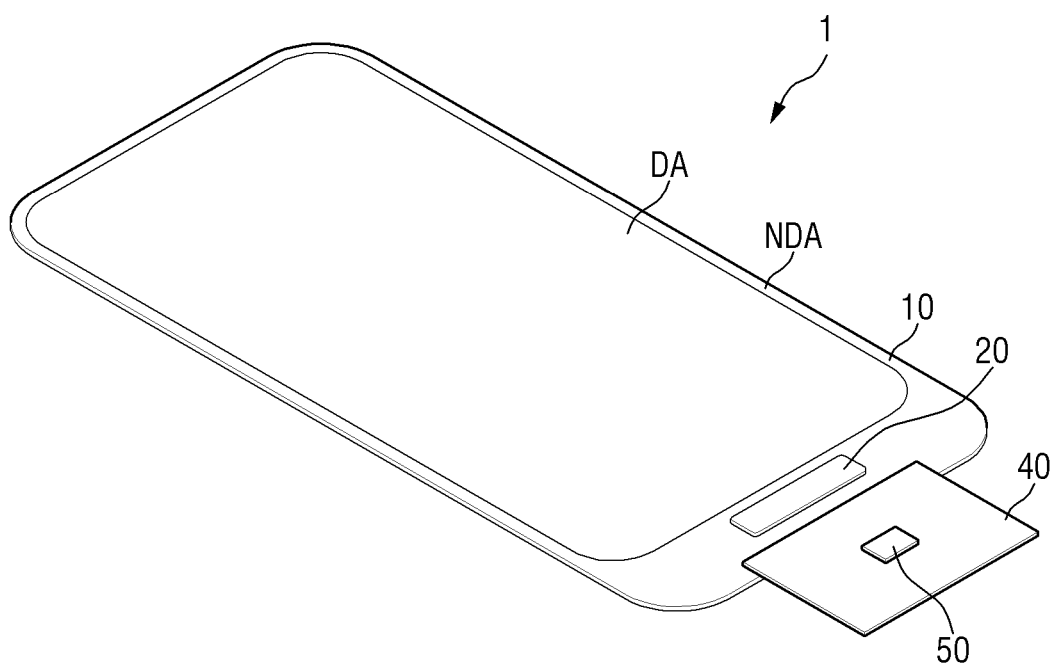
FIG. 1 is a perspective view showing a display device according to an exemplary embodiment of the present disclosure.
Figure 2:
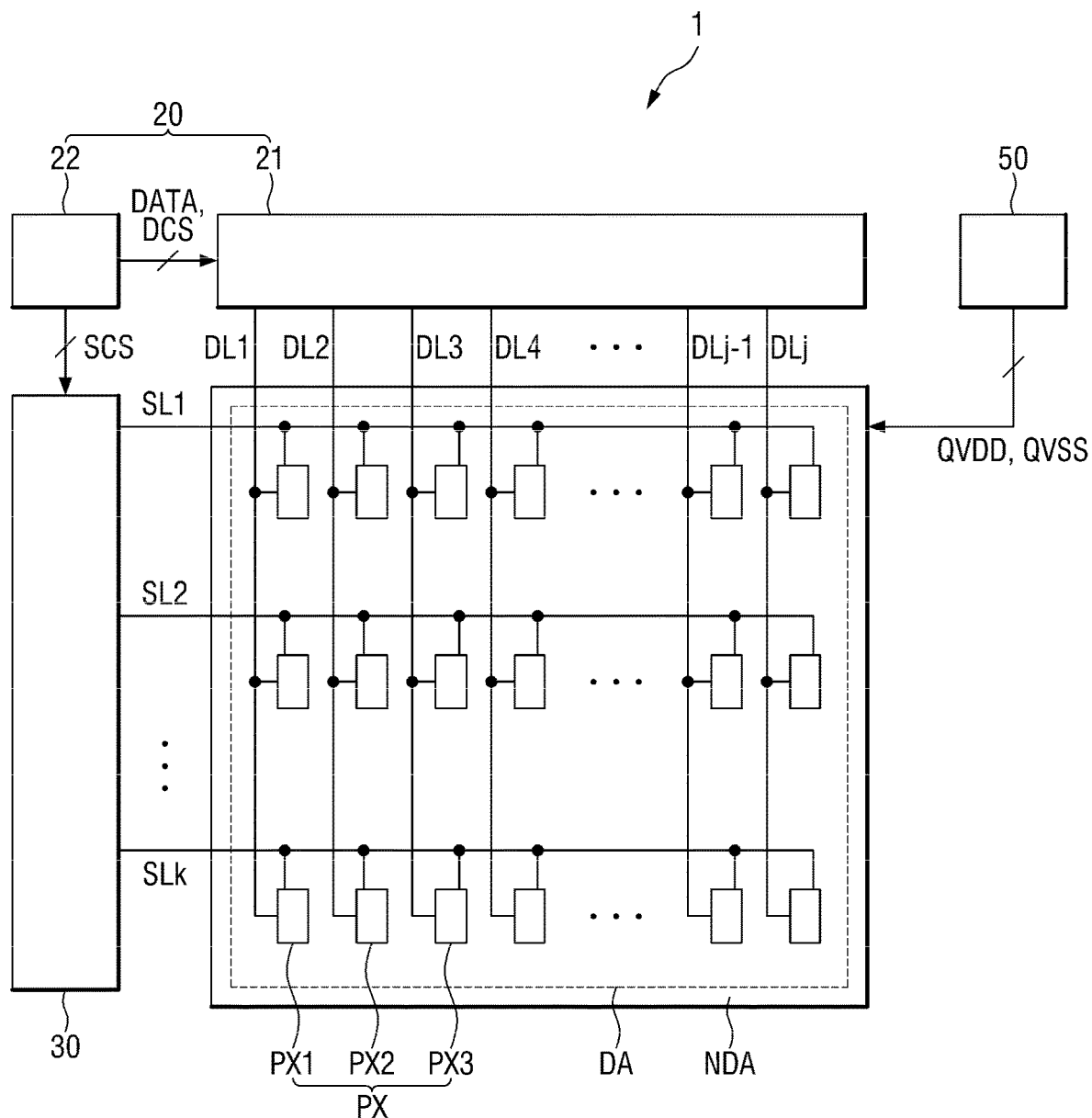
FIG. 2 is a block diagram showing a display device according to an exemplary embodiment of the present disclosure.
Figure 3:
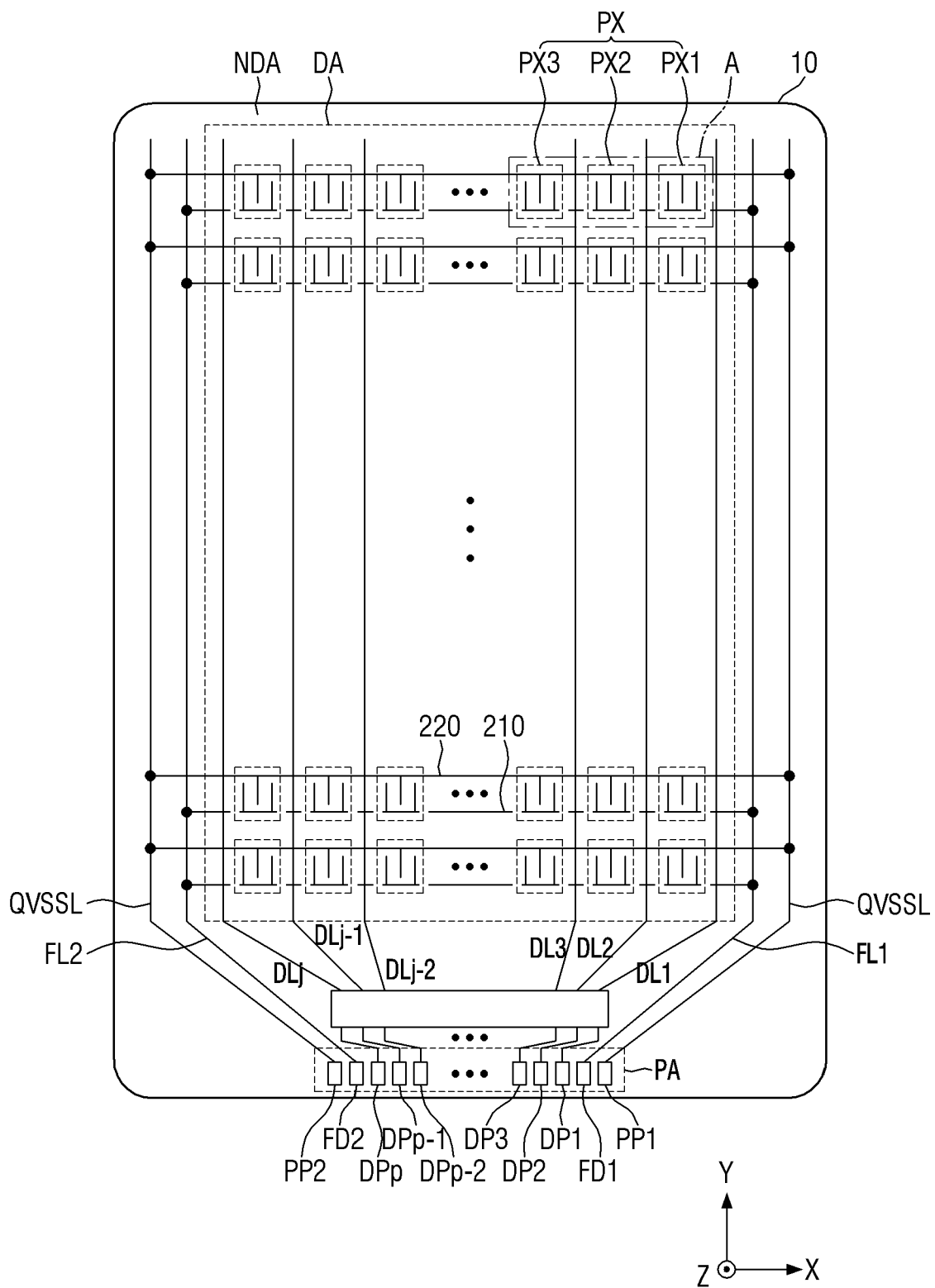
FIG. 3 is a plan view schematically showing a display panel of FIG. 1.

FIG. 1 is a perspective view showing a display device according to an exemplary embodiment of the present disclosure. FIG. 2 is a block diagram showing a display device according to an exemplary embodiment of the present disclosure. FIG. 3 is a plan view schematically showing a display panel of FIG. 1.

Referring to FIGS. 1 to 3, a display device 1 according to an exemplary embodiment of the present disclosure includes a display panel 10, an integrated driving circuit 20, a scan driver 30, a circuit board 40, and a power supply circuit 50. The integrated driving circuit 20 may include a data driver 21 and a timing controller 22.

As used herein, the terms "above," "top" and "upper surface" refer to the side indicated by the arrow in the z-axis direction, whereas the terms "below," "bottom" and "lower surface" refer to the opposite side in the z-axis direction. As used herein, the terms "left," "right," "upper" and "lower" sides indicate relative positions when the display panel 10 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

The display panel 10 may have a rectangular shape when viewed from the top. For example, the display panel 10 may have a rectangular shape having shorter sides in a first direction (x-axis direction) and longer sides in a second direction (y-axis direction) when viewed from the top as shown in FIG. 1. Each of the corners where the short side in the first direction (x-axis direction) meets the longer side in the second direction (y-axis direction) may be formed at a right angle or may be rounded with a set or predetermined curvature. The shape of the display panel 10 when viewed from the top is not limited to a rectangular shape, but may be formed in a different polygonal shape, a circular shape, or an elliptical shape. Although the display panel 10 is formed flat in FIG. 1, this is merely illustrative. At least a side of the display panel 10 may be bendable at a set or predetermined curvature.

Figure 4:
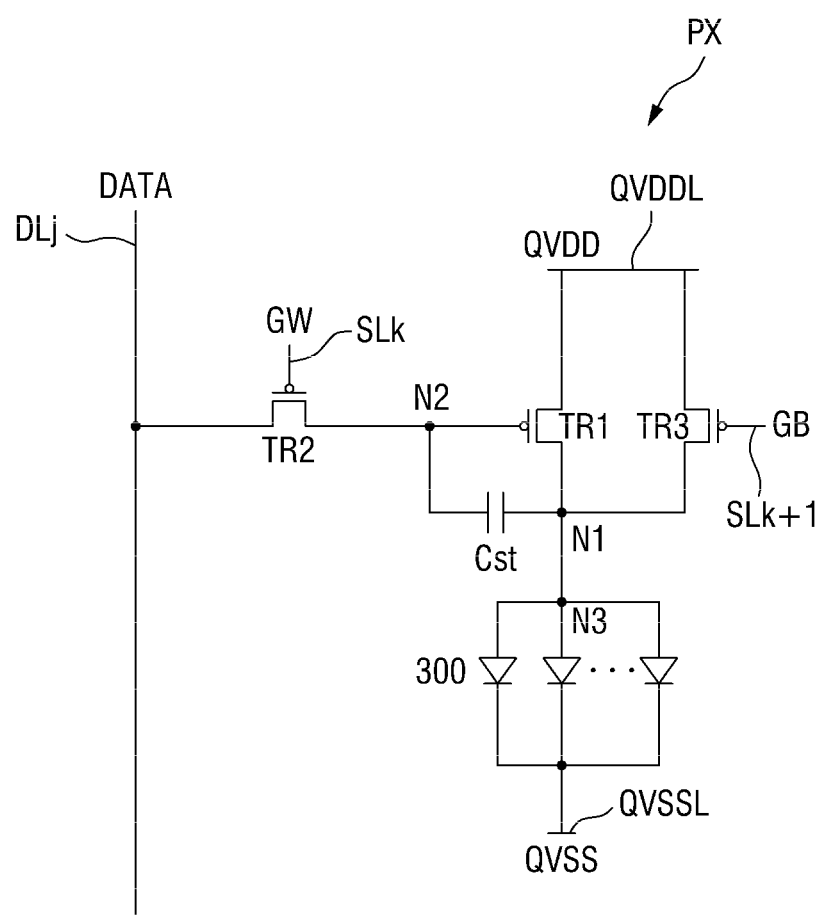
FIG. 4 is a circuit diagram showing one of the pixels of FIG. 2.

The display panel 10 may be divided into a display area DA and a non-display area NDA located around the display area DA. The display area DA includes a plurality of pixels PX to display images. The display panel 10 may include data lines DL1 to DLj, scan lines SL1 to SLk crossing the data lines DL1 to DLj, a first supply voltage line QVDDL (as shown in FIG. 4) to supply a first voltage, a second supply voltage line QVSSL to supply a second voltage, and pixels PX connected to the data lines DL1 to DLj and the scan lines SL1 to SLk, where j and k are integers equal to or greater than two.

The pixels PX may include one or more light-emitting elements 300 (shown in FIG. 4) that emit light of particular wavelength bands to represent colors. The light emitted from the light-emitting elements 300 can be seen from the outside through the display area DA of the display panel 10.

Each of the pixels PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. The first color may be red, the second color may be green, and the third color may be blue. It is, however, to be understood that the present disclosure is not limited thereto. In some implementations, the sub-pixels PXn may emit light of the same color. Although each of the pixels PX includes three sub-pixels in the example shown in FIG. 2, the present disclosure is not limited thereto. Each of the pixels PX may include four or more sub-pixels in other embodiments.

The integrated driving circuit 20 outputs signals and voltages for driving the display panel 10. To this end, the integrated driving circuit 20 may include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies the analog data voltages to the data lines DL1 to DLj of the display panel 10.

The timing controller 22 receives the digital video data DATA and timing signals from a host system. The timing signals may include a vertical sync signal, a horizontal sync signal, a data enable signal, and a dot clock. The host system may be an application processor of a smartphone or a tablet PC, a system on chip of a monitor or a TV, and the like.

The timing controller 22 generates control signals for controlling the operation timings of the data driver 21 and the scan driver 30. The control signals may include a source control signal DCS for controlling the operation timing of the data driver 21, and a scan control signal SCS for controlling the operation timing of the scan driver 30.

The integrated driving circuit 20 may be located in the non-display area NDA provided on one side of the display panel 10. The integrated driving circuit 20 may be implemented as an integrated circuit (IC) and may be attached to the display panel 10 by a chip on glass (COG) technique, a chip on plastic (COP) technique, or an ultrasonic bonding. However, the present disclosure is not limited thereto. For example, the integrated driving circuit 20 may be mounted on the circuit board 40 instead of the display panel 10.

In addition, although the integrated driving circuit 20 includes the data driver 21 and the timing controller 22 in the example shown in FIG. 2, the present disclosure is not limited thereto. The data driver 21 and the timing controller 22 may not be formed as a single integrated circuit but may be formed as separate integrated circuits. In such case, the data driver 21 (e.g., integrated driving circuit) may be mounted on the display panel 10 by a chip on glass (COG) technique, a chip on plastic (COP) technique or an ultrasonic bonding, and the timing controller 22 may be mounted on the circuit board 40.

The scan driver 30 receives the scan control signal SCS from the timing controller 22. The scan driver 30 generates scan signals according to the scan control signal SCS and supplies the scan signals to the scan lines SL1 to SLk of the display panel 10. The scan driver 30 may include a plurality of transistors and may be formed in the non-display area NDA of the display panel 10. Alternatively, the scan driver 30 may be formed as an integrated circuit. In such case, the scan driver 30 may be mounted on a gate flexible film attached to another side of the display panel 10.

The circuit board 40 may be attached to pads provided at the edge on one side of the display panel 10 using an anisotropic conductive film. Accordingly, the lead lines of the circuit board 40 may be electrically connected to the pads. The circuit board 40 may be a flexible printed circuit board, a printed circuit board, or a flexible film such as a chip on film. The circuit board 40 may be bent toward below the display panel 10. In such case, one side of the circuit board 40 may be attached to the edge on one side of the display panel 10, and the other side thereof may be below the display panel 10 to be connected to the system board where the host system is mounted.

The power supply circuit 50 may generate voltages required for driving the display panel 10 from a main power applied from the system board and may supply the voltages to the display panel 10. For example, the power supply circuit 50 generates a first voltage QVDD and a second voltage QVSS for driving the light-emitting elements 300 of the display panel 10 from the main power and may supply them to a first voltage line QVDDL and a second voltage line QVSSL. In addition, the power supply circuit 50 may generate driving voltages for driving the integrated driving circuit 20 and the scan driver 30 from the main power to supply them.

Although the power supply circuit 50 is formed as an integrated circuit and mounted on the circuit board 40 in the example shown in FIG. 1, the exemplary embodiments of the present disclosure are not limited thereto. For example, the power supply circuit 50 may be integrally formed with the integrated driving circuit 20.

FIG. 3 shows a plan view of the display panel 10 of FIG. 1 in detail. For convenience of illustration, FIG. 3 shows only data pads DP1 to DPp, floating pads FD1 and FD2, power pads PP1 and PP2, floating lines FL1 and FL2, a second voltage line QVSSL, data lines DL1 to DLj, first electrode lines 210 and second electrode lines 220, where p is an integer equal to or greater than two.

Referring to FIG. 3, a plurality of pixels PX is arranged in the display area DA of the display panel 10. Each of the pixels PX may include a plurality of electrode lines 210 and 220 and light-emitting elements aligned between them. In the drawings, the plurality of pixels PX may be arranged in the first direction (x-axis direction) which is the horizontal direction and the second direction (y-axis direction) which is the vertical direction. Although three sub-pixels PX1, PX2 and PX3 are shown in portion A of FIG. 3, it is to be understood that the display panel 10 may include a larger number of pixels PX or sub-pixels PX1, PX2 and PX3.

The first sub-pixel PX1, the second sub-pixel PX2 and the third sub-pixel PX3 of each of the pixels PX may be arranged in regions defined in a matrix pattern by the first electrode lines 210, the second electrode lines 220 and the data lines DL1 to DLj.

In addition, the pixels PX shown in FIG. 3 may be divided into several pixels, each of which may be for a pixel PX. The pixels may not be necessarily arranged in parallel in the first direction (x-axis direction) and the second direction (y-axis direction) as shown in FIG. 3 but may be arranged in a variety of patterns such as a zigzag pattern.

No pixel is located in the non-display area NDA, which may be defined as the area of the display panel 10 other than the display area DA. The non-display area NDA may be covered by some elements so that it is not visible from the outside of the display panel 10. In the non-display area NDA, a variety of elements for driving the light-emitting elements 300 in the display area DA may be located. As shown in FIG. 3, a plurality of pads DP, FD, and PP may be located in the non-display area NDA located on one side of the display area DA of the display panel 10, e.g., at the upper side of the display panel DA when viewed from the top.

The plurality of pads may include data pads DP, power pads PP, and floating pads FD. The data pads DP may be connected to a plurality of data lines DL extended to each of the pixels PX in the display area DA. The data pads DP may transmit a data signal for driving each pixel PX to each pixel PX through the data lines DL. Each data lines DL is connected to the respective data pad DP. The number of data pads DP included in the display panel 10 may be equal to the number of the sub-pixels PXn arranged in the first direction (x-axis direction) of the display area DA.

The data lines DL1 to DLj may be extended in the second direction (y-axis direction). One side of each of the data lines DL1 to DLj may be connected to the integrated driving circuit 20. Thus, the data voltages from the integrated driving circuit 20 may be applied to the data lines DL1 to DLj.

The first electrode lines 210 may be spaced from one another other by a set or predetermined distance in the first direction (x-axis direction). Accordingly, the first electrode lines 210 may not overlap with the data lines DL1 to DLj. During the processes of fabricating the display device 1, both ends of a single electrode line may be connected to a first floating line FL1 and a second floating line FL2 in the non-display area NDA, respectively, and then may be cut from pixel to pixel or from sub-pixel to sub-pixel, to form the first electrode line 210.

Each of the second electrode lines 220 may be extended in the first direction (x-axis direction). Accordingly, the second electrode lines 220 may overlap with the data lines DL1 to DLj. In addition, unlike the first electrode lines 210, the second electrode lines 220 may be connected to the second voltage line QVSSL in the non-display area NDA. Accordingly, the second voltage QVSS of the second voltage line QVSSL may be applied to the second electrode lines 220.

In the non-display area NDA of the display panel 10, the pad unit PA including the data pads DP1 to DPp, the floating pads FD1 and FD2 and the power pads PP1 and PP2, the integrated driving circuit 20, the first floating line FL1, the second floating line FL2 and the second voltage line QVSSL may be located.

The pad unit PA including the data pads DP1 to DPp, the floating pads FD1 and FD2 and the power pads PP1 and PP2 may be located at the edge on one side of the display panel 10, e.g., the edge on the lower side of the display panel 10. The data pads DP1 to DPp, the floating pads FD1 and FD2 and the power pads PP1 and PP2 may be arranged in parallel in the first direction (x-axis direction) in the pad unit PA.

The circuit board 40 may be attached on the data pads DP1 to DPp, the floating pads FD1 and FD2 and the power pads PP1 and PP2 using an anisotropic conductive film. Accordingly, the circuit board 40 may be electrically connected to the data pads DP1 to DPp, the floating pads FD1 and FD2 and the power pads PP1 and PP2.

The integrated driving circuit 20 may be connected to the data pads DP1 to DPp through link lines LL. The integrated driving circuit 20 may receive the digital video data DATA and timing signals through the data pads DP1 to DPp. The integrated driving circuit 20 may convert the digital video data DATA into analog data voltages and supply the analog data voltages to the data lines DL1 to DLj of the display panel 10.

The second voltage line QVSSL may be connected to the first power pad PP1 and the second power pad PP2 of the pad unit PA. The second voltage line QVSSL may be extended in the second direction (y-axis direction) in the non-display area NDA on left and right outer sides of the display area DA. The second voltage line QVSSL may be connected to the second electrode lines 220. Accordingly, the second voltage QVSS of the power supply circuit 50 may be applied to the second electrode lines 220 via the circuit board 40, the first power line PP1, the second power pad PP2, and the second voltage line QVSSL.

The first floating line FL1 may be connected to the first floating pad FD1 of the pad unit PA. The first floating line FL1 may be extended in the second direction (y-axis direction) in the non-display area NDA on left and right outer sides of the display area DA.

The second floating line FL2 may be connected to the second floating pad FD2 of the pad unit PA. The second floating line FL2 may be extended in the second direction (y-axis direction) in the non-display area NDA on left and right outer sides of the display area DA. The first and second floating pads FD1 and FD2 and the first and second floating lines FL1 and FL2 may be dummy pads and dummy lines to which no voltage is applied.

The first floating line FL1 and the second floating line FL2 are for applying an alignment signal during the fabricating process, and no voltage may be applied to the fabricated display device. Alternatively, a ground voltage may be applied to the first floating line FL1 and the second floating line FL2 to reduce static electricity in the fabricated display device.

Although not shown in the drawings, the display panel 10 may further include the first voltage line QVDDL for applying the first voltage QVDD to each pixel PX. The first voltage line QVDDL may be connected to another pad (not shown) on one side to apply a set or predetermined voltage to each pixel PX or sub-pixel PXn.

Typically, during the process of fabricating the display device 1, an electric field may be formed in each of the pixels PX or the sub-pixels PXn to align the light-emitting elements 300. Specifically, the light-emitting elements 300 can be aligned by applying the dielectrophoretic force during the fabricating process, based on the dielectrophoresis phenomenon. The ground voltage is applied to the first electrode lines 210 and AC voltage is applied to the second electrode lines 220 to form an electric field in the pixels PX or the sub-pixels PXn. The dielectrophoretic force can be transferred through the electric field so that the light-emitting elements 300 can be aligned between the electrodes.

The process of aligning the light-emitting elements 300 in the pixels PX or the sub-pixels PXn may be performed while the first electrode lines 210 are connected to each other. In such a case, after the light-emitting elements 300 are aligned between the first electrode lines 210 and the second electrode lines 220 during the process of fabricating the display device 1, a subsequent process of patterning the first electrode lines 210 or the second electrode lines 220 is required.

In contrast, according to the exemplary embodiment of the present disclosure, the display device 1 includes a transistor for driving light-emitting elements 300 and a transistor for aligning the light-emitting elements 300 in a single pixel PX. During the process of fabricating the display device 1, the first electrode lines 210 or the second electrode lines 220 may be patterned for each of the pixels PX, and then an alignment signal may be applied through the alignment transistor to align the light-emitting elements 300. Thus, during the fabrication of the display device 1, the same process can be performed at once to simplify the process, and in some cases, an unnecessary step can be omitted, which is desirable.

In such a case, the first voltage line QVDDL may be an alignment signal for aligning the light-emitting elements 300, e.g., a ground voltage. That is to say, the first voltage QVDD may be applied through the first voltage line QVDDL when the display device 1 is driven whereas the ground voltage line may be applied when the display device 1 is fabricated. A more detailed description thereon will be given later.

FIG. 4 is a circuit diagram showing one of the pixels of FIG. 2.

Each of the first sub-pixel PX1, the second sub-pixel PX2 and the third sub-pixel PX3 may be connected to at least one of the data lines DL1 to DLj, at least one of the scan lines SL1 to SLk, and the first voltage line QVDDL. The data line DLj may transmit a data signal to each sub-pixel PXn, the scan line SLk may transmit a scan signal GW or GB to each sub-pixels PXn, and the first voltage line QVDDL may transmit a drive current or an alignment signal.

As used herein, the terms "first," "second," and so on are used to distinguish between similar elements and not necessarily for describing a sequential or chronological order. It is to be understood that the terms so used are interchangeable under appropriate circumstances and that the exemplary embodiments of the present disclosure described herein are capable of operation in other sequences than described or illustrated herein. Accordingly, in the following description, a first element may be a second element within the technical scope of the present disclosure.

Each of the first sub-pixel PX1, the second sub-pixel PX2 and the third sub-pixel PX3 may include the light-emitting elements 300 and a plurality of transistors and at least one capacitor for supplying current to the light-emitting elements 300.

The plurality of transistors may include a first transistor TR1 for applying a driving voltage to the light-emitting elements 300, a second transistor TR2 for applying a data signal DATA to the gate electrode of the first transistor TR1, and a third transistor TR3 for applying an alignment signal during the process of aligning the light-emitting elements 300.

In FIG. 4, the sub-pixel PXn has a three-transistor and one-capacitor (3T1C) cell structure. It is, however, to be understood that the present disclosure is not limited thereto. The sub-pixel PXn may include a greater number of transistors and more than one capacitor.

Each of the first to third transistors TR1, TR2 and TR3 may include a first electrode, a second electrode, and a gate electrode. One of the first electrode and the second electrode may be a source electrode and the other may be a drain electrode.

Each of the first to third transistors TR1, TR2 and TR3 may be formed as a thin-film transistor. In the example shown in FIG. 4, each of the first to third transistors TR1, TR2 and TR3 is implemented as a p-type MOSFET (Metal Oxide Semiconductor Field Effect Transistor). It is, however, to be understood that the present disclosure is not limited thereto. Each of the first transistor TR1, the second transistor TR2 and the third transistor TR3 may be implemented as an n-type MOSFET. For n-type MOSFETs, the positions of the source electrode and the drain electrode of each of the first transistor TR1, the second transistor TR2, and the third transistor TR3 may be changed. In the following description, the first to third transistors TR1, TR2 and TR3 are p-type MOSFETs as an example.

One end of each of the light-emitting elements 300 is connected to the first electrode line 210 of the display panel 10, and the other end thereof is connected to the second electrode line 220. As will be described later, one of the first electrode line 210 and the second electrode line 220 may be an anode electrode while the other may be a cathode electrode. It is, however, to be understood that the present disclosure is not limited thereto. That is to say, the first electrode line 210 may be the cathode electrode while the second electrode line 220 may be the anode electrode. In the following description, it is assumed that the first electrode line 210 is the anode electrode and the second electrode line 220 is the cathode electrode.

The first electrode line 210 connected to the light-emitting elements 300 may be connected to a third node N3 of FIG. 4, while the second electrode line 220 may be connected to the second voltage line QVSSL. The light-emitting elements 300 may receive a set or predetermined current or signal transmitted to a first node N1 through the third node N3.

The first transistor TR1 (or the driving transistor) may include a first electrode connected to (or electrically connected to) the first node N1, a second electrode connected to the first voltage line QVDDL, and a gate electrode connected to the second electrode N2. The first transistor TR1 may supply a driving voltage applied from the first voltage line QVDDL to the light-emitting elements 300 based on the voltage at the second node N2 (or the voltage stored in a capacitor Cost described later).

The second transistor TR2 (or the switching transistor) may include a first electrode connected to the data line DLj, a second electrode connected to the second node N2, and a gate electrode connected to a first scan line SLk for supplying a first scan signal GW, where j is an integer satisfying 1≤j≤m, and k is an integer satisfying 1≤k≤n. The second transistor T2 may be turned on in response to the first scan signal GW and may transmit the data signal DATA transmitted from the data line DLj to the second node N2.

The third transistor TR3 (or the alignment transistor) may include a first electrode connected to the first voltage line QVDDL, a second electrode connected to the first node N1, and a gate electrode connected to a second scan line SL(k+1) for supplying a second scan signal GB. The third transistor TR3 may be turned on in response to the second scan signal GB and may apply the ground voltage transmitted from the first voltage line QVDDL to the third node N3 through the first node N1.

The capacitor Cst may be connected between the second node N2 and the first voltage line QVDDL. The capacitor Cst may store or hold the received data signal DATA.

In the display device 1 according to the exemplary embodiment of the present disclosure, two different transistors, e.g., the first transistor TR1 and the third transistor TR3 are located between the first voltage line QVDDL and one electrode of each of the light-emitting elements 300.

The first electrode of each of the first transistor TR1 and the third transistor TR3 is connected to the first voltage line QVDDL while the second electrode thereof is connected to the third node N3 that is connected to the electrode of each of the light-emitting elements 300. Each of the first and third transistors TR1 and TR3 may transmit a set or predetermined signal or voltage applied to the first voltage line QVDDL to the third node N3 connected to the electrode of each of the light-emitting elements 300.

It is to be noted that the first transistor TR1 is turned on or off based on the voltage at the second node N2 while the third transistor TR3 is turned on or off in response to the second scan signal GB supplied to the second scan line SL(k+1), as described above. According to an exemplary embodiment of the present disclosure, the first transistor TR1 is turned off while the third transistor TR3 is turned on during the process of fabricating the display device 1, so that the ground voltage transmitted to the first voltage line QVDDL is transmitted to the third node N3 through the third transistor TR3. When the display device 1 is being driven, the third transistor TR3 is turned off while the first transistor TR1 is turned on, so that the driving voltage transmitted to the first voltage line QVDDL is transmitted to the third node N3 through the first transistor TR1.

In this manner, each pixel PX or sub-pixel PXn may transmit different voltages or signals to the third node N3 through different transistors, e.g., the first transistor TR1 or the third transistor TR3. In particular, during the process of fabricating the display device 1, it is possible to transmit a signal for aligning the light-emitting elements 300 for each of the pixels PX or the sub-pixel PXn individually, so that a process of cutting or patterning the electrode lines can be performed before aligning the light-emitting elements 300. Thus, a method of fabricating the display device 1 according to an exemplary embodiment of the present disclosure has features that the same process can be performed at once during the process of fabricating the display device 1 to simplify the process, and in some cases, an unnecessary step of the process can be omitted.

Hereinafter, the structure and arrangement of elements in each sub-pixel PXn will be described.

Figure 5:
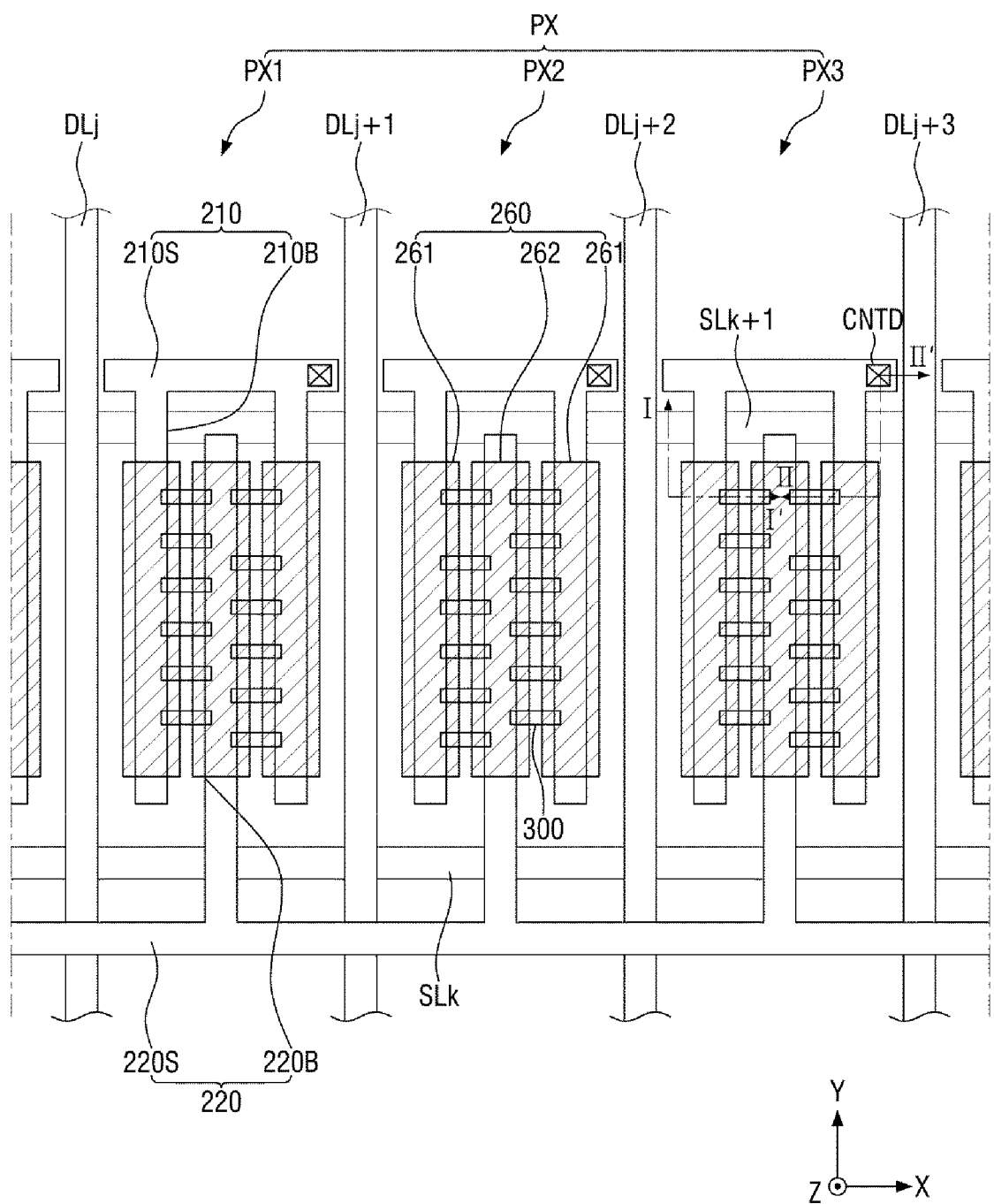
FIG. 5 is an enlarged view schematically showing a portion A of FIG. 3.

FIG. 5 is an enlarged view schematically showing a portion A of FIG. 3. It is to be understood that FIG. 5 is an enlarged view of portion A of FIG. 3 rotated 180°.

Referring to FIG. 5, each of the pixels PX may include the first sub-pixel PX1, the second sub-pixel PX2 and the third sub-pixel PX3. The first sub-pixel PX1, the second sub-pixel PX2 and the third sub-pixel PX3 in each of the pixels PX may be arranged in a matrix pattern in areas defined by the scan lines SLk and SL(k+1) and the data lines DLj, DL(j+1), DL(j+2) and DL(j+3) which intersect one another. The scan lines SLk and SL(k+1) may be extended in the first direction (x-axis direction) while the data lines DLj, DL(j+1), DL(j+2) and DL(j+3) may be extended in the second direction (y-axis direction) intersecting the first direction (x-axis direction).

Each of the first sub-pixel PX1, the second sub-pixel PX2 and the third sub-pixel PX3 may include a first electrode line 210, a second electrode line 220 and a plurality of light-emitting elements 300. The first electrode line 210 and the second electrode line 220 may be electrically connected to the light-emitting elements 300 and may receive a voltage so that the light-emitting elements 300 emit light. The voltage for allowing the light-emitting elements 300 to emit light may be transmitted through the first transistor TR1 of FIG. 4.

In addition, at least some of the electrodes 210 and 220 may be utilized to form an electric field within the pixel PX to align the light-emitting elements 300. A voltage for aligning the light-emitting elements 300 may be transmitted through the third transistor TR3 of FIG. 4.

The electrode lines 210 and 220 may include the first electrode line 210 and the second electrode line 220. In an exemplary embodiment, the first electrode 210 may be disconnected from pixel to pixel PX, while the second electrode 220 may be a common electrode connected across the plurality of pixels PX. One of the first electrode line 210 and the second electrode line 220 may be the anode electrode of each of the light-emitting elements 300, while the other may be the cathode electrode of each of the light-emitting elements 300. It is, however, to be understood that the present disclosure is not limited thereto.

The first electrode 210 and the second electrode 220 may include electrode stems 210S and 220S extended in the first direction (x-axis direction), respectively, and one or more electrode branches 210B and 220B branching off from the electrode stems 210S and 220S, respectively, and extended in the second direction (y-axis direction) intersecting the first direction (x-axis direction) (x-axis direction).

Specifically, the first electrode 210 may include the first electrode stem 210S extended in the first direction (x-axis direction), and at least one first electrode branch 210B branching off from the electrode stem 210S and extended in the second direction (y-axis direction).

The first electrode stem 210S of a pixel may be substantially in line with the first electrode stem 210S of a pixel adjacent to the pixel in the same row (e.g., in the first direction (x-axis direction)). In other words, both ends of the first electrode 210S of a pixel may be terminated between the pixel and an adjacent pixel PX and separated from it, and the first electrode stem 210S of the adjacent pixel may be in line with the first electrode stem 210S of the pixel. Accordingly, the first electrode stem 210S in each of the pixels PX may apply an electric signal to its electrode branch 210B, such that the first electrode branches 2106 may be driven individually.

The first electrode stem 210S may be formed as a single stem electrode during the fabricating process, and then it may be cut using a laser or the like before the light-emitting elements 300 are aligned. Alternatively, the first electrode stem 210S may be disconnected from one another when the first electrode lines 210 and the second electrode lines 220 are formed on the display panel 10. It is possible to apply an alignment signal to each pixel PX or sub-pixel PXn through the third transistor TR3 of FIG. 4 even if the first electrode stem 210S is disconnected from one another before the light-emitting elements 300 are aligned.

The first electrode branch 210B may branch off from at least a portion of the first electrode stem 210S to be extended in the second direction (y-axis direction) and may be terminated while being spaced from the second electrode stem 220S that is opposed to the first electrode stem 210S.

In addition, one or more first electrode branches 210B may be in each pixel PX. Although the two first electrode branches 2106 are located in the pixel PX and the second electrode branch 220B is located therebetween in the example shown in FIG. 5, this is merely illustrative. In some embodiments, more than two first electrode branches 210B may be located in the pixel PX. In some exemplary embodiments, the second electrode branch 220B may be located between the first electrode branches 210B, and each sub-pixel PXn may have a symmetrical structure with respect to the second electrode branch 220B. It is, however, to be understood that the present disclosure is not limited thereto.

The second electrode 220 may include a second electrode stem 220S extended in the first direction (x-axis direction) and spaced from and opposed to the first electrode stem 210S, and at least one second electrode branch 220B branching off from the second electrode stem 220S and extended in the second direction (y-axis direction) and spaced from and facing the first electrode branch 210B. It is to be noted that the other end of the second electrode stem 220S may be extended across the plurality of pixels PX adjacent to one another in the first direction (x-axis direction). Accordingly, each end of the second electrode stem 220S in a pixel may be connected to the end of another second electrode stem 220S in an adjacent pixel between the pixels.

The second electrode branch 220B may be spaced from and facing the first electrode branch 210B and may be terminated while being spaced from the first electrode stem 210S. That is to say, in a pixel PX, an end of the second electrode branch 220B may be connected to the second electrode stem 220S, and the other end of the second electrode branch 220B may be spaced from the first electrode stem 210S.

The first electrode branch 210B may be extended toward a side in the second direction (y-axis direction) while the second electrode branch 220B may be extended toward the opposite side in the second direction (y-axis direction), such that they may be located on the opposite sides with respect to the center of the pixel PX. It is, however, to be understood that the present disclosure is not limited thereto. The first electrode stem 210S and the second electrode stem 220S may be located on the same side of the center of the pixel PX and may be spaced from each other. In such a case, the first electrode branch 210B and the second electrode branch 220B branching off from the electrode stems 210S and 220S, respectively, may be extended in the same direction.

A plurality of light-emitting elements 300 may be aligned between each of the first electrode branches 210B and the second electrode branch 220B. At least some of the light-emitting elements 300 may have an end electrically connected to the first electrode branches 210B and the other end electrically connected to the second electrode branch 220B.

The light-emitting elements 300 may be spaced from one another in the second direction (y-axis direction) and may be substantially aligned in parallel with one another. The spacing between the light-emitting elements 300 is not particularly limited herein. In some implementations, some of the light-emitting elements 300 may be located close to each other to form a group, and some other of the light-emitting elements 300 may located close to each other to form another group that is spaced from the group. Alternatively, the light-emitting elements 300 may be arranged such that they are orientated in a direction with irregular densities.

Contact electrodes 260 may be located on the first electrode branches 210B and the second electrode branch 220B.

The contact electrodes 260 may be extended in the second direction (y-axis direction) and may be spaced from one another in the first direction (x-axis direction). The contact electrodes 260 may be in contact with at least one end of each of the light-emitting elements 300, and the contact electrodes 260 may be in contact with the first electrode line 210 or the second electrode line 220 to receive an electric signal. Accordingly, the contact electrodes 260 may transmit an electric signal transmitted from each of the electrode lines 210 and 220 to the light-emitting elements 300.

The contact electrodes 260 may be located on the electrode branches 210B and 220B so as to partly cover them. The contact electrodes 260 may include first and second contact electrodes 261 and 262 in contact with one side or the other end of each of the light-emitting elements 300.

The first contact electrode 261 may be located on the first electrode branch 210B and be in contact with the end of each of the light-emitting elements 300 that is electrically connected to the first electrode line 210. The second contact electrode 262 may be located on the second electrode branch 220B and be in contact with the other end of each of the light-emitting elements 300 that is electrically connected to the second electrode line 220.

In some exemplary embodiments, both ends of each of the light-emitting elements 300 electrically connected to the first electrode branch 210B or the second electrode branch 220B may be n-type or p-type doped conductive semiconductor layers. When one end of each of the light-emitting elements 300 electrically connected to the first electrode branch 210B is a p-type doped conductive semiconductor layer, the other end of each of the light-emitting elements 300 electrically connected to the second electrode branch 220B may be an n-type doped conductive semiconductor layer. It is, however, to be understood that the present disclosure is not limited thereto. The types of the semiconductor layers may be reversed.

The first electrode stem 210S may be electrically connected to the first transistor TR1 or the third transistor TR3, which will be described later, through an electrode contact hole CNTD. In addition, although not shown in the drawings, the second electrode stem 220S may be connected to the second voltage line QVSSL through the electrode contact hole formed in the non-display area NDA. In such a case, in each of the sub-pixels PXn, the second electrode stem 220S may not include an electrode contact hole, unlike the first electrode stem 210S. It is, however, to be understood that the present disclosure is not limited thereto. A predetermined electrode contact hole may be on the second electrode stem 220S to be electrically connected to the second voltage line QVSSL.

The first electrode stem 210S may receive a driving voltage or an alignment signal of the first transistor TR1 or the third transistor TR3. The second electrode stem 220S may receive the driving voltage or the alignment signal through the second voltage line QVSSL.

In the display device 1 according to the exemplary embodiment of the present disclosure, the first transistor TR1 may be turned on and the driving voltage is applied to the first electrode stem 210S when the display device 1 is driven, while the third transistor TR3 may be turned on and the alignment signal may be applied to the first electrode stem 210S during the process of fabricating the display device 1. That is to say, the first electrode lines 210S of the display device 1 may include different transistors, so that different signals may be transmitted between when the display device 1 is driven and when the display device 1 is fabricated. Because the first transistor TR1 and the third transistor TR3 can be turned on in each of the pixels PX or sub-pixels PXn individually, it is possible to drive only a particular pixel PX or sub-pixel PXn or to align the light-emitting elements 300. A more detailed description thereon will be given later.

The plan view of FIG. 5 shows only the first electrode line 210, the second electrode line 220 and the light-emitting elements 300 arranged in the display panel 10. As will be described later, the first electrode line 210 and the second electrode line 220 of the display panel 10 may be electrically connected to the elements on a circuit element layer located thereunder. The elements on the circuit element layer may form a plurality of elements including a semiconductor layer, conductive layers, and the like.

Hereinafter, the configuration of the display panel 10 will be described in detail with reference to the layout diagram and cross-sectional views of the display panel 10 and the like.

Figure 6:
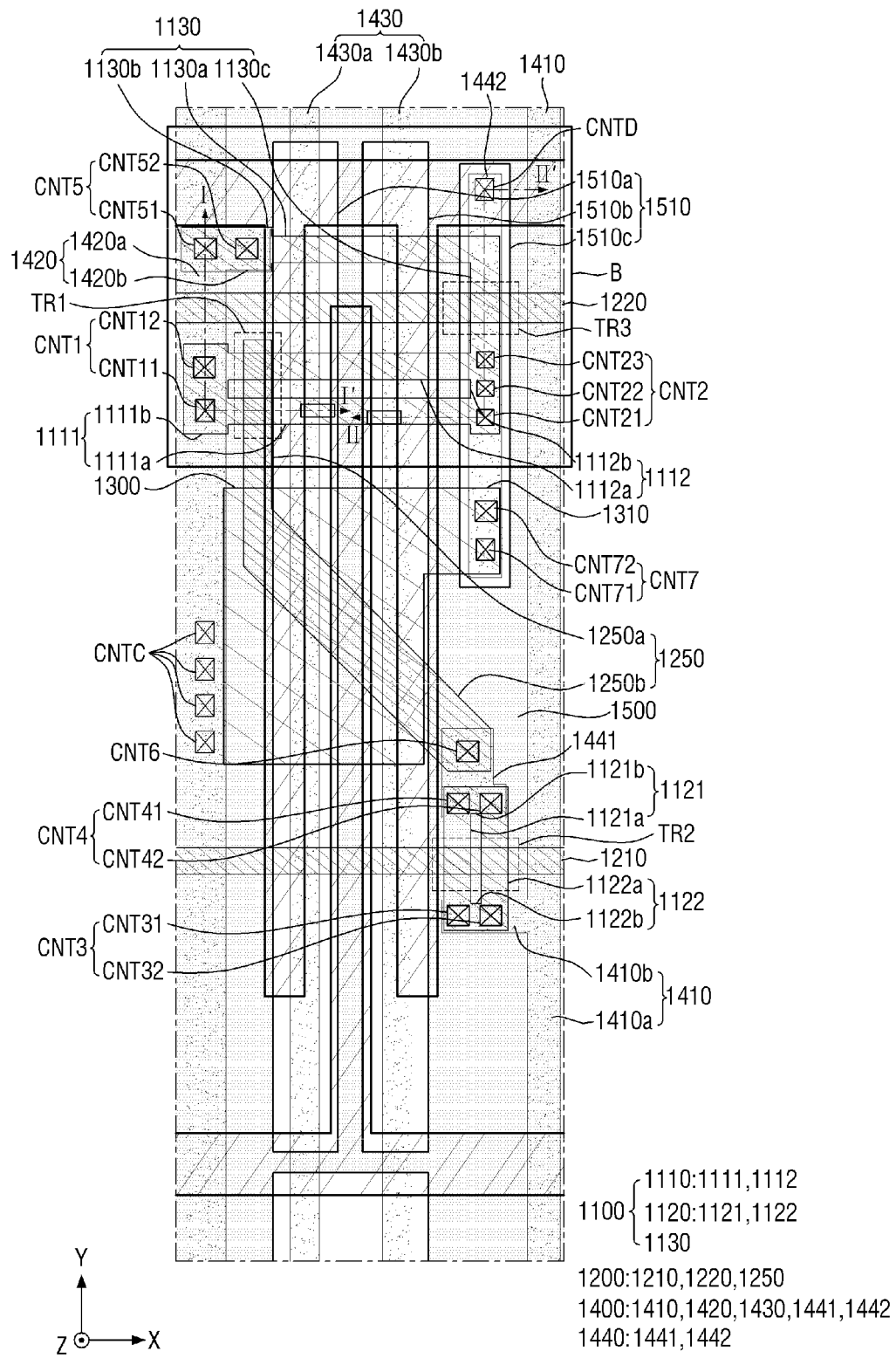
FIG. 6 is a diagram showing a layout of one of the pixels of FIG. 5.
Figure 7:
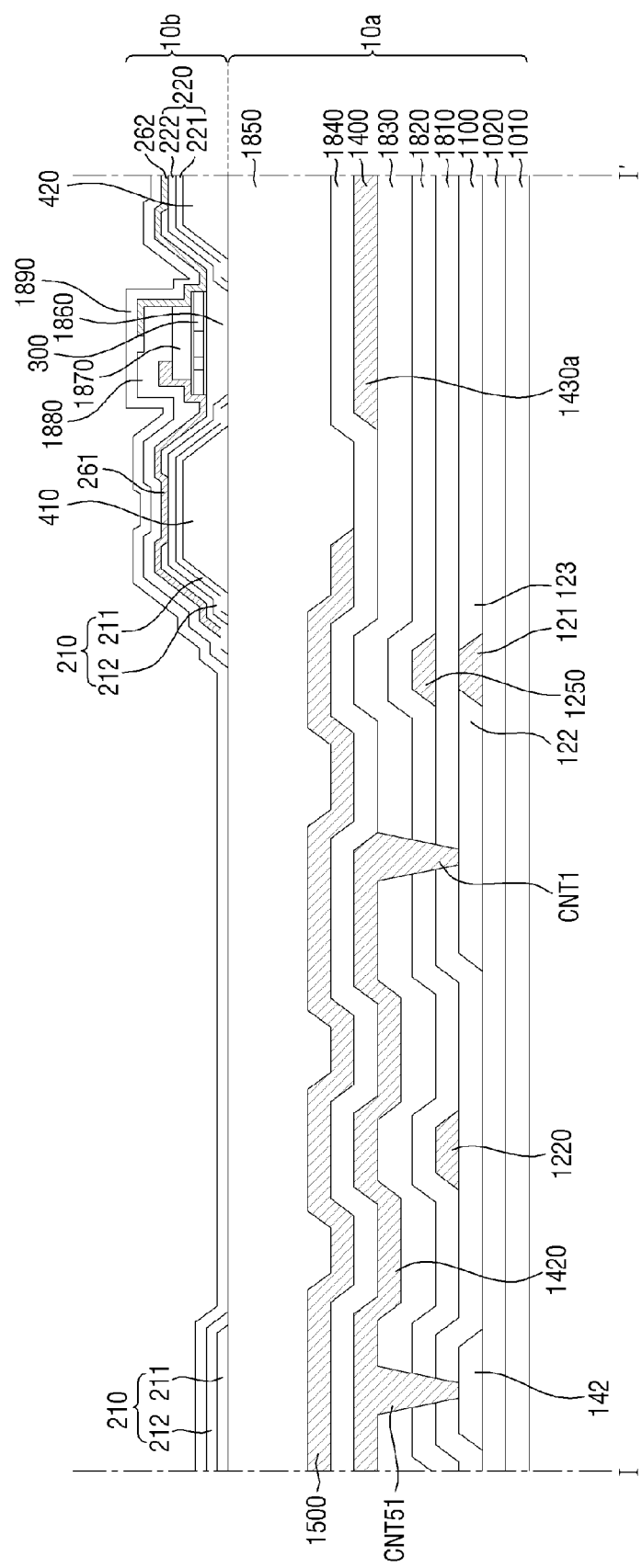
FIG. 7 is a cross-sectional view taken along the line I-I' of FIG. 5.
Figure 8:
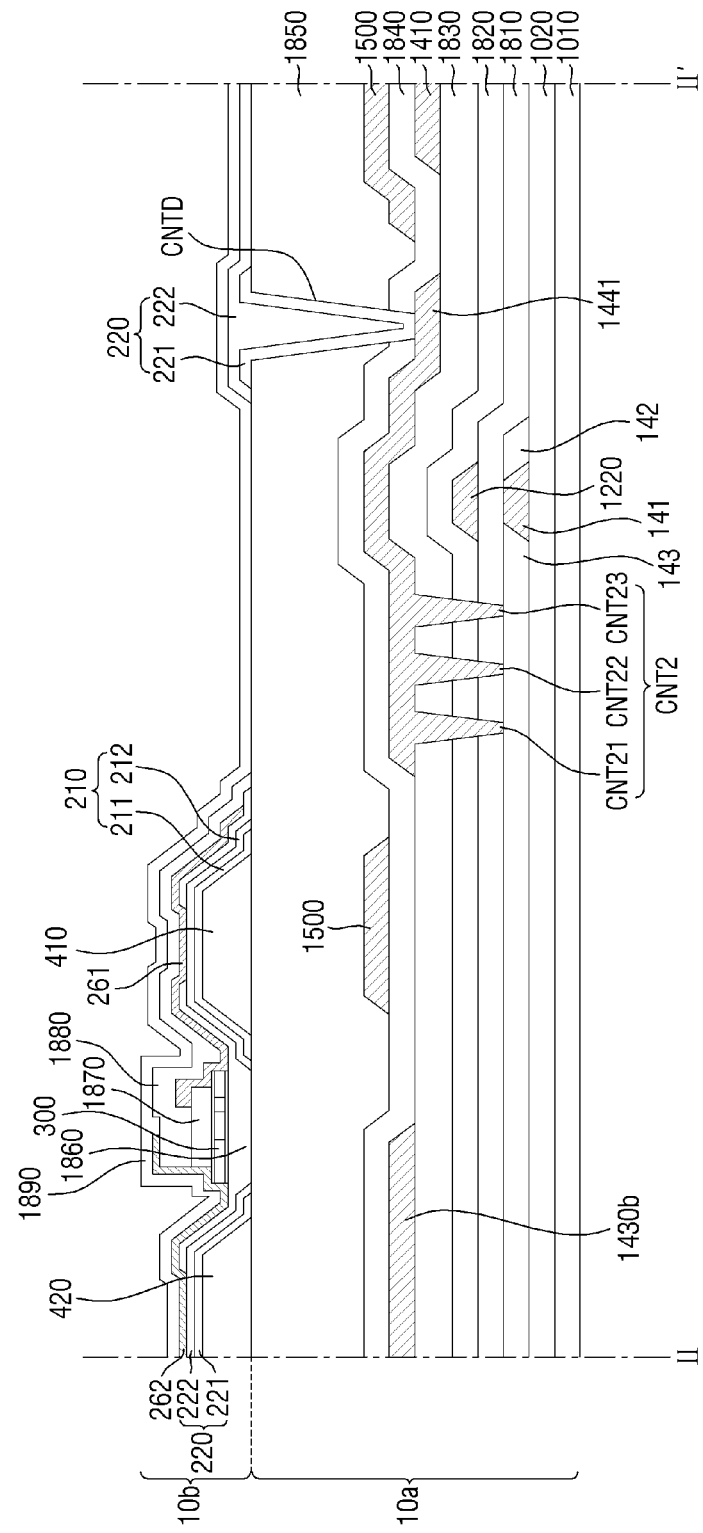
FIG. 8 is a cross-sectional view taken along the line II-II' of FIG. 5.

FIG. 6 is a diagram showing a layout of one of the pixels of FIG. 5. FIG. 7 is a cross-sectional view taken along the line I-I' of FIG. 5. FIG. 8 is a cross-sectional view taken along the line II-II' of FIG. 5.

According to an exemplary embodiment of the present disclosure, the display panel 10 may include a circuit element layer 10a and a display element layer 10b. The circuit element layer 10a may include the first to third transistors TR1 to TR3, the capacitor Cst, etc. described above with reference to FIG. 4. The display element layer 10b may include the first electrode line 210, the second electrode line 220, the light-emitting elements 300, etc. Although the layout of only one sub-pixel PXn is shown in the drawing, it is to be understood that the other sub-pixels PXn have the same layout. Hereinafter, the single sub-pixel PXn will be described.

In the following description, some of the elements have been given new reference numerals even though they are substantially identical to the elements described above with reference to FIGS. 1 to 4 in order to easily describe the arrangement and the relationship among the elements. The lines I-I' and II-II' of FIG. 6 may correspond to the lines I-I' and II-II' of FIG. 5, respectively. That is to say, the layout diagram shown in FIG. 6 can be understood to include the configuration located under the plan view of FIG. 5. Hereinafter, the plurality of elements of the display panel 10 will be described in detail with reference to FIGS. 5 to 8.

Referring to FIGS. 5-8, the circuit element layer 10a may include a substrate 1010, a buffer layer 1020, a semiconductor layer 1100, a first insulating layer 1810, a first conductive layer 1200, a second insulating layer 1820, a second conductive layer 1300, a third insulating layer 1830, a third conductive layer 1400, a fourth insulating layer 1840, a fourth conductive layer 1500, and a fifth insulating layer 1850.

The display element layer 10b may include banks 410 and 420, reflective layers 211 and 221, electrode layers 212 and 222, a sixth insulating layer 1860, a first contact electrode 261, a second contact electrode 262, a seventh insulating layer 1870, an eighth insulating layer 1880, and a passivation layer 1890. The reflective layers 211 and 221 and the electrode layers 212 and 222 may form the electrode lines 210 and 220, respectively.

Each of the layers described above may be made up of a single layer, or a stack of layers including a plurality of layers. Other layers may be further located between the layers.

Figure 9:
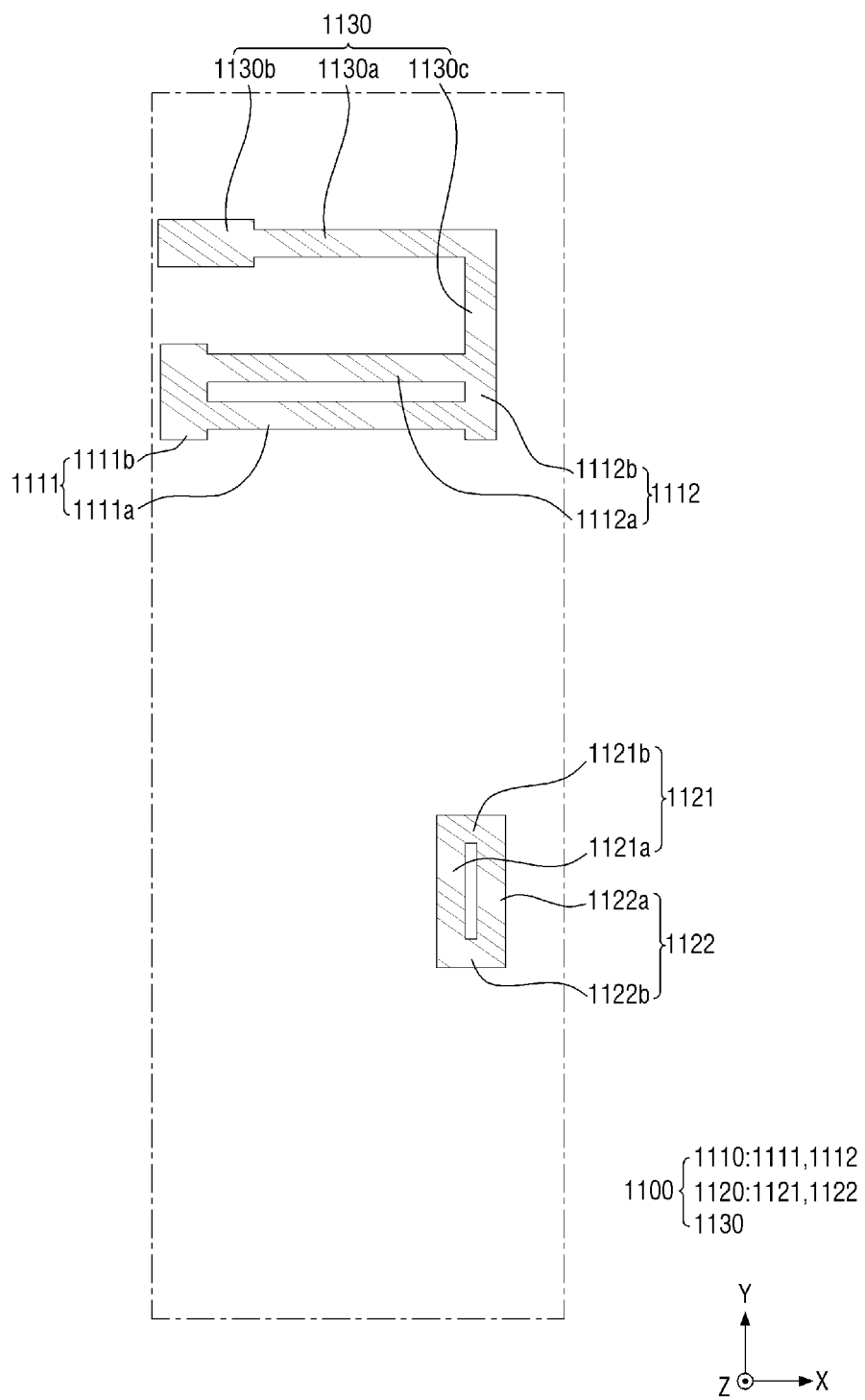
FIGS. 9 to 11 are layout diagrams showing the stacking order of the circuit element layer according to an exemplary embodiment of the present disclosure.
Figure 10:
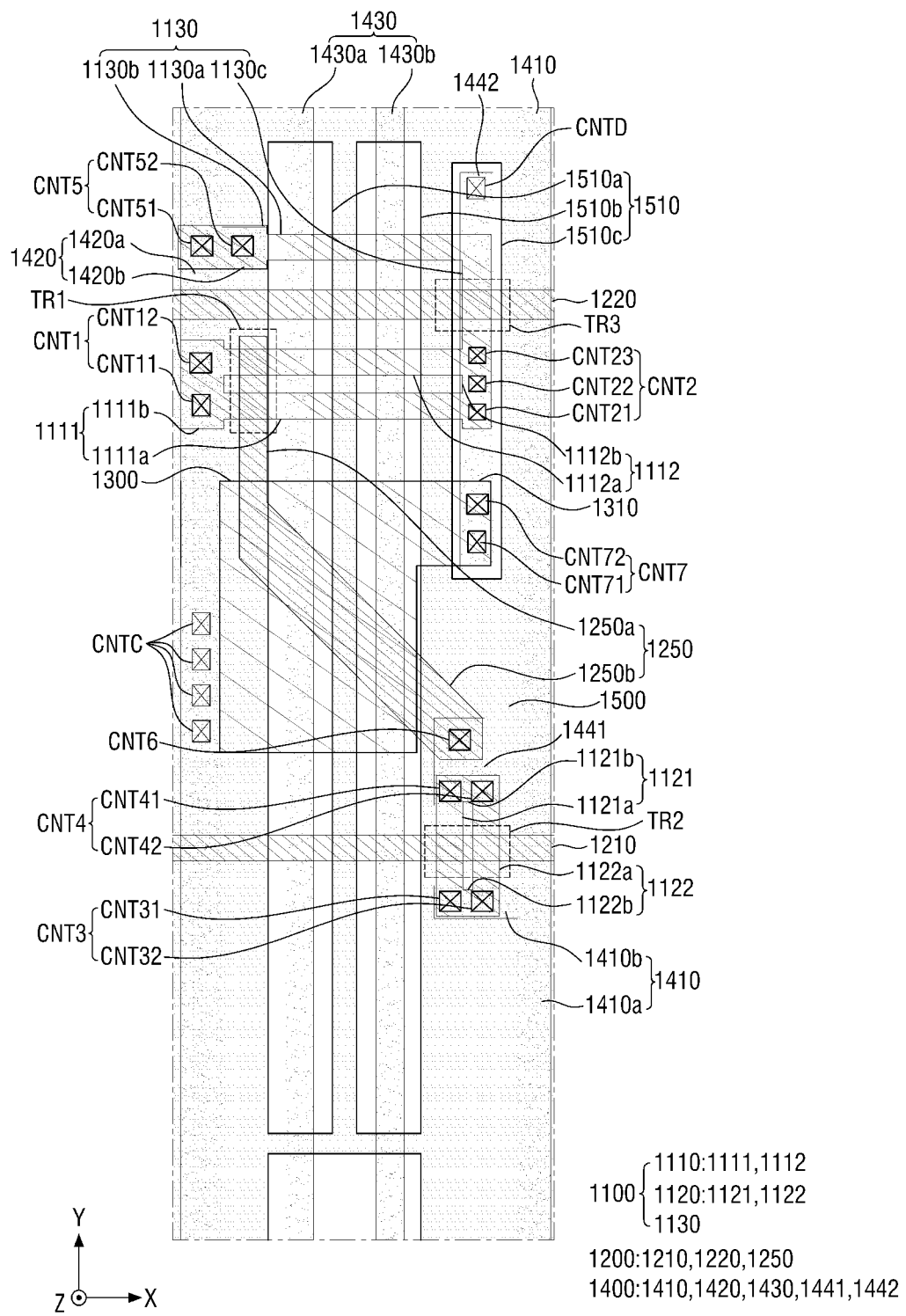
Figure 11:
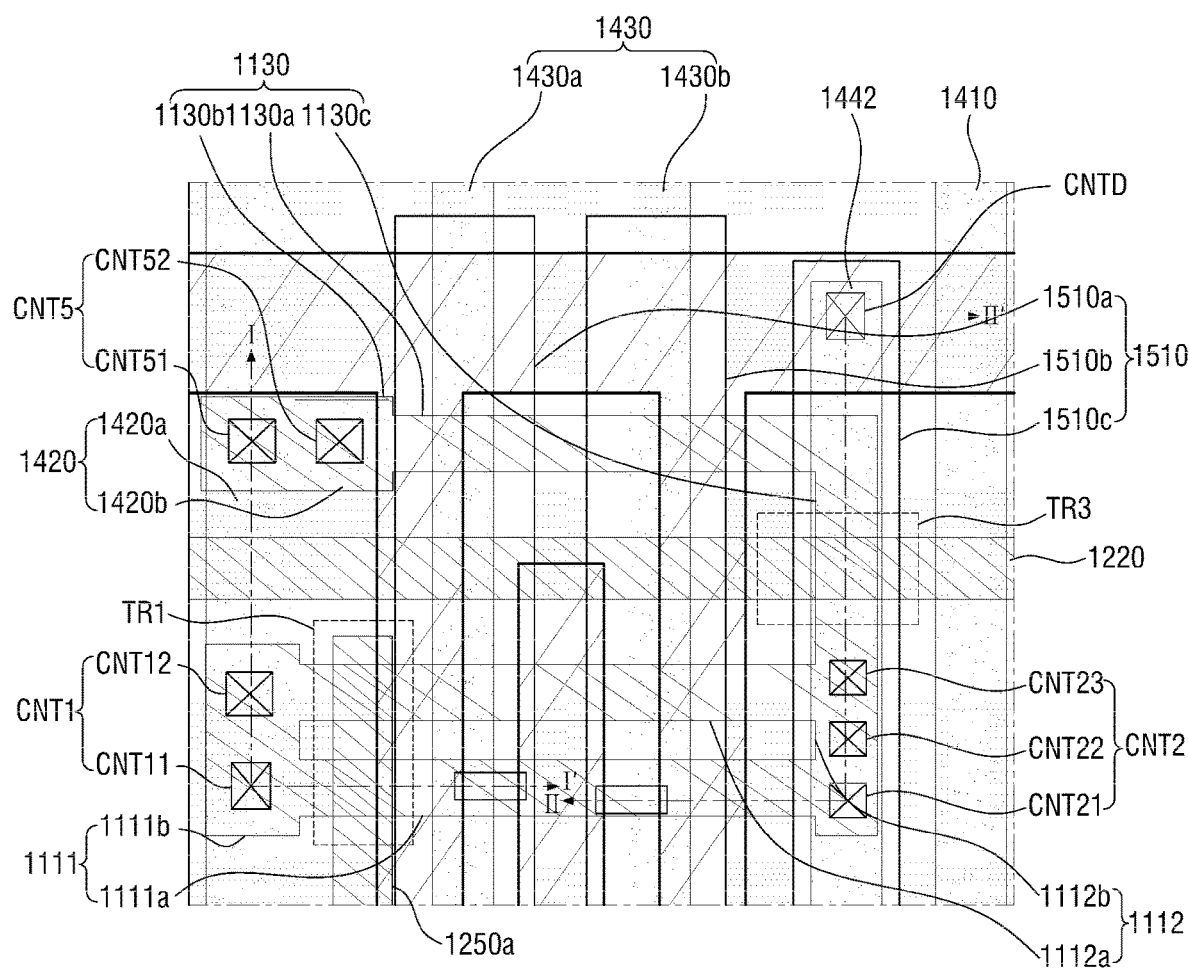

FIGS. 9-11 are layout diagrams shown in the stacking order of the circuit element layer according to an exemplary embodiment of the present disclosure.

FIG. 9 is a diagram showing a layout of the semiconductor layer 1100 of the display panel 10. FIG. 10 is a layout diagram showing the layers of the circuit element layer 10a stacked on one another, except for the fifth insulating layer 1850. FIG. 11 is an enlarged view of a portion B of FIG. 6.

Hereinafter, the circuit element layer 10a of the display panel 10 will be described with reference to FIGS. 5, 6, and 9 to 11, and then the display element layer 10b will be described with reference to FIGS. 5, 7, and 8.

Referring to FIGS. 5, 6, 10, and 11, the substrate 1010 (FIGS. 7-8) supports the layers located thereon. The substrate 1010 may be an insulating substrate made of an insulating material such as glass, quartz and a polymer resin. The substrate 1010 may be either a rigid substrate or a flexible substrate that can be bent, folded, or rolled. It is, however, to be understood that the present disclosure is not limited thereto. A buffer layer 1020 (FIGS. 7-8) may be on the substrate 1010. The buffer layer 1020 may prevent (or substantially prevent) impurity ions from diffusing, may prevent (or reduce) permeation of moisture or outside air, and may provide a flat surface.

The semiconductor layer 1100 is on the buffer layer 1020 (FIG. 7). The semiconductor layer 1100 may include a channel region, a source region and a drain region of each of the first to third transistors TR1, TR2 and TR3. The semiconductor layer 1100 may be separated from sub-pixel to sub-pixels PXn, but the present disclosure is not limited thereto. In some implementations, the sub-pixels PXn arranged in the first direction (x-axis direction) may partially share the semiconductor layer 1100.

The semiconductor layer 1100 may include a first semiconductor region 1110, a second semiconductor region 1120, and a third semiconductor region 1130. The first semiconductor region 1110 and the third semiconductor region 1130 may be located, for example, on the upper side with respect to the center of the sub-pixel PXn in the second direction (y-axis direction). The second semiconductor layer 1120 may be located on the opposite side, for example, on the lower side from the center of the sub-pixel PXn in the second direction (y-axis direction).

The first semiconductor region 1110 may include an eleventh semiconductor region 1111 and a twelfth semiconductor region 1112 at least partially spaced from each other. The eleventh and twelfth semiconductor regions 1111 and 1112 may include expanded portions 1111a and 1112a extended in the first direction (x-axis) and expanded portions 1111b and 1112b located at both ends of the expanded portions 1111a and 1112a, respectively.

The expanded portions 1111a and 1112a include an eleventh expanded portion 1111a and a twelfth expanded portion 1112a that are extended in the first direction (x-axis direction) and are spaced from each other and terminated at the boundary between the sub-pixels PXn. The eleventh expanded portion 1111a and the twelfth expanded portion 1112a may be spaced from each other in the second direction (y-axis direction) and may be located in parallel with each other.

The eleventh expanded portion 1111b and the twelfth expanded portion 1112b are located at both ends of the eleventh expanded portion 1111a and the twelfth expanded portion 1112a, respectively. Each of the expanded portions 1111b and 1112b is located so that the eleventh expanded portion 1111a and the twelfth expanded portion 1112a are connected to each other. The twelfth expanded portion 1112b of the first semiconductor region 1110 may be expanded in the second direction (y-axis direction) and may be connected to the third semiconductor region 1130 to be described or a portion thereof. The eleventh expanded portion 1111a and the twelfth expanded portion 1112a may be regions that are connected to in contact with a plurality of contact holes CNT described later.

The third semiconductor region 1130 may be located on a side in the second direction (y-axis direction) of the first semiconductor region 1110, for example, on the upper side of the first semiconductor region 1110 with respect to the center of the sub-pixel PXn. The third semiconductor region 1130 may include a third expanded portion 1130a extended in the first direction (x-axis direction) and spaced and terminated at the boundary between the sub-pixels PXn, a third expanded portion 1130b located at one end of the third expanded portion 1130a, and a third connection portion 1130c connecting the other end of the third expanded portion 1130a with the twelfth expanded portion 1112b.

The third expanded portion 1130a is located apart from the twelfth semiconductor region 1112 and is extended in the first direction (x-axis direction). The third expanded portion 1130a may be in parallel with the eleventh expanded portion 1111a and the twelfth expanded portion 1112a. The other end of the third expanded portion 1130a, i.e., the opposite end of the third expanded portion 1130b may be connected to the twelfth expanded portion 1112b.

At one end of the third expanded portion 1130a, e.g., the left end of the third expanded portion 1130a, the third expanded portion 1130b may be located. The third expanded portion 1130b may be an area that is connected to or in contact with a plurality of contact holes CNT described later.

The other end of the third expanded portion 1130a may be connected to the twelfth expanded portion 1112b of the first semiconductor region 1110 through the third connection portion 1130c extended in the second direction (y-axis direction).

The first semiconductor region 1110 and the third semiconductor region 1130 may be partially overlapped with the first conductive layer 1200. A part of the expanded portions 1111a and 1112a of the first semiconductor region 1110 and a part of the third connection portion 1130c of the third semiconductor region 1130 may overlap with the first conductive layer 1200.

The channel region of the first transistor TR1 of FIG. 4 may be formed where the first semiconductor region 1110 overlaps with the first conductive layer 1200. The channel region of the third transistor TR3 may be formed where the third semiconductor region 1130 overlaps with the first conductive layer 1200.

In addition, the first conductive layer 1200 may be overlapped with the eleventh semiconductor region 1111 as well as the twelfth semiconductor region 1112. Accordingly, the first transistor TR1 may be implemented as a dual transistor, i.e., a transistor in which two transistors are coupled. Such a dual transistor can prevent or reduce a leakage current of the first transistor T1 and the degradation of the display quality due to the leakage current. It is, however, to be understood that the present disclosure is not limited thereto.

The second semiconductor region 1120 may be located on the opposite side in the second direction (y-axis direction) with respect to the center of the sub-pixel PXn, e.g., adjacent to the right side. The second semiconductor region 1120 may include a twenty-first semiconductor region 1121 and a twenty-second semiconductor region 1122 having a region extended in the second direction (y-axis direction). The both ends of the twenty-first semiconductor region 1121 and the twenty-second semiconductor region 1122 may be connected to each other through a connection portion.

The twenty-first semiconductor region 1121 may include a twenty-first expanded portion 1121a extended in the second direction (y-axis axis direction), and the twenty-second semiconductor region 1122 may include the twenty-second expanded portion 1122a extended in the second direction (y-axis direction). The twenty-first expanded portion 1121a and the twenty-second expanded portion 1122a may be connected to each other by the twenty-first connection portion 1121b and the twenty-second connection portion 1122b located at both ends. The twenty-first connection portion 1121b and the twenty-second connection portion 1122b may be connected to or in contact with a plurality of contact holes CNT described later.

A part of the twenty-first expanded portion 1121a and the twenty-second expanded portion 1122a may overlap with the first conductive layer 1200. The channel region of the second transistor TR2 may be formed where they overlap with one another. Like the first semiconductor region 1110, in the second semiconductor region 1120, each of the twenty-first semiconductor region 1121 and the twenty-second semiconductor region 1122 may overlap with the first conductive layer 1200, and the transistor TR2 may be implemented as a dual transistor.

The shape of the second semiconductor region 1120 may be a rectangle in which the shorter sides are parallel to each other and the sides meet at the right angle as shown in the drawings. It is, however, to be understood that the present disclosure is not limited thereto.

The semiconductor layer 1100 may include polycrystalline silicon. The polycrystalline silicon may be formed by crystallizing amorphous silicon. Examples of the crystallizing techniques may include, but is not limited to, rapid thermal annealing (RTA), solid phase crystallization (SPC), excimer laser annealing (ELA), metal induced crystallization (MILC), sequential lateral solidification (SLS), etc. As another example, the semiconductor layer 1100 may include monocrystalline silicon, low-temperature polycrystalline silicon, amorphous silicon, or the like.

In the semiconductor layer 1100, impurity ions may be doped into regions connected to the source/drain electrodes of each of the first to third transistors TR1, TR2 and TR3. For example, the regions may be doped with p-type or n-type impurity ions. It is, however, to be understood that the present disclosure is not limited thereto.

The first insulating layer 1810 is located on the semiconductor layer 1100 (e.g., FIG. 7). Although not shown in the drawings, the first insulating layer 1810 may be located over the entire surface of the substrate 1010 including the semiconductor layer 1100 (FIG. 8). The first insulating layer 1810 may be a gate insulating layer.

The first insulating layer 1810 may include a silicon compound, a metal oxide, etc. For example, the first insulating layer 1810 may include silicon oxide, silicon nitride, silicon oxynitride, aluminum oxide, tantalum oxide, hafnium oxide, zirconium oxide, titanium oxide, etc. They may be used alone or in combinations. The first insulating layer 1810 may be made up of a single layer or multiple layers of different materials stacked on one another.

The first insulating layer 1810 may have a thickness of approximately 1,000 Å to 2,000 Å, or approximately 1,200 Å to 1,500 Å, and may have a thickness of approximately 1,300 Å, for example.

The first conductive layer 1200 is located on the first insulating layer 1810. The first conductive layer 1200 may include a first scan line 1210, a second scan line 1220, and a first gate electrode 1250.

The first scan line 1210 may transfer the first scan signal GW. That is to say, the first scan line 1210 may be the first scan line SLk of FIG. 4. The first scan line 1210 may be extended in the first direction (x-axis direction) and may be extended to an adjacent sub-pixel PXn beyond the boundary between the sub-pixels PXn. The first scan line 1210 may be located on the lower side of the second direction (y-axis direction) with respect to the center of the sub-pixel PXn when viewed from the top and may be positioned adjacent to the center.

The first scan line 1210 may partially overlap with the second semiconductor region 1120. As shown in FIG. 10, the first scan line 1210 may overlap with a twenty-first semiconductor region 1121 (e.g., 1121a, 1121b) and a twenty-second semiconductor region 1122 (e.g., 1122a, 1122b) of the second semiconductor region 1120. The first scan line 1210 may overlap with the second semiconductor region 1120 to form the channel region or the gate electrode of the second transistor TR2. A part of the semiconductor region located on the upper side with respect to the gate electrode of the second transistor TR2 may be the first electrode of the second transistor TR2, and a part of the semiconductor region located on the lower side may be the second electrode.

The second scan line 1220 may transmit the second scan signal GB. That is to say, the second scan line 1220 may be the second scan line SL(k+1) of FIG. 4. The second scan line 1220 may be extended in the first direction (x-axis direction) and may be extended to an adjacent sub-pixel PXn beyond the boundary between the sub-pixels PXn. The second scan line 1220 may be located on the upper side in the second direction (y-axis direction) with respect to the center of the sub-pixel PXn when viewed from the top.

The second scan line 1220 may overlap with the third semiconductor region 1130 to form the channel region of the third transistor TR3. A gate electrode 141 of the third transistor TR3 may be formed where the second scan line 1220 overlaps with the third semiconductor region 1130. A part of the semiconductor region located on the upper side with respect to the gate electrode of the third transistor TR3 may be the first electrode 142 of the third transistor TR3, and a part of the semiconductor region located on the lower side may be the second electrode 143.

The first gate electrode 1250 may be positioned between the first scan line 1210 and the second scan line 1220 when viewed from the top. The first gate electrode 1250 may include an eleventh gate electrode 1250a extended in the second direction (y-axis direction) and a twelfth gate electrode 1250b extended from the other end of the eleventh gate electrode 1250a in an inclined direction by the angle of 45° with respect to the opposite direction of the first direction (x-axis direction) and the second direction (y-axis direction).

One end of the eleventh gate electrode 1250a is terminated such that it is spaced from the second scan line 1220, and the other end thereof is extended toward the opposite side in the second direction (y-axis direction). The extended other end may be connected to the twelfth gate electrode 1250b. The eleventh gate electrode 1250a may be positioned adjacent to the left side in the first direction (x-axis direction) with respect to the center of the sub-pixel PXn. It is, however, to be understood that the present disclosure is not limited thereto.

The twelfth gate electrode 1250b is extended from the other end of the eleventh gate electrode 1250a. The extended direction may be a direction inclined at the angle of 45° with respect to the first direction (x-axis direction) and the second direction (y-axis direction), but the present disclosure is not limited thereto. The twelfth gate electrode 1250b is extended toward the lower side with respect to the center of the sub-pixel PXn and is terminated such that it is spaced from the first scan line 1210.

The first gate electrode 1250 may partially overlap with the second semiconductor region 1120. The first gate electrode 1250 may overlap with the eleventh semiconductor region 1111 and the twelfth semiconductor region 1112 of the first semiconductor region 1110. The first gate electrode 1250 may overlap with the first semiconductor region 1110 to form the channel region or the gate electrode of the first transistor TR1. A part of the semiconductor region located on the left side with respect to the gate electrode of the first transistor TR1 may be the first electrode 122 of the first transistor TR1, and a part of the semiconductor region located on the right side may be the second electrode 123.

The first conductive layer 1200 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 1200 may be made up of a single layer or multiple layers.

The second insulating layer 1820 is located on the first conductive layer 1200. The second insulating layer 1820 may be on the entire surface of the substrate 1010 including the first conductive layer 1200. The second insulating layer 1820 may be an interlayer dielectric layer that serves to insulate the first conductive layer 1200 from the second conductive layer 1300 described later.

The second insulating layer 1820 may include an inorganic insulating material such as silicon oxide, silicon nitride, silicon oxynitride, hafnium oxide, aluminum oxide, titanium oxide, tantalum oxide and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin and benzocyclobutene (BCB). The second insulating layer 1820 may be made up of a single layer or multiple layers of different materials stacked on one another.

The second insulating layer 1820 may have a thickness of 1,500 Å to 3,000 Å, or 2,000 Å to 2,500 Å.

The second conductive layer 1300 (as shown in FIG. 6) is on the second insulating layer 1820. The second conductive layer 1300 may form the first electrode of the capacitor Cst.

The second conductive layer 1300 may be located at the center of the sub-pixel PXn. The second conductive layer may be located between the first scan line 1210 and the second scan line 1220 adjacent to the center of the sub-pixel PXn and may overlap with the first gate electrode 1250. The second conductive layer 1300 may overlap with the first gate electrode 1250 with the second insulating layer 1820 therebetween. The first gate electrode 1250 may form the second electrode of the capacitor Cst, and the second insulating layer 1820 may be the dielectric of the capacitor Cst.

Each of the shorter sides of the second conductive layer 1300 may be extended in the first direction (x-axis direction) and the second direction (y-axis direction) when viewed from the top. That is to say, the second conductive layer 1300 may have a substantially rectangular shape. It is, however, to be understood that the present disclosure is not limited thereto.

The second conductive layer 1300 may include a protrusion 1310 that protrudes in the first direction (x-axis direction) from one of the shorter sides. The protrusion 1310 may protrude from one of the shorter sides of the second conductive layer 1300 of the capacitor Cst, e.g., from the left shorter side in the first direction (x-axis direction). The protrusion 1310 may be electrically connected to the third conductive layer 1400 described later.

The second conductive layer 1300 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 1300 may be made up of a single layer or multiple layers. For example, the second conductive layer 1300 may have a stack structure of Ti/Al/Ti, Mo/Al/Mo, Mo/AlGe/Mo, and Ti/Cu.

The third insulating layer 1830 is on the second conductive layer 1300. The third insulating layer 1830 may be on the entire surface of the substrate 1010 including the second conductive layer 1300. The third insulating layer 1830 may be an interlayer dielectric layer that serves to insulate the second conductive layer 1300 from the third conductive layer 1400 described later.

The third insulating layer 1830 may include a silicon compound, a metal oxide, etc. For example, the third insulating layer 1830 may include silicon oxide, silicon nitride, silicon oxynitride, aluminum oxide, tantalum oxide, hafnium oxide, zirconium oxide, titanium oxide, etc. They may be used alone or in combinations. The third insulating layer 1830 may be made up of a single layer or multiple layers of different materials stacked on one another.

The third insulating layer 1830 may have a thickness of approximately 5,000 Å to 7000 Å, or approximately 6,000 Å to 6,500 Å, and may have a thickness of approximately 5,000 Å, for example.

The third insulating layer 1830 may include a plurality of contact holes CNT (e.g., CNT 11, CNT 51, etc.). The contact holes CNT may electrically connect the third conductive layer 1400 with the semiconductor layer 1100, the first conductive layer 1200 and the second conductive layer 1300. A detailed description thereof will be given later with the third conductive layer 1400.

The third conductive layer 1400 is located on the third insulating layer 1830. The third conductive layer 1400 may include a data line 1410, a first voltage line 1420, a second voltage line 1430, and a plurality of conductive patterns 1440.

The data line 1410 may transmit the data signal DATA. That is to say, the data line 1410 may be the data line DLj of FIG. 4. The data line 1410 is located on one side with respect to the center of the sub pixel PXn in the first direction (x-axis direction), e.g., the right side, and is extended in the second direction (y-axis direction). The data line 1410 may be extended from a sub-pixel PXn to an adjacent sub-pixel PXn in the second direction (y-axis direction).

The data line 1410 may include a stem 1410a extended in the second direction (y-axis direction), and a branch 1410b protruding from the stem 1410a in the first direction (x-axis direction). A plurality of sub-pixels PXn adjacent to one another in the second direction (y-axis direction) may share the stem 1410a of the data line 1410, and the branch 1410b may branch off in each of the sub-pixels PXn.

The branch 1410b of the data line 1410 may overlap with a part of the second semiconductor region 1120, e.g., the twenty-second connection portion 1122b. A third contact hole CNT3 is formed in the third insulating layer 1830 where the branch 1410b overlaps with the twenty-second connection portion 1122b, which is formed through the first insulating layer 1810, the second insulating layer 1820, and the third insulating layer 1830, to expose a part of the twenty-second connection portion 1122b. The branch 1410b of the data line 1410 may be connected to or in contact with a part of the second semiconductor region 1120, e.g., the twenty-second connection portion 1122b through the third contact hole CNT3.

The third contact holes CNT3 include a thirty-first contact hole CNT31 and a thirty-second contact hole CNT32. The branch 1410b of the data line 1410 may be connected to the twenty-first semiconductor region 1121 and the twenty-second semiconductor region 1122 through the third contact hole CNT3 and the twenty-second semiconductor region 1122. Accordingly, the second transistor TR2 may form a dual transistor and may be electrically connected to the data line 1410.

The first voltage line 1420 may transmit the first voltage QVDD or an alignment signal. That is to say, the first voltage line 1420 may be the first voltage line QVDDL of FIG. 4. The first voltage line 1420 is on the other side with respect to the center of the sub-pixel PXn in the first direction (x-axis direction), e.g., on the left side and is extended in the second direction (y-axis direction). The first voltage line 1420 may be extended from a sub-pixel PXn to an adjacent sub-pixel PXn in the second direction (y-axis direction).

The first voltage line 1420 may include a stem line 1420a extended in the second direction (y-axis direction), and a branch line 1410b protruding from the stem line 1420a in the first direction (x-axis direction). The sub-pixels PXn adjacent to one another in the second direction (y-axis direction) may share the stem line 1420a of the first voltage line 1420, and the branch line 1410b may branch off in each of the sub-pixels PXn.

The stem line 1420a of the first voltage line 1420 may partially overlap with the first semiconductor region 1110, the third semiconductor region 1130 and the second conductive layer 1300.

The stem line 1420a of the first voltage line 1420 may overlap with the eleventh expanded portion 1111b of the first semiconductor region 1110. A first contact hole CNT1 is formed in the third insulating layer 1830 where the stem line 1420a overlaps with the eleventh expanded portion 1111b, which is formed through the first to third insulating layers 1810, 1820, and 1830, to expose a part of the eleventh expanded portion 1111b. The stem line 1420a of the first voltage line 1420 may be connected to or in contact with the eleventh expanded portion 1111b through the first contact hole CNT1.

The first contact hole CNT1 may include the eleventh contact hole CNT11 and the twelfth contact hole CNT12, and the stem line 1420a of the first voltage line 1420 may be connected to the first semiconductor region 1110 through the first contact hole CNT1 and the eleventh expanded portion 1111b.

The stem line 1420a of the first voltage line 1420 may overlap with the protrusion 1310 of the capacitor Cst. A seventh contact hole CNT7 is formed in the third insulating layer 1830 where the stem line 1420a overlaps with the protrusion 1310 which is formed through the third insulating layer 1830 to expose a part of the protrusion 1310. The stem line 1420a of the first voltage line 1420 may be connected to or in contact with the second conductive layer 1300 through the seventh contact hole CNT7.

The seventh contact hole CNT7 may include a seventy-first contact hole CNT71 and a seventy-second contact hole CNT72, and the stem line 1420a of the first voltage line 1420 may be electrically connected to the second conductive layer 1300 through the seventy-first contact hole CNT71 and the seventy-second contact hole CNT72.

The stem line 1420a and branch line 1420b of the first voltage line 1420 may overlap with the third semiconductor region 1130.

The stem line 1420a and the branch line 1420b of the first voltage line 1420 may overlap with the third expanded portion 1130b of the third semiconductor region 1130. A fifth contact hole CNT5 is formed in the third insulating layer 1830 where the stem line 1420a and the branch line 1420b overlaps with the third expanded portion 1130b, which is formed through the first to third insulating layers 1810, 1820, and 1830 to expose a part of the third expanded portion 1130b. The stem line 1420a and the branch line 1420b of the first voltage line 1420 may be connected to or in contact with the third expanded portion 1130b of the third semiconductor region 1130 through the fifth contact hole CNT5.

The fifth contact hole CNT5 includes a fifty-first contact hole CNT51 and a fifty-two contact hole CNT52. The stem line 1420a of the first voltage line 1420 may be connected to one side of the third expanded portion 1130b of the third semiconductor region 1130 through the fifty-first contact hole CNT51. The branch line 1420b may be connected to the other side of the third expanded portion 1130b through the fifty-second contact hole CNT52. Accordingly, the first voltage line 1420 may be electrically connected to the third semiconductor region 1130.

The first voltage QVDD may be supplied to the first voltage line 1420. That is to say, the first voltage line 1420 may be the first voltage line QVDDL of FIG. 4. The first voltage line 1420 may be connected to the fourth conductive layer 1500 to be described later through a contact hole. The fourth conductive layer 1500 may mitigate or prevent the voltage drop of the first voltage QVDD applied to the first voltage line 1420.

The second voltage line 1430 may transmit the second voltage QVSS or an AC voltage. That is to say, the second voltage line 1430 may be the second voltage line QVSSL of FIG. 4. The second voltage line 1430 may be located at the center of the sub-pixel PXn and may be extended in the second direction (y-axis direction). The second voltage line 1430 is also extended to a plurality of sub-pixels PXn adjacent to one another in the second direction (y-axis direction), like the first voltage line 1420. The plurality of sub-pixels PXn may share the second voltage line 1430.

The second voltage line 1430 may include a plurality of lines. As shown in the drawings, the second voltage line 1430 includes a twenty-first voltage line 1430a and a twenty-second voltage line 1430b, such that two lines may be located in a single sub-pixel PXn. It is, however, to be understood that the present disclosure is not limited thereto. In some implementations, the second voltage line 1430 may include only one line.

The second voltage line 1430 may be extended in the second direction (y-axis direction) from the center of the sub-pixel PXn and may overlap with the first semiconductor region 1110, the third semiconductor region 1130, the first scan line 1210, the second scan line 1220, and the first gate electrode 1250. It is to be noted that the second voltage line 1430 is not directly connected to the plurality of overlapping elements, and no contact hole is formed in the region where it overlaps with them.

Although not shown in the drawing, the second voltage line 1430 may be electrically connected to the second electrode line 220 of the display element layer 10b. The second voltage QVSS supplied to the second voltage line 1430 may be transmitted to the light-emitting elements 300 through the second electrode line 220. As described above, unlike the first electrode line 210, for the second electrode line 220, a plurality of pixels PX or the sub-pixels PXn may be connected to the second voltage line 1430 through a single electrode contact hole in the non-display area NDA.

The conductive patterns 1440 may be located between the twenty-second voltage line 1430b and the data line 1410. The conductive patterns 1440 may include a first conductive pattern 1441 and a second conductive pattern 1442.

The first conductive pattern 1441 may be located on the lower side with respect to the center of the sub-pixel PXn between the data line 1410 and the twenty-second voltage line 1430b, and may partially overlap with the twenty-first connection portion 1121b of the second semiconductor region 1120 and the other side of the first gate electrode 1250. A fourth contact hole CNT4 is formed in the third insulating layer 1830 where the first conductive pattern 1441 overlaps with the twenty-first connection portion 1121b, which is formed through the first to third insulating layers 1810, 1820, and 1830 to expose a part of the twenty-first connection portion 1121b.

The fourth contact holes CNT4 may include a forty-first contact hole CNT41 and a forty-second contact hole CNT42. The first conductive pattern 1441 may be connected to the second semiconductor region 1120 through the fourth contact holes CNT4.

The first conductive pattern 1441 may be connected to or in contact with the twenty-first connection portion 1121b of the second semiconductor region 1120 through the fourth contact holes CNT4. Similarly, a sixth contact hole CNT6 is formed where the first conductive pattern 1441 overlaps with the first gate electrode 1250, which is formed through the second and third insulating layers 1820 and 1830 to expose a part of the first gate electrode 1250. The first conductive pattern 1441 may be connected to or in contact with the first gate electrode 1250 through the sixth contact hole CNT6. Accordingly, the first conductive pattern 1441 may be electrically connected to the gate electrode of the first transistor TR1 and the drain electrode of the second transistor TR2.

The second conductive pattern 1442 may be located on the upper side with respect to the center of the sub-pixel PXn between the data line 1410 and the twenty-second voltage line 1430b, and may partially overlap with the twelfth expanded portion 1112b of the first semiconductor region 1110 and the third connection portion 1130c of the third semiconductor region 1130. A second contact hole CNT2 is formed where the second conductive pattern 1442 overlaps with the twelfth expanded portion 1112b and the third connection portion 1130c, which is formed through the first to third insulating layers 1810, 1820, and 1830 to expose a part of the twelfth expanded portion 1112b and the third connection portion 1130c The second contact holes CNT2 include a twenty-first contact hole CNT21, a twenty-second contact hole CNT22, and a twenty-third contact hole CNT23. The second conductive pattern 1442 may be electrically connected to the first semiconductor region 1110 and the third semiconductor region 1130 through the twenty-first contact hole CNT21, the twenty-second contact hole CNT22, and the twenty-third contact hole CNT23.

In addition, the second conductive pattern 1442 may be connected to the electrode contact hole CNTD of the display element layer 10b described later. The electrode contact hole CNTD is formed where the second conductive pattern 1442 overlaps with the first electrode line 210, which is formed through the fourth and the fifth insulating layers 1840 and 1850. The first electrode line 210 of the display element layer 10b may be connected to the second conductive pattern 1442 through the electrode contact hole CNTD.

The first electrode line 210 of the display element layer 10b may be electrically connected to the first semiconductor region 1110 and the third semiconductor region 1130, i.e., the first transistor TR1 and the third transistor TR3 through the second conductive pattern 1442. The first electrode line 210 may receive a driving voltage for driving the light-emitting elements 300 or an alignment signal for aligning them.

FIG. 11 is an enlarged view of portion A of FIG. 6.

Referring to FIGS. 4, 6, and 11, the first semiconductor region 1110 partially overlaps with the first gate electrode 1250 to form the first transistor TR1, as described above. The first semiconductor region 1110 is connected to the first voltage line 1420 through the first contact hole CNT1 so that the first transistor TR1 can be connected to the first voltage line QVDDL.

The third semiconductor region 1130 partially overlaps with the second scan line 1220 to form the third transistor TR3. The third semiconductor region 1130 is connected to the first voltage line 1420 through the fifth contact hole CNT5 so that the third transistor TR3 can be connected to the first voltage line QVDDL.

The twelfth expanded portion 1112*b* and the third connection portion 1130*c* to which the first semiconductor region 1110 and the third semiconductor region 1130 are connected to, where third semiconductor region 1130 is further connected to the second conductive pattern 1442 through the second contact hole CNT2, such that the first transistor TR1 and the third transistor TR3 may be connected to the first electrode line 210 through the first node N1.

The first transistor TR1 connected to the first electrode line 210 may transmit a driving voltage to the first electrode line 210 when the display device 1 is driven. Specifically, the second transistor TR2 may be turned on in response to the first scan signal GW applied through the first scan line 1210 and may transfer the data signal DATA transmitted through the data line 1410 to the gate electrode 121 of the first transistor TR1.

The first transistor TR1 is turned on in response to the data signal DATA transmitted to the gate electrode 121, and the driving voltage transmitted through the first voltage line 1420 may be transmitted to the node N1 through the first transistor TR1. The driving voltage may be transmitted to the light-emitting elements 300 through the first node N1, the third node N3 and the first electrode line 210 so that the light-emitting elements 300 can emit the predetermined light.

On the other hand, the third transistor TR3 connected to the first electrode line 210 may transmit an alignment signal or a ground voltage to the first electrode line 210 during the process of fabricating the display device 1. Specifically, the third transistor TR3 is turned on in response to the second scan signal GB applied through the second scan line 1220. The ground voltage transmitted through the first voltage line 1420 may be transmitted to the first node N1 through the third transistor TR3 and may be transmitted to the first electrode line 210 through the third node N3. During the process of fabricating the display device 1, the AC voltage is applied to the second electrode line 220 and the ground voltage is transmitted to the first electrode line 210 through the second voltage line 1430 or the second voltage line QVSSL. Accordingly, a capacitance according to the AC voltage is formed between the first electrode line 210 and the second electrode line 220, and the light-emitting elements 300 can be aligned by the dielectrophoretic force.

The third conductive layer 1400 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 1400 may be made up of a single layer or multiple layers. For example, the third conductive layer 1400 may have a stack structure of Ti/Al/Ti, Mo/Al/Mo, Mo/AlGe/Mo, and Ti/Cu.

Referring back to FIG. 11, the fourth insulating layer 1840 (as shown in FIG. 8) is on the third conductive layer 1400. The fourth insulating layer 1840 may be on the entire surface of the substrate 1010 including the third conductive layer 1400 (as shown in FIGS. 7 and 8). The fourth insulating layer 1840 may be an interlayer dielectric layer that serves to insulate the third conductive layer 1400 from the fourth conductive layer 1500 described later.

The fourth insulating layer 1840 may include a silicon compound, a metal oxide, etc. For example, the fourth insulating layer 1840 may include silicon oxide, silicon nitride, silicon oxynitride, aluminum oxide, tantalum oxide, hafnium oxide, zirconium oxide, titanium oxide, etc. They may be used alone or in combinations. The fourth insulating layer 1840 may be made up of a single layer or multiple layers of different materials stacked on one another.

The fourth insulating layer 1840 may have a thickness of approximately 5,000 Å to 7000 Å, or approximately 6,000 Å to 6,500 Å, and may have a thickness of approximately 5,000 Å, for example.

The fourth conductive layer 1500 is located on the fourth insulating layer 1840 (as shown in FIG. 8). The fourth conductive layer 1500 may cover most of the substrate 1010 on the fourth insulating layer 1840. The fourth conductive layer 1500 may be patterned so that it does not partially overlap with the second voltage line 1430 and the second conductive pattern 1442. That is to say, the fourth conductive layer 1500 may be formed on the entire surface of the substrate 1010, and opening patterns 1510 that are not overlapped with the second voltage line 1430 and the second conductive pattern 1442 may be formed.

The opening patterns 1510 may include a first opening pattern 1510*a*, a second opening pattern 1510*b*, and a third opening pattern 1510*c*. The first opening pattern 1510*a* and the second opening pattern 1510*b* may be extended in the second direction (y-axis direction) in a single sub-pixel PXn and may overlap with the second voltage line 1430. The first opening pattern 1510*a* overlaps with a part of the twenty-first voltage line 1430*a*, and the second opening pattern 1510*b* overlaps with a part of the twenty-second voltage line 1430*b*. The first opening pattern 1510*a* and the second opening pattern 1510*b* may be spaced from each other in the first direction (x-axis direction).

The third opening pattern 1510*c* overlaps with the second conductive pattern 1442. That is to say, the fourth conductive layer 1500 includes the third opening pattern 1510*c* so that the second conductive pattern 1442 is exposed.

Each of the opening patterns 1510 may be apart from another opening pattern 1510 in an adjacent sub-pixel PXn in the second direction (y-axis direction). That is to say, the opening patterns 1510 are extended in the second direction (y-axis direction), and are terminated near the boundaries between the sub-pixels PXn. The fourth conductive layer 1500 may be connected to the area where the opening patterns 1510 are terminated and are spaced from the opening pattern 1510 in another sub-pixel PXn.

A plurality of conductive contact holes CNTC may be formed where the fourth conductive layer 1500 overlaps with a part of the first voltage line 1420, e.g., the stem 1420*a*, which is formed through the fourth insulating layer 1840 to expose a part of the stem 1420*a*. The fourth conductive layer 1500 may be connected to or in contact with the first voltage line 1420 through the conductive contact hole CNTC.

The first voltage line 1420 receiving the first voltage QVDD may be electrically connected to the fourth conductive layer 1500 to mitigate or prevent (or reduce) the voltage drop of the first voltage QVDD. It is to be understood that the fourth conductive layer 1500 may be eliminated in some implementations. Accordingly, the fifth insulating layer 1850 described later may be formed integrally with the fourth insulating layer 1840. However, the materials are not limited thereto.

The fifth insulating layer 1850 is on the fourth conductive layer 1500 (as shown in FIG. 8). The fifth insulating layer 1850 may be on the entire surface of the substrate 1010 including the fourth conductive layer 1500. The fifth insulating layer 1850 may insulate the fourth conductive layer 1500 from the light-emitting elements 300 of the display element layer 10b. Unlike the other insulating layers, the fifth insulating layer 1850 may have a relatively large thickness and the upper surface may be substantially flat. The fifth insulating layer 1850 may be a via layer for insulating the circuit element layer 10a from the display element layer 10b.

The fifth insulating layer 1850 may include an organic insulating material such as a polyacrylic resin and a polyimide resin. The fifth insulating layer 1850 may have a thickness of 15,000 Å to 25,000 Å, or 15,000 Å to 20,000 Å. It is, however, to be understood that the present disclosure is not limited thereto.

Hereinafter, the display element layer 10b will be described with reference to FIGS. 5, 7 and 8.

A plurality of banks 410 and 420 may be on the fifth insulating layer 1850. The banks 410 and 420 are spaced from each other and opposed to each other in each of the sub-pixels PXn. The first and second electrode lines 210 and 220 may be on the banks 410 and 420, respectively. The number of banks 410 or 420 is not limited thereto.

FIGS. 7 and 8 show only a part of the first bank 410 and the second bank 420 among the three banks arranged in each of the sub-pixels PXn of FIG. 5. A cross-sectional view taken along line I-I' of FIG. 5 is shown in FIG. 7. FIG. 7 shows a part of the first bank 410 and the second bank 420. A cross-sectional view taken along line II-II' of FIG. 5 is shown in FIG. 8. FIG. 8 shows a part of the second bank 420 and another first bank 410.

The plurality of banks 410 and 420 may be made of substantially the same material via a single process. In such case, the banks 410 and 420 may form a single lattice pattern. The banks 410 and 420 may include polyimide (PI).

The reflective layers 211 and 221 may be on the banks 410 and 420 to reflect incident light. The light traveling toward the reflective layers 211 and 221 from the light-emitting elements 300 may be reflected off them and transmitted toward the outside of the display device 1, for example, above the banks 410 and 420.

The first reflective layer 211 covers the first bank 410, and a part of the first reflective layer 211 is connected to the second conductive pattern 1442 through an electrode contact hole CNTD passing through the fifth insulating layer 1850. That is to say, the first reflective layer 211 is electrically connected to the first transistor TR1 and the third transistor TR3 through the second conductive pattern 1442. The second reflective layer 221 covers the second bank 420. Although not shown in the drawings, the second reflective layer 221 may be electrically connected to the second voltage line 1430 or the second voltage line QVSSL through another electrode contact hole.

The reflective layers 211 and 221 may include a material having a high reflectivity to reflect light emitted from the light-emitting elements 300. For example, the reflective layers 211 and 221 may include, but is not limited to, materials such as silver (Ag) and copper (Cu).

The first electrode layer 212 and the second electrode layer 222 may be on the first reflective layer 211 and the second reflective layer 221, respectively.

The first electrode layer 212 is directly on the first reflective layer 211. The first electrode layer 212 may have substantially the same pattern as the first reflective layer 211. The second electrode layer 222 is directly on the second reflective layer 221 and is spaced from the first electrode layer 212. The second electrode layer 222 may have substantially the same pattern as the second reflective layer 221.

The electrode layers 212 and 222 may include a transparent conductive material. For example, the electrode layers 212 and 222 may include, but is not limited to, a material such as indium tin oxide (ITO), indium zinc oxide (IZO) and indium tin zinc oxide (ITZO). In some exemplary embodiments, each of the reflective layers 211 and 221 and the electrode layers 212 and 222 may have a structure in which at least one transparent conductive layer such as ITO, IZO and ITZO and at least one metal layer such as silver and copper are stacked on one another. For example, the reflective layers 211 and 221 and the electrode layers 212 and 222 may form a stack structure of ITO/silver (Ag)/ITO.

The first reflective layer 211 and the first electrode layer 212 on the first bank 410 may form the first electrode line 210, and the second reflective layer 221 and the second electrode 222 on the second bank 420 may form the second electrode line 220.

The sixth insulating layer 1860 is on the first electrode line 210 and the second electrode line 220 to partially cover them. The sixth insulating layer 1860 may cover the most of the upper surface of each of the first electrode line 210 and the second electrode line 220 and may expose a part of each of the first electrode line 210 and the second electrode line 220.

The light-emitting elements 300 are on the sixth insulating layer 1860. The both side surfaces of the sixth insulating layer 1860 are in contact with the electrode lines 210 and 220, respectively, to electrically insulate them from each other. Accordingly, the sixth insulating layer 1860 may protect the regions that overlaps with the electrode lines 210 and 220 and electrically insulates them from each other. In addition, the sixth insulating layer 1860 can prevent (substantially prevent) the first conductivity-type semiconductor 310 and the second conductivity-type semiconductor 320 of the light-emitting elements 300 from being in contact with other substrates, so that damage to the light-emitting elements 300 can be avoided.

At least one light-emitting element 300 may be between the first electrode line 210 and the second electrode line 220. Although only one light-emitting element 300 is between the first electrode line 210 and the second electrode line 220 in the cross-sectional view, it is to be understood that more than one light-emitting element 300 may be located as shown in FIG. 5.

Figure 20:
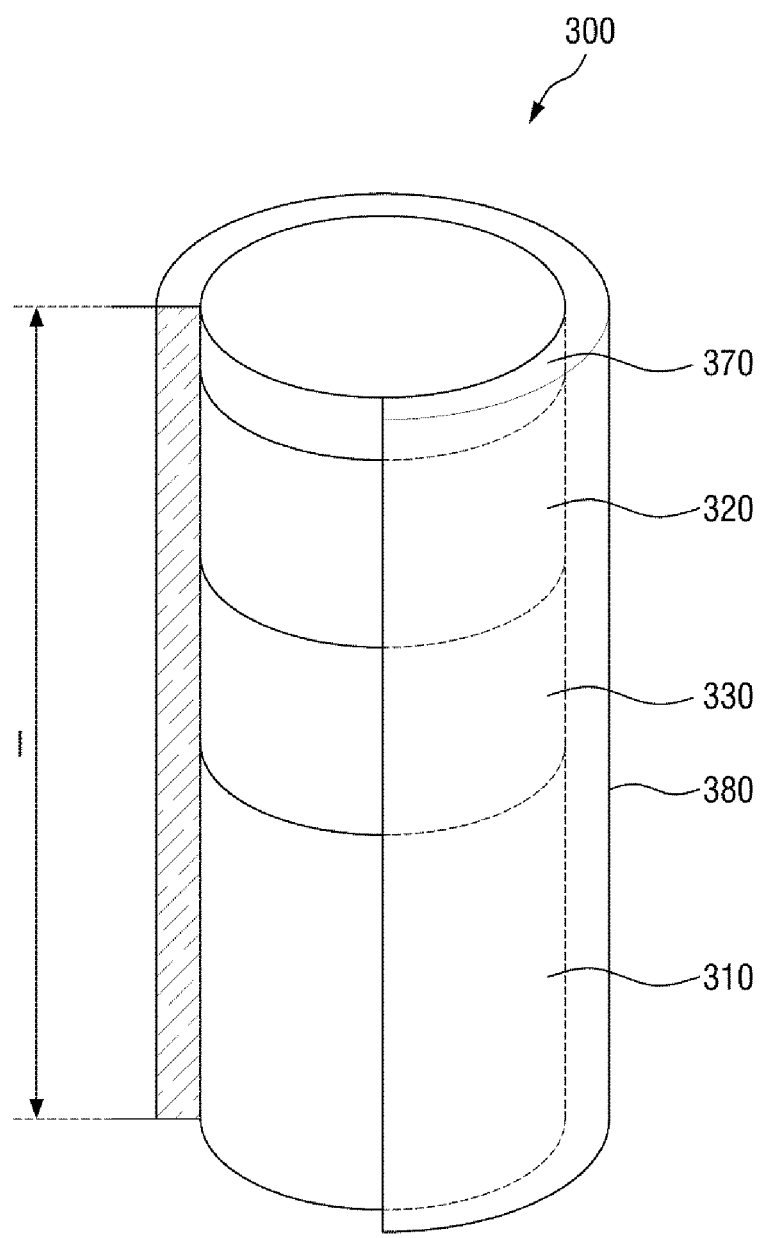
FIG. 20 is a diagram showing a light-emitting element according to an exemplary embodiment of the present disclosure.

In the light-emitting element 300, the first conductivity-type semiconductor 310 (as shown in FIG. 20), an active layer 330 (as shown in FIG. 20), the second conductivity-type semiconductor 320 (as shown in FIG. 20) and an electrode material layer 370 (as shown in FIG. 20) may be arranged in the direction parallel to the fifth insulating layer 1850. In other words, the plurality of layers of the light-emitting element 300 may be arranged in the direction parallel to the fifth insulating layer 1850. It is, however, to be understood that the present disclosure is not limited thereto. The light-emitting element 300 may be located between the first electrode line 210 and the second electrode line 220 such that the above-described elements are arranged in the opposite order.

The seventh insulating layer 1870 may be located such that it overlaps with at least a part of the light-emitting element 300. The seventh insulating layer 1870 can protect the light-emitting element 300 and may fix the light-emitting element 300 between the first electrode line 210 and the second electrode line 220.

The seventh insulating layer 1870 is located such that both side surfaces of the light-emitting element 300 are exposed. By doing so, the contact electrodes 261 and 262, which will be described later, can be easily brought into contact with both ends on the sides of the light-emitting element 300. It is, however, to be understood that the present disclosure is not limited thereto. The length of the seventh insulating layer 1870 may be equal to the length of the light-emitting element 300 so that their side surfaces may be aligned with each other, respectively.

The first contact electrode 261 and the second contact electrode 262 may be on the seventh insulating layer 1870.

The first contact electrode 261 and the second contact electrode 262 may be on the upper surfaces of the first electrode line 210 and the second electrode line 220, respectively. Specifically, the first contact electrode 261 and the second contact electrode 262 may be in contact with the first electrode layer 212 and the second electrode layer 222, respectively, in the area where the sixth insulating layer 1860 is patterned so that a part of the first electrode line 210 and the second electrode line 220 is exposed. In addition, the first contact electrode 261 and the second contact electrode 262 may be in contact with the side surfaces on both ends of the light-emitting element 300, e.g., the first conductivity-type semiconductor 310 and the second conductivity-type semiconductor 320 or the electrode material layer 370, respectively.

The contact electrodes 261 and 262 may include a conductive material. For example, the contact electrodes may include ITO, IZO, ITZO, aluminum (Al), etc. It is, however, to be understood that the present disclosure is not limited thereto.

The eighth insulating layer 1880 may be on the first contact electrode 261 to electrically isolate the first contact electrode 261 from the second contact electrode 262. The eighth insulating layer 1880 covers the first contact electrode 261 and may not overlap with a part of the light-emitting element 300 so that the light-emitting element 300 is in contact with the second contact electrode 262.

In some exemplary embodiments, the display panel 10 may not include the eighth insulating layer 1880. In such case, the first contact electrode 261 and the second contact electrode 262 may be on substantially the same plane, and may be electrically insulated from each other by a passivation layer 1890 described later.

The passivation layer 1890 may be formed over the eighth insulating layer 1880 and the second contact electrode 262 to protect elements of the display elements layer 10b from the external environment.

Each of the sixth insulating layer 1860, the seventh insulating layer 1870, the eighth insulating layer 1880, and the passivation layer 1890 may include an inorganic insulating material. For example, the sixth insulating layer 1860, the seventh insulating layer 1870, the eighth insulating layer 1880, and the passivation layer 1890 may include a material such as silicon oxide (SiOx), silicon nitride (SiNx), silicon oxynitride (SiOxNy), aluminum oxide ($Al_2O_3$) and aluminum nitride (AlN). They may be made of the same material or different materials. However, the materials are not limited thereto.

Hereinafter, a method of fabricating the display device 1 will be described with reference to FIGS. 12 to 19.

FIGS. 12-19 are diagrams schematically showing a part of a method of fabricating a display device according to an exemplary embodiment of the present disclosure.

Figure 12:
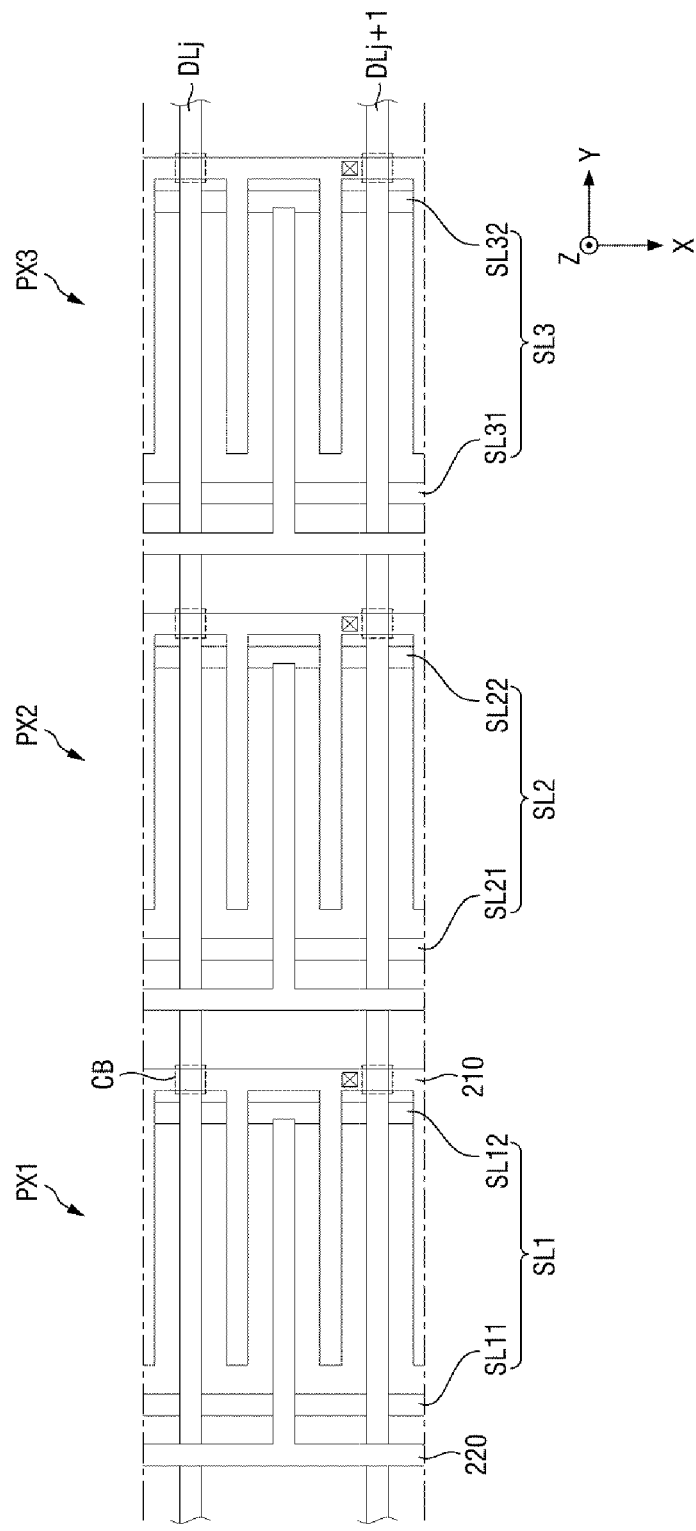
FIGS. 12-19 are diagrams schematically showing a part of a method of fabricating a display device according to an exemplary embodiment of the present disclosure.

Initially, referring to FIG. 12, a display element layer 10b including a first electrode line 210 and a second electrode line 220 formed on a circuit element layer 10a is prepared. The first electrode line 210 and the second electrode line 220 may be substantially on the fifth insulating layer 1850. The arrangement and structure of the first electrode line 210 and the second electrode line 220 are substantially identical to those described above with reference to FIG. 5 except that a first electrode stem 210S is connected to a first electrode stem 210S of an adjacent sub-pixels PXn in the first direction (x-axis direction).

FIG. 12 shows that the first to third sub-pixels PX1, PX2 and PX3 are arranged in the second direction (y-axis direction) adjacent to one another, in which the sub-pixel PXn of FIG. 5 has been rotated 90°. In other words, among the plurality of pixels PX or PXn of the display panel 10, FIG. 5 shows the pixels PX or the sub-pixels PXn arranged in the first direction (x-axis direction), while FIG. 12 shows the pixels PX or the sub-pixels PXn arranged in the second direction (y-axis direction).

In a sub-pixel PXn of n row, an $n1^{th}$ scan line SLn1 and an $n2^{th}$ scan line SLn2 are located. The $n1^{th}$ scan line SLn1 may be a first scan line SL1 of FIG. 4 for applying the first scan signal GW, while the $n2^{th}$ scan line SLn2 may be a second scan line SL2 of FIG. 4 for applying the second scan signal GB in FIG. 4.

The $n1^{th}$ scan line SLn1 is extended in the first direction (x-axis direction) at the boundary between the adjacent sub-pixels PXn. The $n2^{th}$ scan line SLn2 is extended in the first direction (x-axis direction) between the first electrode stem 210S and the second electrode stem 220S of each sub pixel PXn.

As shown in FIG. 12, an eleventh scan line SL11 and a twelfth scan line SL12 may be in the first sub-pixel PX1, a twenty-first scan line SL21 and a twenty-second scan line SL22 may be in the second sub-pixel PX2, and a thirty-first scan line SL31 and a thirty-second scan line SL32 may be in the third sub-pixel PX3. In addition, the first to third sub-pixels PX1, PX2 and PX3 may share a plurality of data lines DLj extended in the second direction (y-axis direction).

In the display panel 10 according to an exemplary embodiment of the present disclosure, each of the sub-pixels PXn may include a third transistor TR3 for transmitting an alignment signal for aligning the light-emitting elements 300, and the first electrode stem 210S may be partially cut before aligning the light-emitting elements 300.

Figure 13:
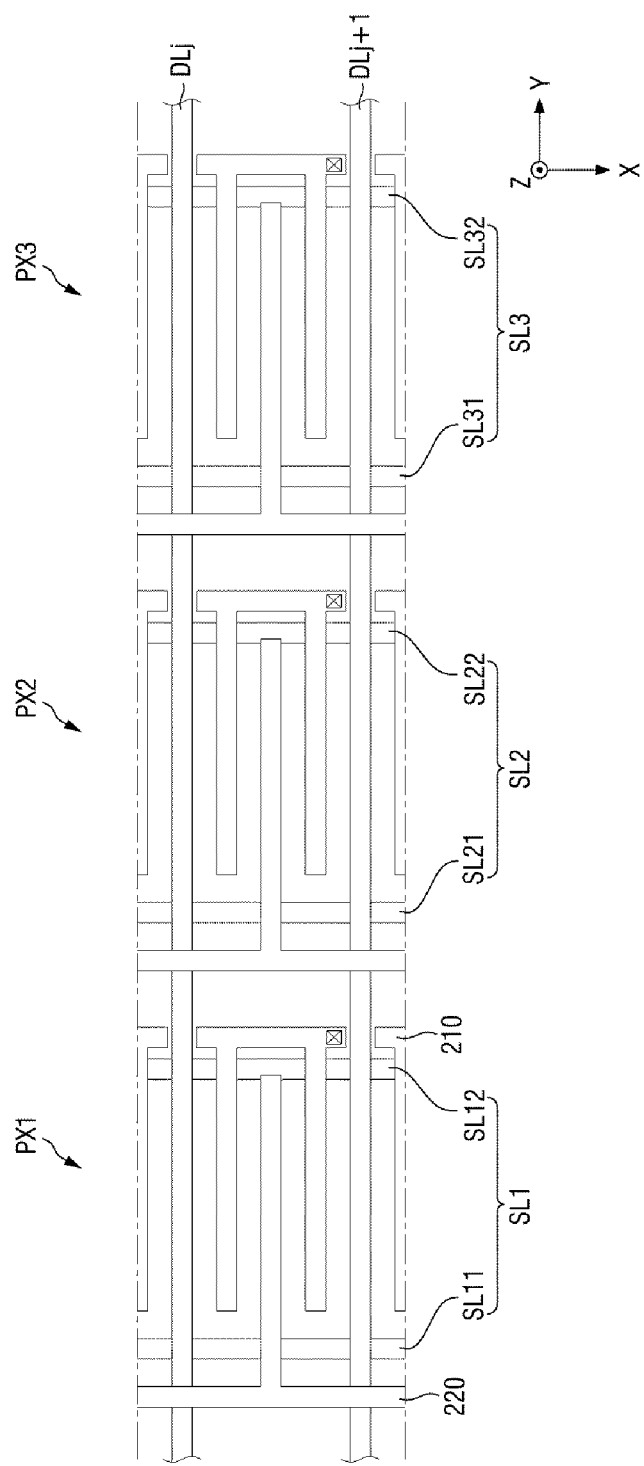

Referring to FIG. 13, the first electrode stem 210S of FIG. 12 may be disconnected at the boundaries between the sub-pixels PXn adjacent to each other in the first direction (x-axis direction). Accordingly, both ends of the first electrode stem 210S in the first direction (x-axis direction) may be terminated at and spaced from the boundary between the sub-pixels PXn.

In the example shown, the first electrode stem 210S is extended to adjacent sub-pixels PXn in the first direction (x-axis direction) and then is cut via a subsequent process. It is, however, to be understood that the present disclosure is not limited thereto. The first electrode stem 210S may be formed separately from sub-pixel to sub-pixel, instead of being cut via a separate process. In such a case, the process of disconnecting the first electrode stem 210S extended in the direction may be omitted.

In the display panel 10 according to an exemplary embodiment of the present disclosure, different signals may be transmitted to the transistor for aligning the light-emitting elements 300 and to the transistor for driving the light-emitting elements 300. The third transistor TR3 may transmit an alignment signal for aligning the light-emitting elements 300, for example, a ground voltage, and the first transistor TR1 may be turned off while the ground voltage is being supplied to the third transistor TR3. Accordingly, the ground voltage for aligning the light-emitting elements 300 can be transmitted for each of sub-pixels PXn individually through the third transistor TR3, so that the light-emitting elements 300 can be aligned while the first electrode stem 210S is separated from one another between adjacent sub-pixels PXn.

On the other hand, when the fabricated display panel 10 is driven, the first transistor TR1 may be turned on by a scan signal (e.g., a predetermined scan signal) to transmit the driving voltage, and the third transistor TR3 may be turned off. That is to say, the third transistor TR3 may be turned off while the display panel 10 is being driven.

Subsequently, referring to FIGS. 14 and 15, the light-emitting elements 300 are loaded on the first electrode line 210 and the second electrode line 220. Then, an alignment signal is applied so that the light-emitting elements 300 are aligned between the first electrode branch 210B and the second electrode branch 220B.

Figure 14:
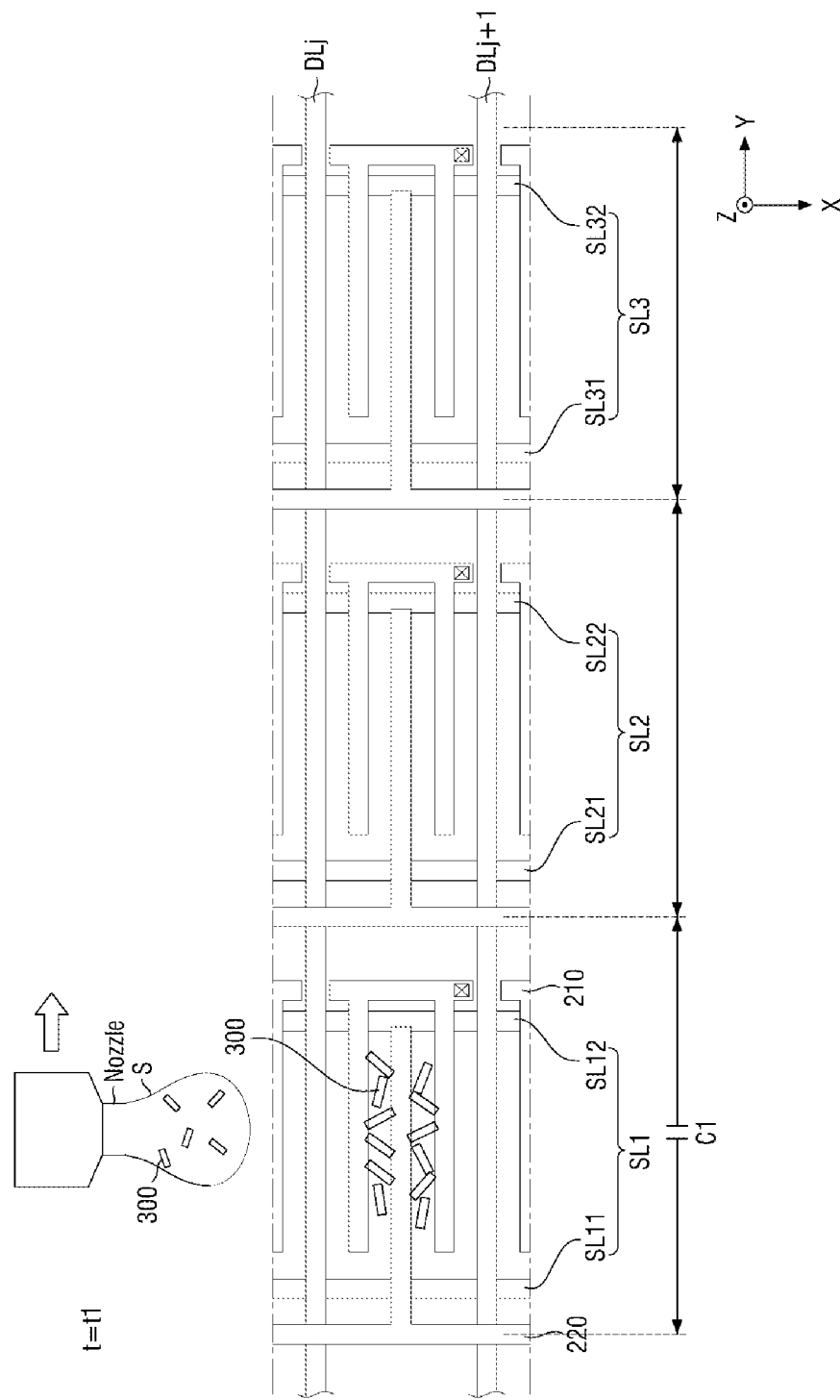
Figure 15:
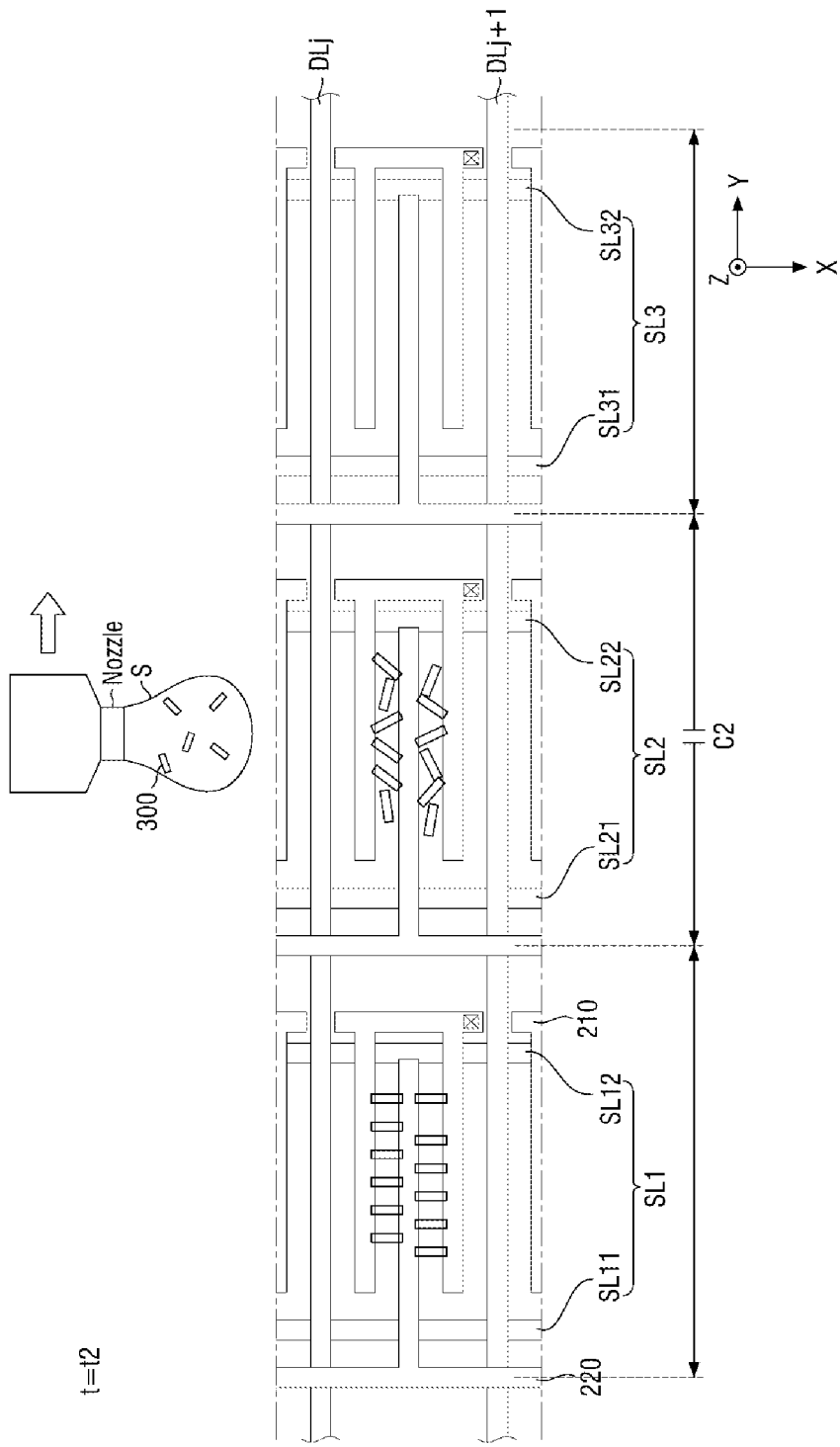

To align the light-emitting element 300 (as shown in FIG. 14), a coating solution S in which the light-emitting elements 300 are dispersed is ejected onto the first electrode line 210 and the second electrode line 220, and the ground voltage is applied to the first electrode line 210 and the AC voltage is applied to the second electrode line 220 through the third transistor TR3.

The coating solution S containing the light-emitting elements 300 may be ejected onto the display panel 10 through a nozzle. For example, the light-emitting elements 300 may be ejected by inkjet printing, die-slot coating, or the like, and in an exemplary embodiment, the inkjet printing may be employed.

The light-emitting elements 300 may be ejected onto the first electrode branch 210B and the second electrode branch 220B of each of the sub-pixels PXn. The order of ejecting the light-emitting elements 300 is not particularly limited. In an exemplary embodiment, a nozzle for ejecting the light-emitting elements 300 may move in the first direction (x-axis direction) above the pixel PX or the sub-pixel PXn to eject the light-emitting elements 300. Then, it moves in the second direction (y-axis direction) and back in the first direction (x-axis direction).

Although the nozzle moves only in the second direction (y-axis direction) in the drawings, the present disclosure is not limited thereto. In some implementations, the nozzle may also move in the first direction (x-axis direction) or in other directions above the sub-pixels PXn to eject the coating solution S.

The nozzle for ejecting the light-emitting elements 300 may move repeatedly in the first direction (x-axis direction) and the second direction (y-axis direction). In an exemplary embodiment, the light-emitting elements 300 may be ejected in the direction parallel to the direction in which the scan line SLk is extended, for example, the first direction (x-axis direction).

Subsequently, an electric field is formed on the first electrode line 210 and the second electrode line 220 to align the ejected light-emitting elements 300. According to an exemplary embodiment of the present disclosure, when the light-emitting elements 300 are ejected onto the first electrode line 210 and the second electrode line 220 through the nozzle, the third transistor TR3 may be turned on, such that the alignment signal may be applied to the first electrode line 210.

As described above, the ground voltage is transmitted to the first electrode line 210 through the third transistor TR3, and the AC voltage is applied to the second electrode line 220 through the second voltage line QVSSL. The applied AC voltage forms a capacitance C between the first electrode line 210 and the second electrode line 220, and the light-emitting elements 300 in the coating solution S may be aligned by the dielectrophoretic force.

Because at least one third transistor TR3 is located in each of the sub-pixels PXn, the ground voltage transmitted through the third transistor TR3 can be transmitted to each of the sub-pixel PXn individually. That is to say, when the nozzle ejects the light-emitting elements 300 onto the first sub-pixel PX1, only the third transistor TR3 of the first sub-pixel PX1 may be turned on whereas the third transistor TR3 of each of the second sub-pixel PX2 and the third sub-pixel PX3 may be turned off. As a result, it is possible to form the capacitance C by the AC voltage only in the sub pixel PXn onto which the nozzle ejects the light-emitting elements 300.

As shown in the drawings (e.g., FIG. 18), when the nozzle loads the light-emitting elements 300 on the first sub-pixel PX1, the second scan signal GB is applied to the twelfth scan line SL12, and the third transistor TR3 of the first sub-pixel PX1 may be turned on in response to the second scan signal GB. The ground voltage applied to the first voltage line QVDDL may be transmitted to the first electrode line 210 through the third transistor TR3. On the other hand, the third transistor TR3 of each of the second sub-pixel PX2 and the third sub-pixel PX3 is turned off, and the ground voltage applied to the first voltage line QVDDL is not transmitted thereto.

Subsequently, when the nozzle moves in the second direction (y-axis direction) and then the light-emitting elements 300 are loaded on the second sub-pixel PX2, the third transistor TR3 of the second sub-pixels PX2 is turned on while the third transistor TR3 of each of the first sub-pixel PX1 and the third sub-pixel PX3 is turned off. As a result, the capacitance C is formed only in the second sub-pixel PX2 so that the light-emitting elements 300 can be aligned.

Figure 16:
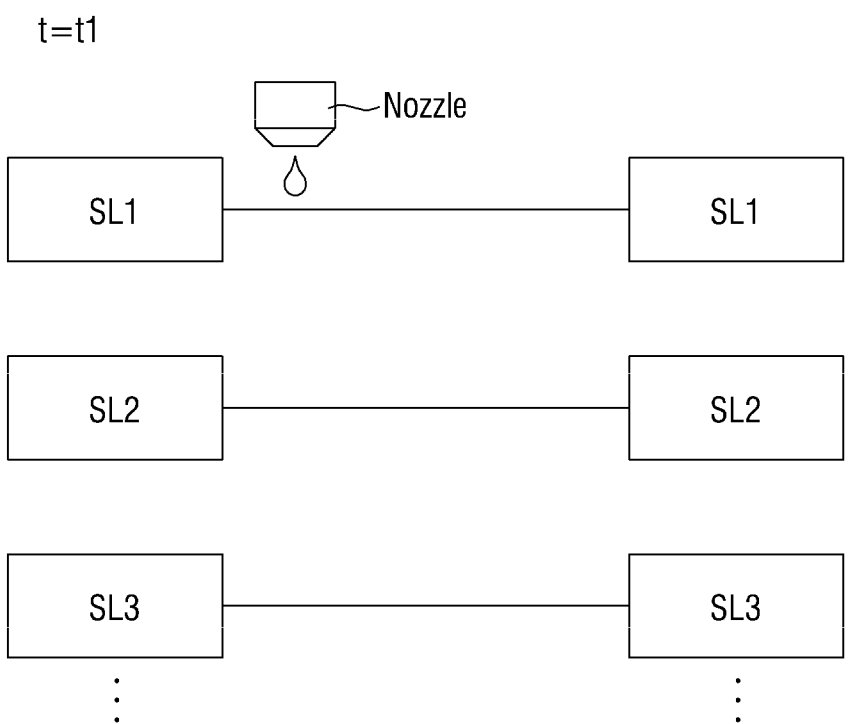
Figure 17:
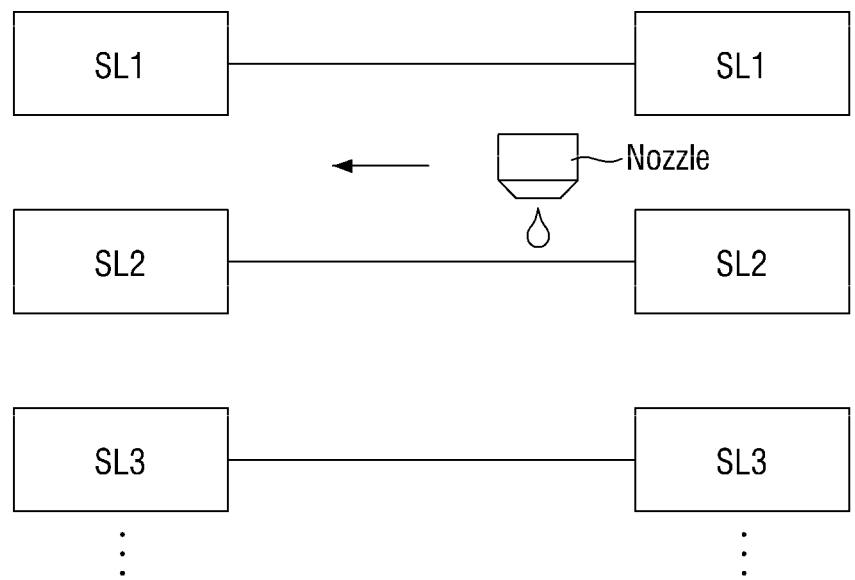
Figure 18:
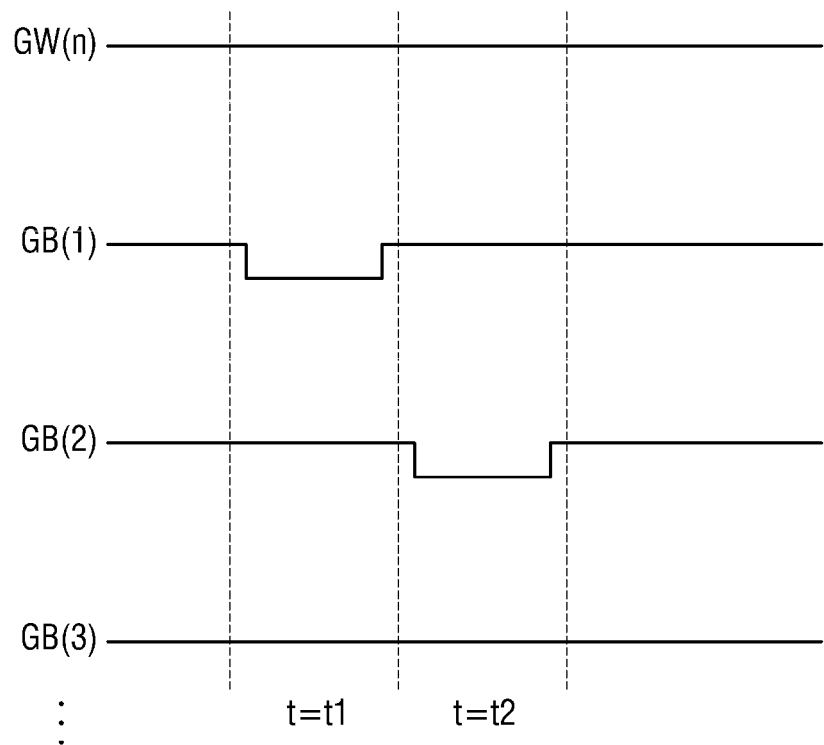
Figure 19:
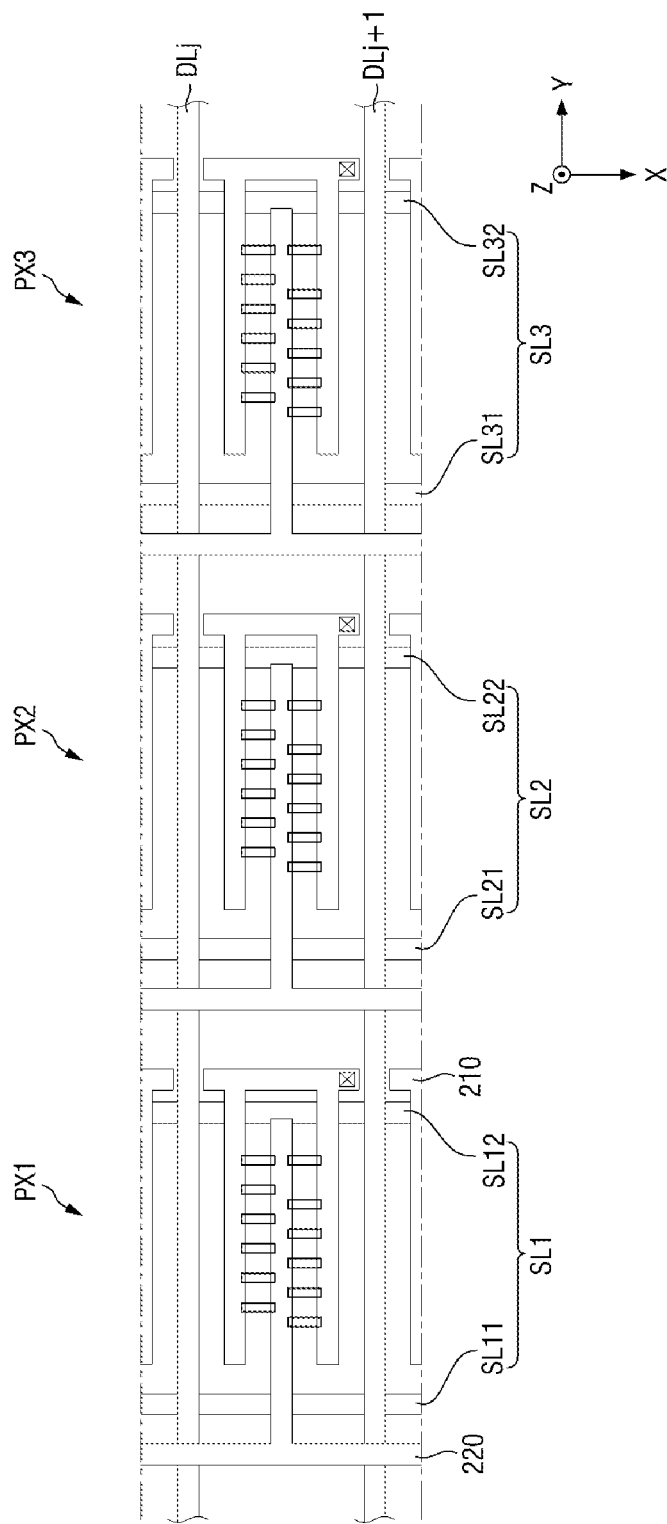

FIGS. 16 and 17 are views illustrating a path in which the nozzle moves during the process of fabricating a display panel according to an exemplary embodiment of the present disclosure. FIG. 18 is a graph showing a second scan signal transmitted to each sub-pixel during the process of fabricating a display panel according to an exemplary embodiment of the present disclosure.

Referring to FIGS. 14-18, a method of fabricating a display panel 10 according to an exemplary embodiment of the present disclosure may include moving the nozzle ejecting a coating solution S in the first direction (x-axis direction) in which the scan lines SLk are extended to thereby load the light-emitting elements 300. The nozzle may move in the first direction (x-axis direction) along a scan line SLkn, e.g., the scan line SLk1 of the first row, and then may move in the second direction (y-axis direction) to be located above the scan line SLk2 of the second row. Then, the nozzle may move along the scan line SLk2 of the second row in the opposite direction of the first direction (x-axis direction). The nozzle may eject the coating solution S while it moves in the first direction (x-axis direction) in which the scan line SLkn is extended.

When the nozzle moves along a scan line SLkn while ejecting the coating solution S, the third transistor TR3 connected to the scan line SLkn may be turned on. For example, at a first time point (t=t1) when the nozzle moves along the scan line SLk1 of the first row, the second scan signal GB is transmitted through the scan line SLk1 of the first row, so that the third transistor TR3 of the first row may be turned on. In addition, at the first time point (t=t1), the second scan signal GB is not transmitted to the scan lines SLk2 and SLk3 of the second and third rows other than the scan line SLk1 of the first row, 2 and the third transistor TR3 of the second and third rows may be turned off.

Accordingly, at the first time point (t=t1), a capacitance C1 is formed on the pixel PX or the sub-pixel PX1 of the first row, and the light-emitting elements 300 ejected from the nozzle can be aligned. On the other hand, no capacitance is formed on the pixels PX or the sub-pixels PX2 and PX3 of the second and third rows other than the scan line SLk1 of the first row.

Subsequently, after the first time point (t=t1), the nozzle moves in the second direction (y-axis direction) and is located above the scan line SLk2 of the second row. Then, at the second time point (t=t2), the nozzle moves in the first direction (x-axis direction) along the scan line SLk2 of the second row. At the second time point (t=t2), the second scan signal GB may be transmitted through the scan line SLk2 of the second row so that the third transistor TR3 of the second row may be turned on. In addition, at the second time point (t=t2), the second scan signal GB is not transmitted to the scan lines SLk1 and SLk3 of the first and third rows, and the third transistor TR3 of the first and third rows may be turned off.

Accordingly, at the second time point (t=t2), a capacitance C2 is formed on the pixel PX or the sub-pixel PX1 of the second row, and the light-emitting elements 300 ejected from the nozzle can be aligned. On the other hand, no capacitance is formed on the pixels PX or the sub-pixels PX1 and PX3 of the first and third rows.

As shown in FIG. 18, at the first time point (t=t1), the second scan signal GB is transmitted to the scan line SLk1 in the first row but not to the scan line SLk2 and SLk3 of the second and third rows. On the other hand, at the second time point (t=t2), the second scan signal GB is transmitted to the scan line SLk2 of the second row but not to the first and third scan lines SLk1 and SLk3.

In this manner, during the process of the display device 1, the second scan signal GB to turn on the third transistor TR3 may be input in synchronization with the time point tk at which the nozzle moves along one of the scan lines SLk. According to the method of fabricating the display panel 10 according to an exemplary embodiment of the present disclosure, the third transistor TR3 can be turned on in accordance with the time point tk at which the second scan signal GB is input to each of the pixel PX or the sub-pixel, to align the light-emitting elements 300.

Subsequently, the light-emitting elements 300 are aligned on each pixel PX or each sub-pixel PXn, and then the elements of the display element layer 10b described above are formed, to produce the display panel 10. The detailed description thereon will be omitted.

FIG. 20 is a diagram showing a light-emitting element according to an exemplary embodiment of the present disclosure.

The light-emitting element 300 may include semiconductor crystals doped with impurities of a conductive type (e.g., p-type or n-type). The semiconductor crystals may receive an electric signal applied from an external power source and may emit light of a certain wavelength band. Each of the sub-pixels PXn of the display panel 10 includes a plurality of light-emitting elements 300 to display the light emitted by the light-emitting elements 300 to the outside of the display device 1.

The light-emitting elements 300 may be light-emitting diodes. Specifically, the light-emitting elements 300 may have size in micrometers or nanometers and may be inorganic element diodes made of an inorganic material. The light-emitting element 300 including the semiconductor crystals may be aligned on the display panel 10 by forming an electric field. In addition, the light-emitting element 300 connected to the electrodes may receive an electrical signal and emit light of a certain wavelength band.

Referring to FIG. 20, the light-emitting element 300 according to an exemplary embodiment may include a plurality of conductivity-type semiconductors 310 and 320, an active layer 330, an electrode material layer 370, and an insulating layer 380. The conductivity-type semiconductors 310 and 320 may transmit an electrical signal transmitted to the light-emitting element 300 to the active layer 330, and the active layer 330 may emit light of a certain wavelength band.

Specifically, the light-emitting element 300 may include a first conductivity-type semiconductor 310, a second conductivity-type semiconductor 320, an active material layer 330 between the first conductivity-type semiconductor 310 and the second conductivity-type semiconductor 320, an electrode material layer 370 located on the second conductivity-type semiconductor 320, and an insulating material layer 380 surrounding the outer surface thereof. In the light-emitting element 300 shown in FIG. 20, the first conductivity-type semiconductor 310, the active layer 330, the second conductivity-type semiconductor 320, and the electrode material layer 370 are stacked on one another in the longitudinal direction in this order. It is, however, to be understood that the present disclosure is not limited thereto. The electrode material layer 370 may be eliminated. In some exemplary embodiments, it may be on at least one of the both side surfaces of the first and second conductivity-type semiconductors 310 and 320. Hereinafter, the light-emitting element 300 of FIG. 20 will be described as an example. The following description of the light-emitting element 300 can be equally applied even if the light-emitting element 300 further includes other structures.

The first conductivity-type semiconductor 310 may be an n-type semiconductor layer. For example, when the light-emitting element 300 emits light of a blue wavelength band, the first conductivity-type semiconductor 310 may be a semiconductor material having Formula below: $In_xAl_yGa_{1-x-y}N$, where $0 \leq x \leq 1$, $0 \leq y \leq 1$, and $0 \leq x+y \leq 1$. For example, it may be at least one of n-type doped InAlGaN, GaN, AlGaN, InGaN, AlN, and InN. The first conductivity-type semiconductor 310 may be doped with a first conductivity-type dopant. For example, the first conductivity-type dopant may be Si, Ge, Sn, etc. The length of the first conductivity-type semiconductor 310 may range, but is not limited to, from 1.5 μm to 5 μm.

The second conductivity-type semiconductor 320 may be a p-type semiconductor layer. For example, when the light-emitting element 300 emits light of a blue wavelength band, the first conductivity-type semiconductor 320 may be a semiconductor material having Formula below: $In_xAl_yGa_{2-x-y}N$, where $0 \leq x \leq 1$, $0 \leq y \leq 1$, and $0 \leq x+y \leq 1$. For example, it may be at least one of p-type doped InAlGaN, GaN, AlGaN, InGaN, AlN, and InN. The second conductivity-type semiconductor 320 may be doped with a second conductivity-type dopant. For example, the second conductivity-type dopant may be Mg, Zn, Ca, Se, Ba, etc. The length of the second conductivity-type semiconductor 320 may range, but is not limited to, from 0.08 μm to 0.25 μm.

The active layer 330 may be located between the first conductivity-type semiconductor 310 and the second conductivity-type semiconductor 320 and may include a material having a single or multiple quantum well structure. When the active layer 330 includes a material having the multiple quantum well structure, quantum layers and well layers may be alternately stacked in the structure. The active layer 330 may emit light as electron-hole pairs are combined therein in response to an electrical signal applied through the first conductivity-type semiconductor 310 and the second conductivity-type semiconductor 320. For example, when the active layer 330 emits light of the blue wavelength band, the active layer 330 may include a material such as AlGaN and AlInGaN. In particular, when the active layer 330 has a multi-quantum well structure in which quantum layers and well layers are alternately stacked on one another, the quantum layers may include AlGaN or AlInGaN, and the well layers may include a material such as GaN and AlGaN.

It is, however, to be understood that the present disclosure is not limited thereto. The active layer 330 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the active layer 330 is not limited to the light of the blue wavelength band. The active material layer 353 may emit light of red or green wavelength band in some implementations. The length of the active layer 330 may be, but is not limited to, in the range of 0.05 μm to 0.25 μm.

The light emitted from the active layer 330 may exit not only through the outer surfaces of the light-emitting element 300 in the longitudinal direction but also through both side surfaces. That is to say, the direction in which the light exiting from the active layer 330 propagates is not limited to one direction.

The electrode material layer 370 may be an ohmic contact electrode. It is, however, to be understood that the present disclosure is not limited thereto. The electrode material layer 370 may be a Schottky contact electrode. The electrode material layer 370 may include a metal having conductivity. For example, the electrode material layer 370 may include at least one of aluminum (Al), titanium (Ti), indium (In), gold (Au), silver (Ag), indium tin oxide (ITO), indium zinc oxide (IZO) and indium tin-zinc oxide (ITZO). The electrode material layer 370 may include the same material and may include different materials. It is, however, to be understood that the present disclosure is not limited thereto.

The insulating layer 380 may be in contact with the first conductivity-type semiconductor 310, the second conductivity-type semiconductor 320, the active layer 330 and the electrode material layer 370 and may surround the outer surfaces thereof. The insulating layer 380 may serve to protect the above-described elements. For example, the insulating layer 380 may surround the side surfaces of the above-described elements, and the both ends of the light-emitting element 300 in the longitudinal direction, e.g., the both ends where the first conductivity-type semiconductor 310 and the electrode material layer 370 are located may be exposed. It is, however, to be understood that the present disclosure is not limited thereto.

The insulating layer 380 may include materials having an insulating property such as silicon oxide (SiOx), silicon nitride (SiNx), silicon oxynitride (SiOxNy), aluminum nitride (AlN) and aluminum oxide ($Al_2O_3$). Accordingly, it is possible to prevent an electrical short-circuit that may occur when the active layer 330 of the light-emitting element 300 comes in contact with an electrode in which an electric signal is transmitted. In addition, because the insulating layer 380 protects the outer surface of the light-emitting element 300 including the active layer 330, it is possible to prevent (or reduce) a decrease in luminous efficiency.

Although the insulating layer 380 is extended in the longitudinal direction of the light-emitting element 300 to cover from the first conductivity-type semiconductor 310 to the electrode material layer 370 in the drawings, the present disclosure is not limited thereto. The insulating layer 380 may cover only the first conductivity-type semiconductor layer 310, the active layer 330, and the second conductivity-type semiconductor layer 320 or may cover only a part of the electrode material layer 370, such that a part of the outer surface of the electrode material layer 370 may be exposed.

The thickness of the insulating layer 380 may be, but is not limited to, in the range of 0.5 μm to 1.5 μm.

The light-emitting element 300 may have a shape extended in one direction. The light-emitting element 300 may have a shape such as nanorods, nanowires and nanotubes. In an exemplary embodiment, the light-emitting element 300 may have a cylindrical or rod-like shape. It is to be understood that the shape of the light-emitting element 300 is not limited thereto but may have various shapes such as a cube, a cuboid and a hexagonal column.

The length "I" of the light-emitting element 300 may range from 1 μm to 10 μm or from 2 μm to 5 μm, and preferably approximately 4 μm. In addition, the diameter of the light-emitting element 300 may range from 300 nm to 700 nm. The light-emitting elements 300 may have different diameters for different composition of the active layer 330. Preferably, the diameter of the light-emitting element 300 may be within a range of approximately 500 nm.

Hereinafter, a display device 1 according to another exemplary embodiment will be described.

As described above, the display device 1 may include a greater number of transistors. The display device 1 according to an exemplary embodiment of the present disclosure may include three or more transistors, for example, seven transistors, and may include a greater number of scan lines and voltage lines.

Figure 21:
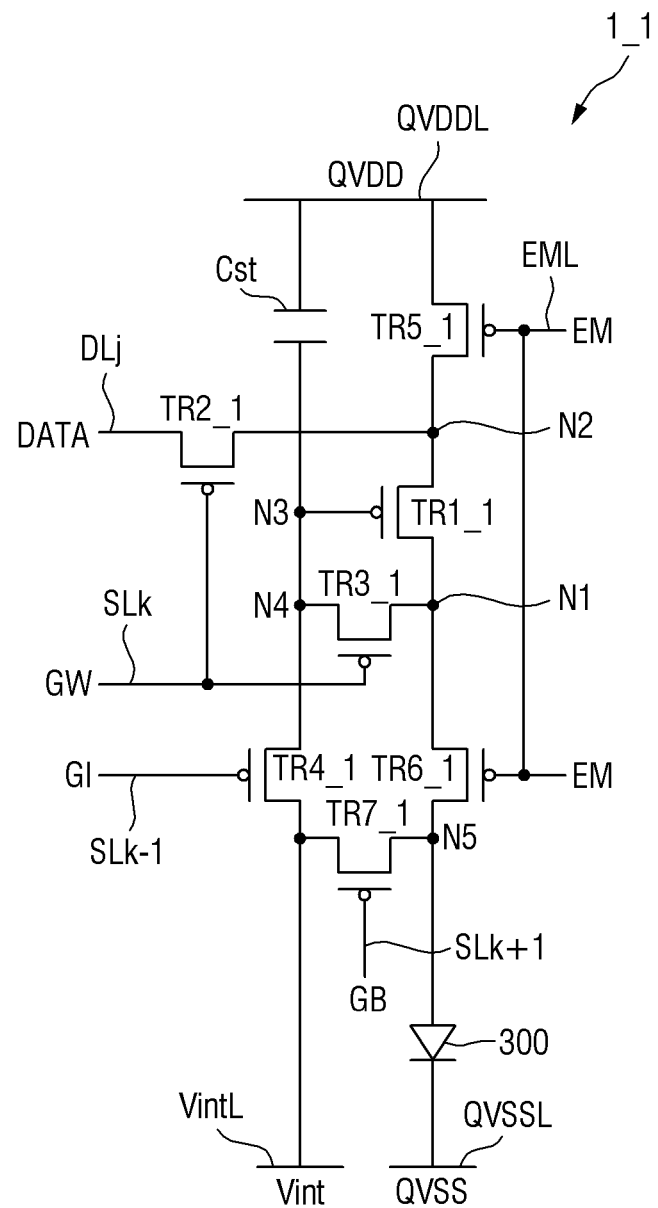
FIG. 21 is a circuit diagram of a pixel of a display device according to another exemplary embodiment of the present disclosure.

FIG. 21 is a circuit diagram of a pixel of a display device according to another exemplary embodiment of the present disclosure.

Referring to FIG. 21, a pixel PX or a sub-pixel PXn of a display device 1_1 according to an exemplary embodiment of the present disclosure may have seven transistors TR1_1 to TR7_1 and a single capacitor Cst (7T1C) structure, unlike that shown in FIG. 4. As shown in FIG. 21, the first voltage line QVDDL, the second voltage line QVSSL and the data line DLj may be connected in the same manner as in FIG. 4. In addition, the light-emitting element 300 may be connected in the same manner as in FIG. 4 as well. The elements have been described above; and, therefore, the redundant description will be omitted.

The pixel PX or the sub-pixel PXn of the display device 1_1 in FIG. 21 may receive a data signal DATA, a first scan signal GW, a second scan signal GB, a third scanning signal GI and an emission control signal EM. The third scan signal GI may be equal to the first scan signal GW of the previous time point or the previous row. The second scan signal GB may be equal to the third scan signal GI of the subsequent time point or the subsequent row. For example, the third scan signal GIn provided to the pixel PX or the sub-pixel PXn of the $n^{th}$ row may be equal to the first scan signal GW(n−1) provided to the pixel PX or the sub-pixels PXn of the (n−1)$^{th}$ row. The second scan signal GBn of the $n^{th}$ row may be equal to the first scan signal GW(n+1) of the (n+1)$^{th}$ row.

The plurality of transistors may include a first transistor TR1_1, a second transistor TR2_1, a third transistor TR3_1, a fourth transistor TR4_1, a fifth transistor TR5_1, a sixth transistor TR6_1, and a seventh transistor TR7_1.

The first transistor TR1_1 (or the driving transistor) may include a first electrode connected to a first node N1, a second electrode connected to a second node N2, and a gate electrode connected to a third node N3. The first transistor TR1_1 may provide a driving current to the light-emitting element 300 based on the voltage at the third node N3 (or the data voltage stored in the capacitor Cst).

The second transistor TR2_1 (or the switching transistor) may include a first electrode connected to the second node N2, a second electrode connected to the data line DLj, and a gate electrode connected to the first scan line SLk for supplying the first scan signal GW, where k is an integer satisfying 1≤k≤n. The second transistor TR2_1 is identical to that described above with reference to FIG. 4.

The third transistor TR3_1 may include a first electrode connected to the first node N1, a second electrode connected to the fourth node N4, and a gate electrode connected to the first scan line SLk or receiving the first scan signal GW. The third transistor TR3_1 may be turned on in response to the first scan signal GW and may transmit the data signal DATA to the fourth node N4.

The capacitor Cst may be connected between the first voltage line QVDDL and the third node N3. The capacitor Cst may store or hold the received data signal DATA.

The fourth transistor TR4_1 may include a first electrode connected to an initialization voltage line VintL receiving an initialization voltage Vint, a second electrode connected to the fourth node N4, and a gate electrode connected to a third scan line SL(k−1) for supplying the third scan signal GI or receiving the third scan signal GI. The fourth transistor TR4_1 may be turned on in response to the third scan signal GI before the data signal DATA is stored in the capacitor Cst or after the light-emitting element 300 emits light, and may initialize a third node N3 (or the capacitor Cst) using the initialization voltage Vint.

For example, the third and fourth transistors TR3_1 and TR4_1 may be implemented as dual transistors. The third and fourth transistors TR3_1 and TR4_1 are identical to those described above; and, therefore, the redundant description will be omitted.

The fifth transistor TR5_1 (or a first emission control transistor) and the sixth transistor TR6_1 (or a second emission control transistor) are connected between the first voltage line QVDDL and the first electrode line 210 of the light-emitting element 300 and may form a current path through which the driving current generated by the first transistor TR1_1 moves.

The fifth transistor TR5_1 may include a first electrode connected to the first voltage line QVDDL and receiving the first voltage QVDD, a second electrode coupled to the second node N2, and a gate electrode connected to the emission control line EML transferring the emission control signal EM or receiving the emission control signal EM.

The sixth transistor TR6_1 may include a first electrode connected to the first node N1, a second electrode connected to the a fifth node N5 or the first electrode line 210 of the light-emitting element 300, and a gate electrode connected to the emission control line EML or receiving the emission control signal EM.

The fifth and sixth transistors TR5_1 and TR6_1 may be turned on in response to the emission control signal EM. Then, the driving current may be transmitted to the light-emitting element 300 so that the light-emitting element 300 emits light having brightness that is proportional to the driving current.

The seventh transistor TR7_1 may include a first electrode connected to the fifth node N5, a second electrode connected to the initialization voltage line VintL, and a gate electrode connected to the second scan line SL(k+1) supplying the second scan signal GB or receiving the second scan signal GB.

The seventh transistor T7_1 may be turned on in response to the second scan signal GB before or after the light-emitting element 300 emits light and may initialize the first electrode line of the light-emitting element 300 by using the initialization voltage Vint.

As described above, the display device 1 according to the exemplary embodiment of the present disclosure may include a driving transistor for driving the light-emitting element 300 and an alignment transistor for aligning the light-emitting element 300. The display device 1_1 shown in FIG. 21 may include the first transistor TR1_1 as the driving transistor and the seventh transistor TR7_1 the alignment transistor.

When the display device 1_1 is driven, the first transistor TR1_1 serves as the driving transistor to generate the driving current for driving the light-emitting element 300. In such a case, the seventh transistor TR7_1 may not be turned off but may initialize the first electrode line 210 of the light-emitting element 300 with the voltage Vint in response to the second scan signal GB.

During the process of fabricating the display device 1_1, the first transistor TR1_1 may be turned off while only the seventh transistor TR7_1 may be turned on. Unlike the example shown in FIG. 4, in the display device 1_1 of FIG. 21, an alignment signal, e.g., a ground voltage, may be transmitted through the initialization voltage line VintL, and the light-emitting element 300 can be aligned on the pixel PX or the sub-pixel PXn where the transistor TR7_1 is turned on.

Hereinafter, the configuration will be described in more detail with reference to a layout diagram of the display device 1_1.

Figure 22:
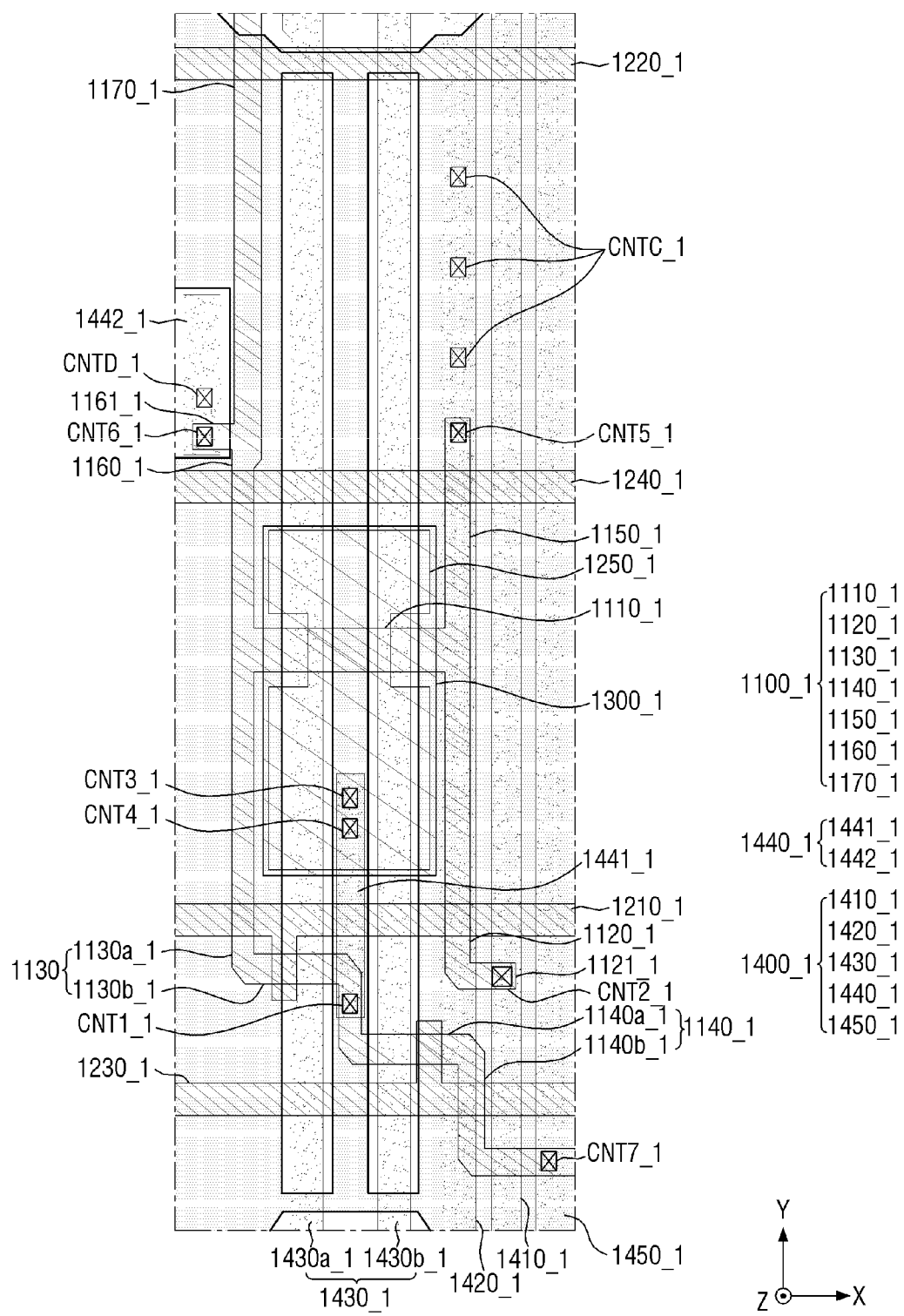
FIG. 22 is a diagram showing a layout of one of the pixels of FIG. 21.
Figure 23:
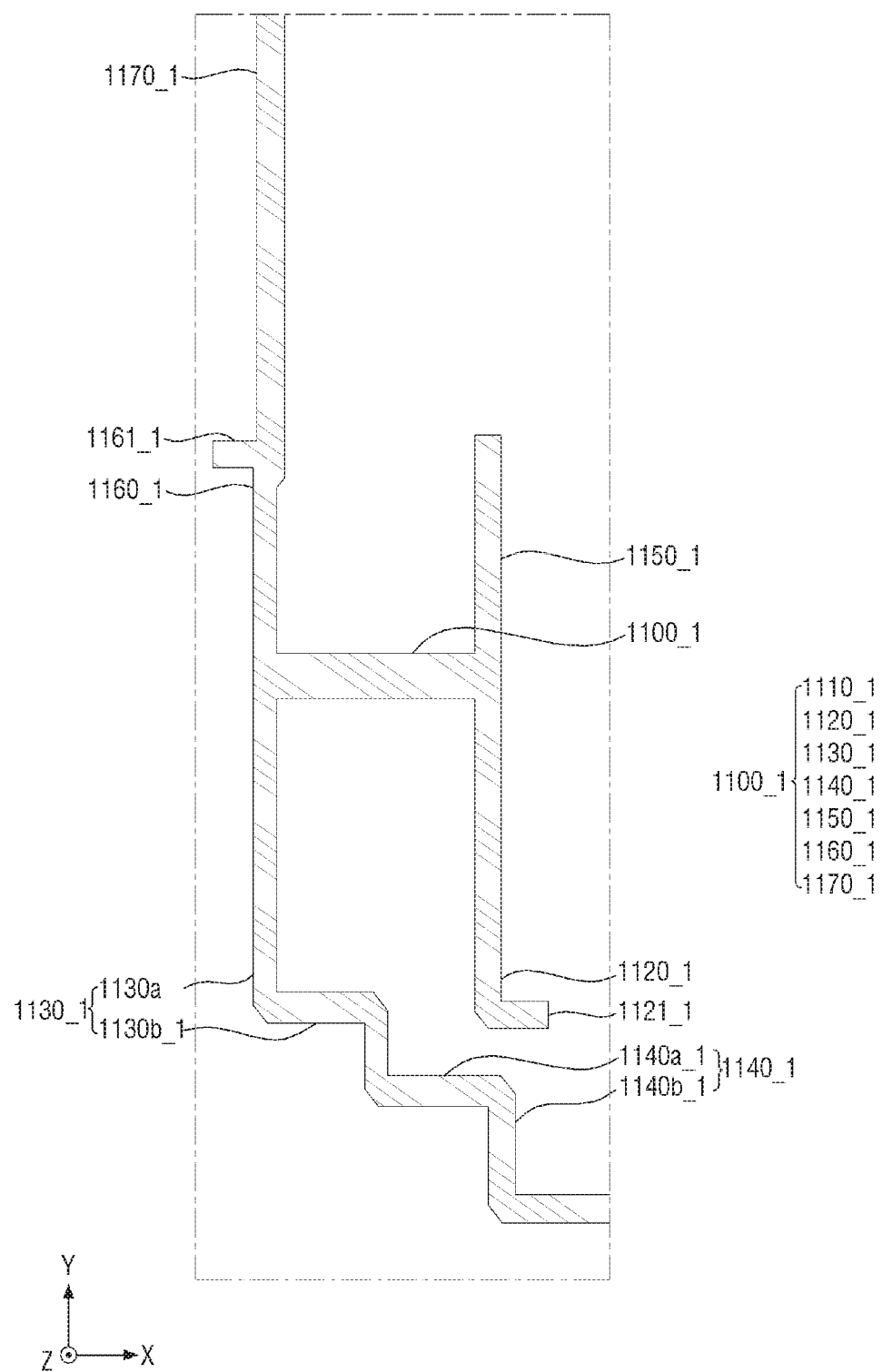
FIGS. 23-25 are layout diagrams shown in the stacking order of the circuit element layer of FIG. 22.
Figure 24:
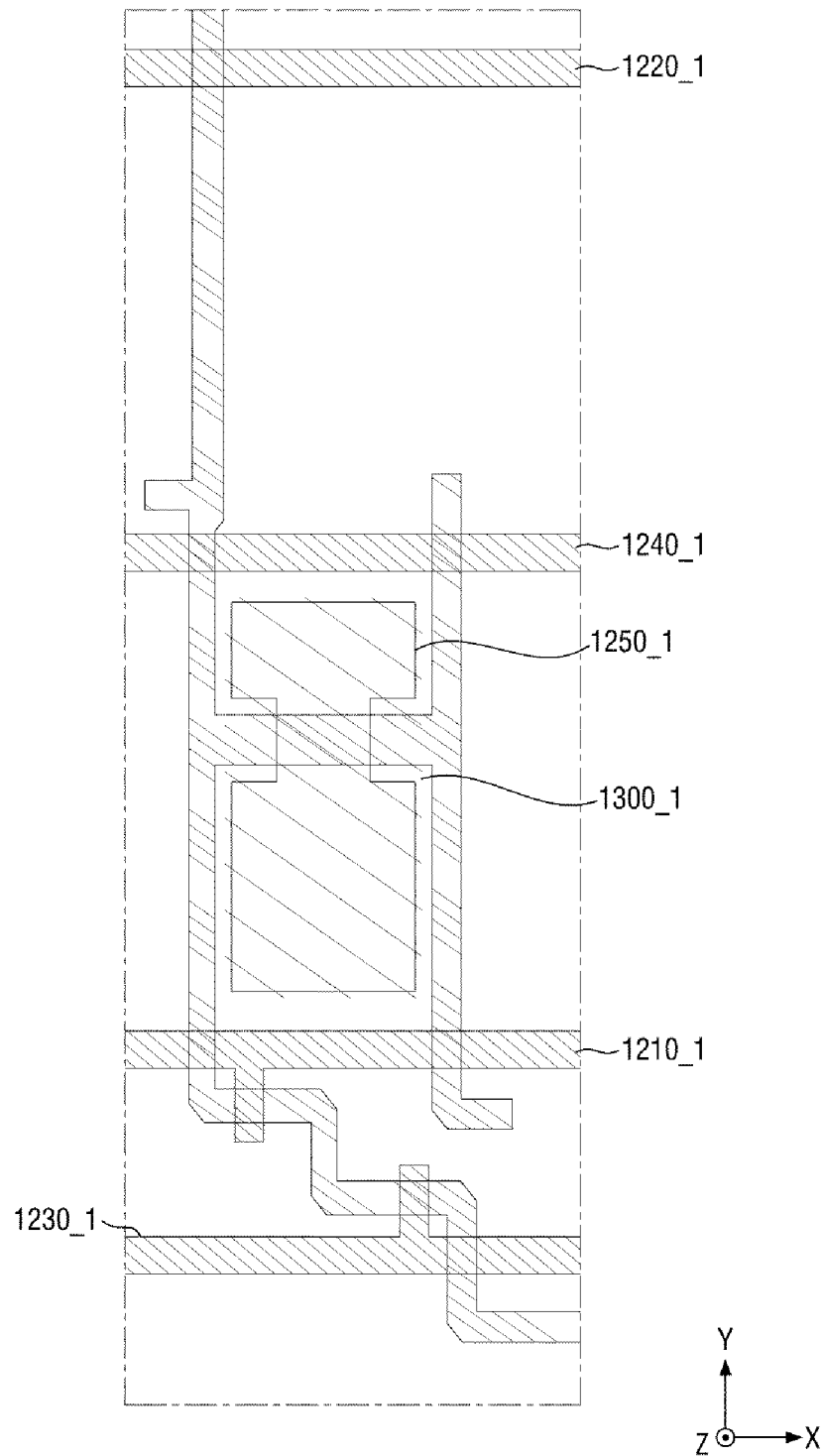
Figure 25:
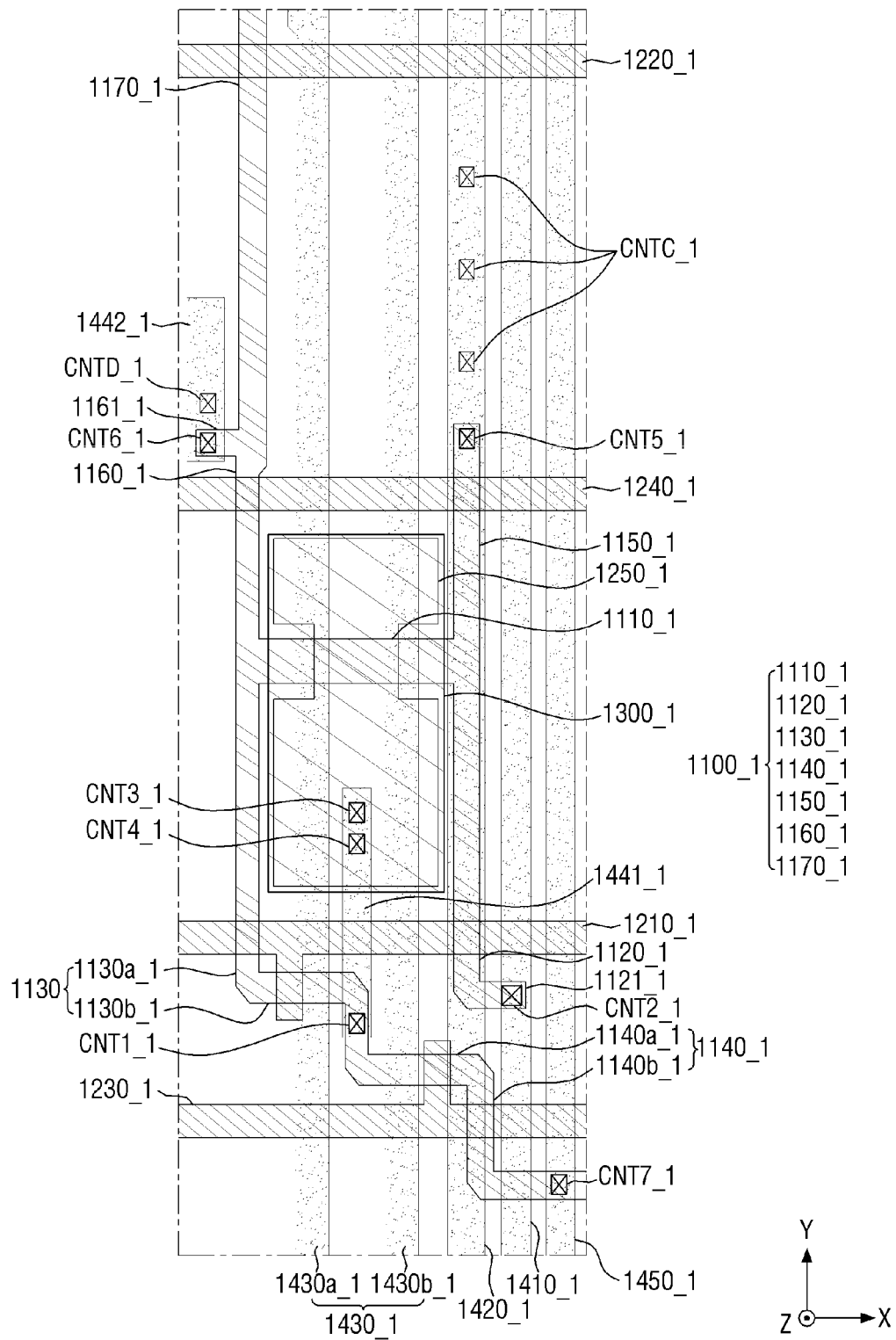

FIG. 22 is a diagram showing a layout of one of the pixels of FIG. 21. FIGS. 23 to 25 are layout diagrams shown in the stacking order of the circuit element layer of FIG. 22.

Although not shown in the drawings, the display device 1_1 of FIG. 21 may include a display element layer 10b substantially identical to that of the display device 1 of FIG. 4. Therefore, the display element layer 10b will not be described in detail, and the circuit element layer 10a will be described in detail.

Referring to FIGS. 22-25, a semiconductor layer 1100_1 may include a greater number of semiconductor regions.

The semiconductor layer 1100_1 may include a first vertical portion (or a left vertical portion) and a second vertical portion (or a right vertical portion) extended in the second direction (y-axis direction), a horizontal portion extended in the first direction (x-axis direction), and a plurality of curved portions.

The horizontal portion may include a first semiconductor region 1110_1 connecting the middle portion of the first vertical portion with the middle portion of the second vertical portion. Although the first semiconductor region 1110_1 may connect the first vertical portion with the second vertical portion by the shortest distance, the present disclosure is not limited thereto but may further include a bending portion. The first semiconductor region 1110_1 may partially overlap with the first conductive layer 1200 to be described later, and the channel of the first transistor TR1_1 may be located or formed.

The first vertical portion may be located adjacent to one side of the center of the sub-pixel PXn, e.g., on the left side in the first direction (x-axis direction), and the second vertical portion may be located adjacent to the right side of the center of the sub-pixel PXn. The first vertical portion may be spaced from the second vertical portion.

The first vertical portion may include a sixth semiconductor region 1160_1 and a seventh semiconductor region 1170_1 located on a side of the first semiconductor region 1110_1 in the second direction (y-axis direction), for example, the upper side, and a thirty-first semiconductor region 1130a_1 located on the lower side. The second vertical portion may include a fifth semiconductor region 1150_1 located on the upper side of the first semiconductor region 1110_1, and a twenty-first semiconductor region 1120_1 located on the lower side.

The curved portions may be located at the lower end of the first vertical portion. The curved portions include a thirty-second semiconductor region 1130b_1 extended from the lower end of the first vertical portion toward the right side, a forty-first semiconductor region 1140a_1 extended from the thirty-second semiconductor region 1130b_1 bent toward the lower side, and a forty-second semiconductor region 1140b_1 bent toward the right side and lower side. The forty-second semiconductor region 1140b_1 may be connected to the first vertical portion or the seventh semiconductor region 1170_1 located in the previous pixel PX or the sub-pixel PXn.

The thirty-first semiconductor region 1130a_1 and the thirty-second semiconductor region 1130b_1 are included in the third semiconductor region 1130_1, and the forty-first semiconductor region 1140a_1 and the forty-second semiconductor region 1140b_1 are included in the fourth semiconductor region 1140_1. The third semiconductor region 1130_1 and the fourth semiconductor region 1140_1 may form the third transistor TR3_1 and the fourth transistor TR4_1, respectively, and they may be implemented as dual transistors.

The second semiconductor region 1120_1 may include a second bending portion 1121_1 bent toward the right side from the lower end of the second vertical portion, and the sixth semiconductor region 1160_1 may include a sixth protrusion 1161_1 protruding toward the left side. The second bending portion 1121_1 and the sixth protrusion 1161_1 may be regions that are connected to or in contact with a plurality of contact holes to be described later.

Unlike the semiconductor layer 1100 of FIG. 9, the semiconductor layers 1100_1 of FIG. 23 may be formed by connecting the semiconductor regions to one another. In addition, the forty-second semiconductor region 1140b_1 may be connected to the first vertical portion or the seventh semiconductor region 1170_1 located in the previous sub-pixel PXn, so that the semiconductor layer 1100_1 may be connected to one another over the entire area of the display panel 10.

The first insulating layer 1810 may be on the semiconductor layer 1100_1 and may be over the entire surface of the substrate 1010. The first insulating layer 1810 is identical to that described above; and, therefore, the redundant description will be omitted.

The first conductive layer 1200 is on the first insulating layer 1810. The first conductive layer 1200 may include a first scan line 1210_1, a second scan line 1220_1, a third scan line 1230_1, an emission control line 1240_1, and a first gate electrode 1250_1. Unlike the first conductive layer 1200 of FIG. 11, the first conductive layer 1200 may further include a third scan line 1230_1 and an emission control line 1240_1. The first scan line 1210_1 and the second scan line 1220_1 may transmit the first scan signal GW and the second scan signal GB, respectively (e.g., as shown in FIG. 11). The third scan line 1230_1 may correspond to the third scan line SL(k−1) described above with reference to FIG. 21 and may transmit the third scan signal GI. The emission control line 1240_1 may correspond to the emission control line EML described above with reference to FIG. 21 and may transmit the emission signal EM.

The first scan line 1210_1 may transmit the first scan signal GW. The first scan line 1210_1 may be extended in the first direction (x-axis direction) and may be extended to an adjacent sub-pixel PXn beyond the boundary between the sub-pixels PXn. The first scan line 1210_1 may be located on the lower side of the center of the sub-pixel PXn when viewed from the top.

The first scan line 1210_1 may overlap with a second semiconductor region 1120_1 and a third semiconductor region 1130_1 of the semiconductor layer 1100_1. The first scan line 1210_1 overlaps with the thirty-first semiconductor region 1130a_1 and the second semiconductor region 1120_1 as it is extended in the first direction (x-axis direction). In addition, the first scan line 1210_1 may include a protrusion protruding downward near the thirty-first semiconductor region 1130a_1 to overlap with the thirty-second semiconductor region 1130b_1. The first scan line 1210_1 may form the channels of the second and third transistors TR2_1 and TR3_1 as it overlaps with the second semiconductor region 1120_1 and the third semiconductor region 1130_1.

The second scan line 1220_1 may transmit the second scan signal GB. The second scan line 1220_1 may be extended in the first direction (x-axis direction) to an adjacent sub-pixel PXn. The second scan line 1220_1 may be located on the upper side of the center of the sub-pixel PXn when viewed from the top. The second scan line 1220_1 may overlap with a seventh semiconductor region 1170_1 of the semiconductor layer 1100_1. The second scan line 1220_1 may form the channel of the seventh transistor TR7_1 as it overlaps with the seventh semiconductor region 1170_1.

The third scan line 1230_1 may transmit the third scan signal GI. The third scan line 1230_1 may be extended in the first direction (x-axis direction) to an adjacent sub-pixel PXn. The third scan line 1230_1 may be located on the lower side of the first scan line 1210_1 when viewed from the top.

The third scan line 1230_1 may overlap with a fourth semiconductor region 1140_1 of the semiconductor layer 1100_1. The third scan line 1230_1 overlaps with the forty-second semiconductor region 1140b_1 as it is extended in the first direction (x-axis direction). The protrusion thereof near the overlapping portion may overlap with the forty-first semiconductor region 1140a_1. The channel of the fourth transistor TR4_1 may be formed where the third scan line 1230_1 overlaps with the fourth semiconductor region 1140_1.

An emission control line 1240_1 may transmit the emission control signal EM. The emission control line 1240_1 may be adjacent to the upper side of the center of the sub-pixel PXn and may be extended in the first direction (x-axis direction). The emission control line 1240_1 may overlap with the fifth and sixth semiconductor regions 1150_1 and 1160_1 to form channels of the fifth and sixth transistors TR5_1 and TR6_1.

The first gate electrode 1250_1 may be located between the first scan line 1210_1 and the emission control line 1240_1 and may be located at the center of the sub-pixel PXn. The first gate electrode 1250_1 may overlap with the first semiconductor region 1110_1 to form the gate electrode of the first transistor TR1_1. The first gate electrode 1250_1 may have a rectangular shape with both shorter sides parallel to each other. The width of the first gate electrode 1250_1 may be reduced at the intersection with the first semiconductor region 1110_1. It is, however, to be understood that the present disclosure is not limited thereto. Unlike the other scan lines, the first gate electrode 1250_1 may be separated from sub-pixel to sub-pixel. As shown in the drawings, the first gate electrode 1250_1 may be island shaped.

A second insulating layer 1820 is on the first conductive layer 1200, and a detailed description thereof will be omitted.

The second conductive layer 1300_1 is on the second insulating layer 1820. The second conductive layer 1300_1 overlaps with the first gate electrode 1250_1 and may be located between the first scan line 1210_1 and the emission control line 1240_1 when viewed from the top. The second conductive layer 1300_1 may form one electrode of the capacitor Cst, the first gate electrode 1250_1 may form the other element of the capacitor Cst, and the second insulating layer 1820 interposed therebetween may form the dielectric of the capacitor Cst.

The second conductive layers 1300_1 may be arranged in an island shape one for each of the sub-pixels PXn, like the first gate electrode 1250_1.

The third insulating layer 1830 is on the second conductive layer 1300_1, and a plurality of contact holes CNTs may be formed therein. A detailed description thereof will be given later together with the third conductive layer 1400_1.

The third conductive layer 1400_1 is on the third insulating layer 1830. The third conductive layer 1400_1 includes a data line 1410_1, a first voltage line 1420_1, a second voltage line 1430_1, a plurality of conductive patterns 1440_1, and an initialization voltage line 1450_1. Unlike the third conductive layer 1400 of FIG. 11, the third conductive layer 1400_1 of FIG. 22 may further include an initialization voltage line 1450_1, each of which may have somewhat different structures and locations. Hereinafter, the differences will be described in detail.

The data line 1410_1 may be a data line DLj for transmitting the data signal DATA and may be located on the right side of the sub-pixel PXn to be extended in the second direction (y-axis direction). The data line 1410_1 may overlap with the second bending portion 1121_1 of the second semiconductor region 1120_1, and a second contact hole CNT2_1 may be formed where they overlap with each other, which is formed through the first to third insulating layers 1810, 1820, and 1830. The second contact hole CNT2_1 may be connected to or in contact with the second bending portion 1121_1 and the data line 1410_1 and accordingly the data line 1410_1 may be electrically connected to the second semiconductor region 1120_1.

The first voltage line 1420_1 may be the first voltage line QVDDL for transmitting the first voltage QVDD or the ground voltage and may be located on the right side of the center of the sub-pixel PXn and on the left side of the data line 1410_1. The first voltage line 1420_1 may be extended in the second direction (y-axis direction) to overlap with the second vertical portion of the semiconductor layer 1100_1. A fifth contact hole CNT5_1 may be formed where the first voltage line 1420_1 overlaps with the fifth semiconductor region 1150_1, which is formed through the first to third insulating layers 1810, 1820, and 1830. The fifth contact hole CNT5_1 may be connected to or in contact the fifth semiconductor region 1150_1 and the first voltage line 1420_1 and accordingly the first voltage line 1420_1 may be electrically connected to the fifth semiconductor region 1150_1.

The second voltage line 1430_1 may be the second voltage line QVSSL for transmitting the second voltage QVSS or the AC voltage and may be located on the center of the sub-pixel PXn to be extended in the second direction (y-axis direction). The second voltage line 1430_1 may include a twenty-first voltage line 1430a_1 and a twenty-second voltage line 1430b_1, such that two lines may be spaced from each other in a single sub-pixel PXn. It is, however, to be understood that the present disclosure is not limited thereto.

The plurality of conductive patterns 1440_1 may include a first conductive pattern 1441_1 and a second conductive pattern 1442_1. The first conductive pattern 1441_1 may be located between a twenty-first voltage line 1430a_1 and a twenty-second voltage line 1430b_1 which are spaced from each other and may be extended in the second direction (y-axis direction). The first conductive pattern 1441_1 may be extended to partially overlap with a forty-first semiconductor region 1140a_1 and the second conductive layer 1300_1. A third contact hole CNT3_1 and a fourth contact hole CNT4_1 may be formed on a side where the first conductive pattern 1441_1 overlaps with the second conductive layer 1300_1, which are formed through the first to third insulating layers 1810, 1820, and 1830. The third contact hole CNT3_1 and the fourth contact hole CNT4_1 may be connected to or in contact with the first conductive pattern 1441_1 and the second conductive layer 1300_1, and accordingly the first conductive pattern 1441_1 may be connected to the conductive layer 1300_1, i.e., one electrode of the capacitor Cst.

The other side of the first conductive pattern 1441_1 may be connected to or in contact with the first contact hole CNT1_1, which is formed through the fourth insulating layer 1840 to be described later. The first contact hole CNT1_1 may be connected to or in contact with a fourth conductive layer 1500 and a first conductive pattern 1441_1. The fourth conductive layer 1500 is electrically connected to the first voltage line 1420_1 through a separate contact hole. Accordingly, the first conductive pattern 1441_1 is electrically connected to the fourth conductive layer 1500 and the second conductive layer 1300_1 through a first contact hole CNT1_1 and third and fourth contact holes CNT3_1 and CNT4_1, respectively. The first voltage line 1420_1 is electrically connected to the second conductive layer 1300_1 through the first conductive pattern 1441_1, and the first voltage line QVDD of the first voltage line QVDDL may be transmitted to one electrode of the capacitor Cst.

The second conductive pattern 1442_1 may be on the left side from the sixth semiconductor region 1160_1 and on the upper side from the emission control line 1240_1. One side of the second conductive pattern 1442_1 overlaps with the sixth protrusion 1161_1 of the sixth semiconductor region 1160_1, and sixth contact hole CNT6_1 is formed where they overlap with each other, which is formed through the first to third insulating layers 1810, 1820, and 1830. The sixth contact hole CNT6_1 may be connected to or in contact with the second conductive pattern 1442_1 and the sixth semiconductor region 1160_1.

An electrode contact hole CNTD_1 may be formed in a part of the second conductive pattern 1442_1, which is formed through the fourth insulating layer 1840_1 and the fifth insulating layer 1850_1 to expose a part of the second conductive pattern 1442_1. The electrode contact hole CNTD_1 may be connected to the first electrode line 210 of the display element layer 10*b*. Accordingly, the first electrode line 210 of the display element layer 10*b* may be electrically connected to the sixth semiconductor region 1160_1, i.e., the sixth transistor TR6_1 through the second conductive pattern 1442_1. The first electrode line 210 may receive a driving current for driving the light-emitting element 300 through the sixth transistor TR6_1.

The initialization voltage line 1450_1 may transmit the initializing voltage Vint when the display device 1_1 is driven, and may transmit the alignment signal, i.e., the ground voltage during the process of fabricating the display device 1. The initialization voltage line 1450_1 is located on the right side of the sub-pixels PXn and the right side of the data line 1410_1 and may be extended in the second direction (y-axis direction). The initialization voltage line 1450_1 may overlap with the region where the forty-second semiconductor region 1140*b*_1 is connected to the seventh semiconductor region 1170_1. A seventh contact hole CNT7_1 is formed where they overlap each other, which is formed through the first to third insulating layers 1810, 1820, and 1830. Because the seventh contact hole CNT7_1 is connected to or in contact with the seventh semiconductor region 1170_1 and the forty-second semiconductor region 1140*b*_1, the seventh semiconductor region 1170_1 may be electrically connected to the initialization voltage line 1450_1.

Accordingly, the transistor TR7_1 is turned on in response to the second scan signal GB to transmit the ground voltage to the first electrode line 210 during the process of fabricating the display device 1_1, and may transmit the initialization voltage Vint to the first electrode line 210 in response to the second scan signal GB when the display device 1_1 is driven.

A fourth insulating layer 1840_1 is on the third conductive layer 1400_1, and a fourth conductive layer 1500 is on the fourth insulating layer 1840_1. The fourth conductive layer 1500 includes a part of the second voltage line 1430_1 and an opening through which the second conductive pattern 1442_1 is exposed. In addition, a plurality of conductive contact holes CNTC_1 may be formed where the fourth conductive layer 1500 overlaps with the first voltage line 1420_1, which is formed through the fourth insulating layer 1840_1. The fourth conductive layer 1500 may be electrically connected to the first voltage line 1420_1. The layouts and structures of the other elements than the fourth conductive layer 1500 are identical to those described above with reference to FIG. 6; and, therefore, the redundant description will be omitted.

Figure 26:
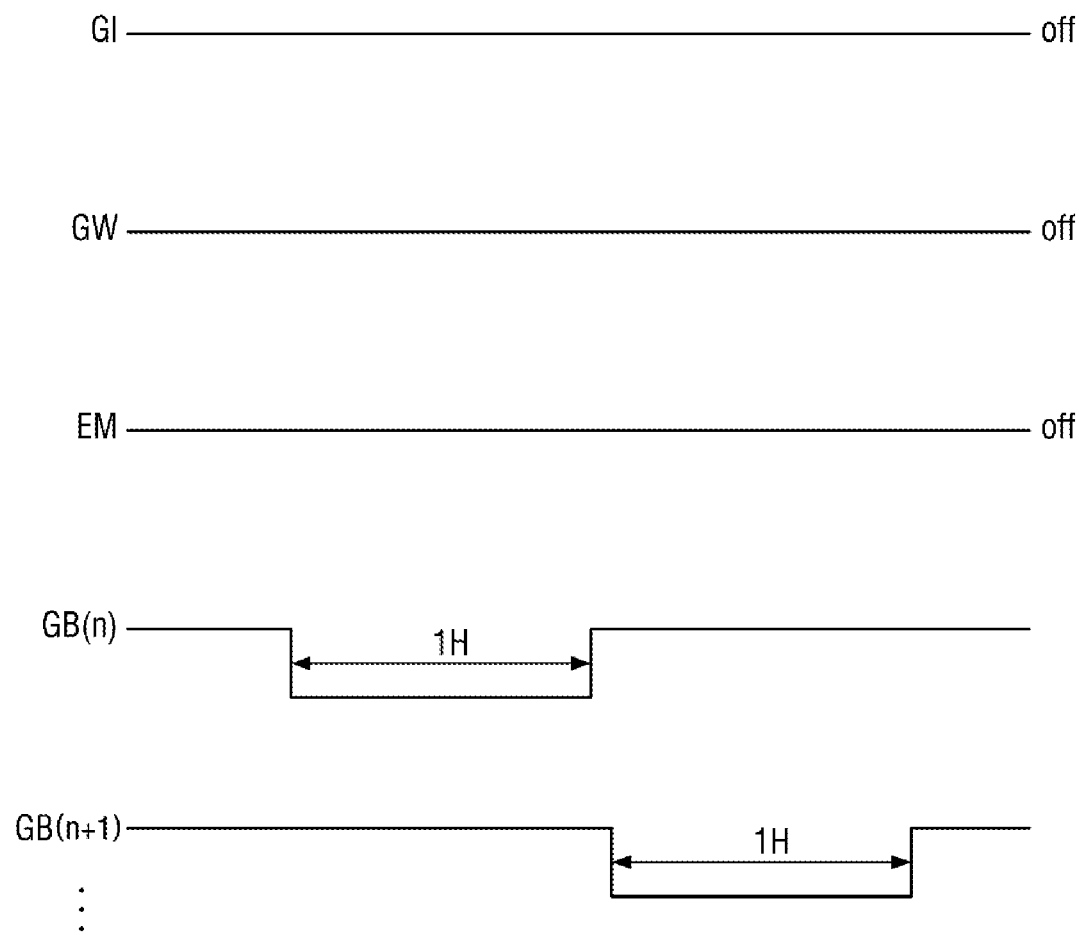
FIG. 26 is a graph showing a second scan signal transmitted to each sub-pixel during the process of fabricating a display panel according to another exemplary embodiment of the present disclosure.

FIG. 26 is a graph showing a second scan signal transmitted to each sub-pixel during the process of fabricating a display panel according to another exemplary embodiment of the present disclosure.

As described above with reference to FIG. 18, the nozzle for ejecting the light-emitting elements 300 may move in parallel with the direction in which the scan lines SLk in the same row are extended during the process of fabricating the display panel 10. During the process of fabricating the display device 1 of FIG. 21, the second scan signal GB is applied only to the second scan line SL(k+1), and the seventh transistor TR7_1 is turned on by the second scan signal GB. The alignment signal applied to the initialization voltage line VintL, i.e., the ground voltage may be transmitted to the first electrode line 210 of the light-emitting element 300 through the seventh transistor TR7_1.

As shown in FIG. 26, during the process of fabricating the display device 1, the first scan signal GW, the third scan signal GI and the emission control signal EM are not transmitted but only the second scan signal GB is transmitted. In addition, signals are applied to only the n$2^{th}$ scan line SL(k+12) extended along the same row and transmitting the second scan signal GB.

At the first time point (t=t1), the nozzle moves along the first scan line SL1 of the pixel PX or the sub-pixels PX1 of the first row and ejects the light-emitting elements 300, and the second scan signal GB1 is applied only to the first scan line SL1. The seventh transistor TR7_1 of the pixel PX or the sub-pixels PXn of the first row is turned on in response to the second scan signal GB1, so that the light-emitting elements 300 may be aligned on the pixel PX or the sub-pixels PX1 of the first row. At the first time point (t=t1), the second scan signal GBn is not applied to the scan lines SLn in the pixel PX or the sub-pixel PXn of the second row and the other rows.

At the second time point (t=t2), the nozzle moves along the second scan line SL2 of the pixel PX or the sub-pixels PX2 of the second row and ejects the light-emitting elements 300. At the second time point (t=t2), the second scan signal GB2 is applied only to the second scan line SL1 while the second scan signal SL2 is not applied to the first scan line SL1 and the other scan lines SLn. Accordingly, the seventh transistor TR7_1 of the pixel PX or the sub-pixel PX2 of the second row may be turned on, and the light-emitting elements 300 may be aligned on the pixel PX or the sub-pixel PX2 of the second row. That is to say, as described above, during the process of fabricating the display device 1_1, when the nozzle ejects the light-emitting elements 300 along the pixel PX or the sub-pixel PXn in the n$^{th}$ row, the second scan signal GBn may be applied only to the n$^{th}$ scan line SLn. When the seventh transistor TR7_1 in the pixel PX or the sub-pixels PXn of the n$^{th}$ row is turned on, the other transistors PXn or PXn are turned off, so that the light-emitting elements 300 can be aligned only in the pixel PX or the sub-pixels PXn of the n$^{th}$ row.

On the other hand, in the display element layer 10*b* of the display device 1, the first electrode line 210 and the second electrode line 220 may include a larger number of branches.

Figure 27:
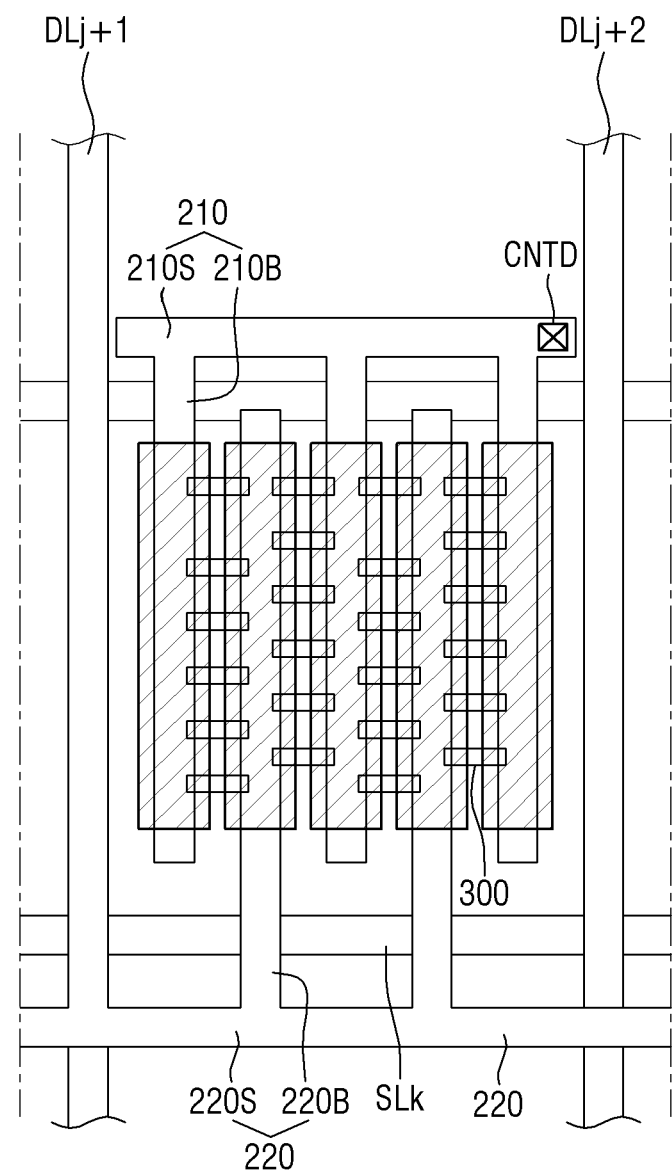
FIG. 27 is a plan view of a display panel according to another exemplary embodiment of the present disclosure.

FIG. 27 is a plan view of a display panel according to another exemplary embodiment of the present disclosure. Referring to FIG. 27, in a single pixel PX or sub-pixel PXn, there may be two or more, e.g., three first electrode branches 210 and two electrode branches 220B. A plurality of light-emitting elements 300 may be aligned between the first electrode branches 210B and the second electrode branches 220B. The first electrode stem 210S may be electrically connected to the second conductive pattern (not shown) through the electrode contact hole CNTD.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a light-emitting diode comprising a first conductivity-type semiconductor, an active layer, and a second conductivity-type semiconductor;
a first voltage line to which a first voltage is applied;
a second voltage line to which a second voltage is applied;
a first transistor comprising a source electrode electrically connected to the first voltage line and a drain electrode electrically connected to a first electrode of the light-emitting diode and to the first conductivity-type semiconductor;
a second transistor comprising a drain electrode electrically connected to a gate electrode of the first transistor and a source electrode electrically connected to a data line to apply a data signal;
a capacitor electrically connected to the gate electrode of the first transistor and the first electrode of the light-emitting diode; and
a third transistor comprising a source electrode electrically connected to the second voltage line and a drain electrode electrically connected to the first electrode of the light-emitting diode.

2. The display device of claim 1, further comprising:
a third voltage line to which a third voltage is applied and electrically connected to the second conductivity-type semiconductor of the light-emitting diode;
a first scan line for transmitting a first scan signal to a gate electrode of the second transistor; and
a second scan line for transmitting a second scan signal to a gate electrode of the third transistor.

3. The display device of claim 2, wherein in a fabrication mode, the second scan signal is applied to the second scan line while the first scan signal is not input to the first scan line, and
wherein the first voltage applied to the first voltage line is equal to the second voltage applied to the second voltage line.

4. The display device of claim 3, wherein in the fabrication mode, the first transistor and the second transistor are turned off while the third transistor is turned on, such that the second voltage applied from the second voltage line is applied to the first electrode of the light-emitting diode through the third transistor.

5. The display device of claim 4, wherein in the fabrication mode, the third voltage applied to the third voltage line is an AC voltage, and the second voltage applied to the second voltage line is a ground voltage.

6. The display device of claim 2, wherein in a driving mode, the first scan signal is applied to the first scan line so that the second transistor is turned on.

7. The display device of claim 6, wherein in the driving mode, the data signal is transmitted to the gate electrode of the first transistor through the second transistor, and the first transistor is turned on in response to the data signal so that the first voltage applied to the first voltage line is transmitted to the first electrode of the light-emitting diode through the first transistor.

8. The display device of claim 6, wherein in the driving mode, the second scan signal is not applied to the second scan line so that the third transistor is turned off.

9. The display device of claim 8, wherein in the driving mode, the first voltage applied to the first voltage line is different than the third voltage applied from the third voltage line.

10. The display device of claim 6, wherein, in the driving mode, the second voltage applied from the second voltage line is an initialization voltage, and
wherein the second scan signal is applied to the second scan line so that the third transistor is turned on, and the initialization voltage is applied to the first electrode of the light-emitting diode.

11. The display device of claim 10, further comprising:
a fourth transistor between the second voltage line and the gate electrode of the first transistor;
a fifth transistor between the first voltage line and the source electrode of the first transistor;
a sixth transistor between the drain electrode of the first transistor and the first electrode of the light-emitting diode;
a seventh transistor between a drain electrode of the sixth transistor and a drain electrode of the fourth transistor;
a third scan line for transmitting a third scan signal to a gate electrode of the fourth transistor; and
an emission control line for transmitting an emission control signal to a gate electrode of the fifth transistor and a gate electrode of the sixth transistor.

12. A display device comprising:
a substrate;
a semiconductor layer on the substrate;
a first insulating layer on the semiconductor layer and the substrate;
a first conductive layer on the first insulating layer;
a second insulating layer on the first insulating layer and the first conductive layer;
a second conductive layer on the second insulating layer;
a third insulating layer on the second conductive layer;
a first electrode on the third insulating layer and electrically connected to the semiconductor layer;
a second electrode spaced from the first electrode; and
at least one light-emitting element between the first electrode and the second electrode,
wherein the semiconductor layer comprises a first semiconductor region and a second semiconductor region,
wherein the first conductive layer comprises a first gate electrode overlapping with the first semiconductor region and a second gate electrode overlapping with the second semiconductor region, and
wherein the second conductive layer comprises a first voltage line electrically connected between the first semiconductor region and the second semiconductor region; and
a first conductive pattern electrically connected to the first semiconductor region, the second semiconductor region, and the first electrode.

13. The display device of claim 12, wherein the first voltage line is electrically connected through a first contact hole and a second contact hole that extend through the first insulating layer and the second insulating layer, and
wherein one side of the first semiconductor region is electrically connected through the first contact hole, and one side of the second semiconductor region is electrically connected through the second contact hole.

14. The display device of claim 13, wherein the first conductive pattern is electrically connected to a third contact hole and a fourth contact hole through the first insulating layer and the second insulating layer, and
wherein the third contact hole is electrically connected to the other side of the first semiconductor region and the fourth contact hole is electrically connected to the other side of the second semiconductor region.

15. The display device of claim 14, wherein the first conductive pattern is electrically connected to the first electrode through a fifth contact hole through the third insulating layer.

16. The display device of claim 15, wherein a second conductive pattern further comprises a second voltage line electrically connected to the second electrode through a sixth contact hole through the third insulating layer.

17. The display device of claim 12, wherein the first electrode is electrically connected to the first semiconductor region and the second semiconductor region through an electrode contact hole through the third insulating layer.

18. The display device of claim 17, wherein the at least one light-emitting element comprises:
   semiconductor crystals comprising a first conductivity-type semiconductor,
   an active layer on the first conductivity-type semiconductor,
   a second conductivity-type semiconductor on the active layer; and
   an insulating coating surrounding at least a part of an outer surface of the semiconductor crystals.

19. The display device of claim 18, wherein the first conductivity-type semiconductor is electrically connected to the second electrode, and
   the second conductivity-type semiconductor is electrically connected to the first electrode.

20. A method of fabricating a display device, the method comprising
   preparing a circuit element layer comprising a driving transistor and a first transistor each having an electrode electrically connected to a first supply voltage line and another electrode electrically connected to a pixel electrode, a second supply voltage line connected to a common electrode spaced from and facing the pixel electrode, a scan line connected to a gate electrode of the first transistor and transmitting a scan signal;
   loading a plurality of light-emitting elements on the pixel electrode and the common electrode and applying the scan signal to the scan line; and
   landing the light-emitting elements between the pixel electrode and the common electrode.

21. The method of claim 20, wherein the first transistor is turned on while the driving transistor is turned off in response to the scan signal.

22. The method of claim 21, wherein an AC voltage is applied to the second supply voltage line, and a grounded voltage applied to the first supply voltage line is transmitted to the pixel electrode through the first transistor.

23. The method of claim 22, wherein a capacitance is formed between the pixel electrode and the common electrode in the landing the light-emitting elements.

24. The method of claim 20, wherein the circuit element layer further comprises:
   a first pixel electrode and a second pixel electrode;
   a first electrode spaced from and facing the first pixel electrode and the common electrode spaced from and facing the second pixel electrode;
   a first driving transistor having an electrode electrically connected to first pixel electrode;
   a second driving transistor having an electrode electrically connected to the second pixel electrode;
   a first scan line to which a first scan signal is applied;
   a second transistor having an electrode electrically connected to the first supply voltage line and another electrode electrically connected to the second pixel electrode; and
   a second scan line connected to a gate electrode of the second transistor, wherein a second scan signal is applied to the second scan line.

25. The method of claim 24, wherein, the common electrode comprises a first common electrode and a second common electrode, wherein at a first time point, the light-emitting elements are loaded on the first pixel electrode and the first common electrode, and
   wherein the first scan signal is applied to the first scan line while the second scan signal is not applied to the second scan line.

26. The method of claim 25, wherein, at the first time point, the first transistor is turned on while the first driving transistor, the second transistor and the second driving transistor are turned off.

27. The method of claim 25, wherein, at a second time point, the light-emitting elements are loaded on the second pixel electrode and the second common electrode, and
   wherein the second scan signal is applied to the second scan line while the first scan signal is not applied to the first scan line.

28. The method of claim 27, wherein, at the second time point, the second transistor is turned on while the first driving transistor, the second driving transistor, and the first transistor are turned off.

29. The display device of claim 1, wherein the first transistor and the third transistor are connected in parallel.

30. The display device of claim 1, wherein the drain electrode of the first transistor and the drain electrode of the third transistor are directly connected to the first electrode of the light-emitting diode.

* * * * *